(12) United States Patent
Cooper et al.

(10) Patent No.: US 12,717,477 B2
(45) Date of Patent: Aug. 25, 2026

(54) SYSTEM AND METHOD FOR COMPACTION OF FLOATING-POINT NUMBERS WITHIN A DATASET WITH METADATA TAGGING

(71) Applicant: AtomBeam Technologies Inc., Moraga, CA (US)

(72) Inventors: Joshua Cooper, Columbia, SC (US); Charles Yeomans, Orinda, CA (US)

(73) Assignee: ATOMBEAM TECHNOLOGIES INC., Moraga, CA (US)

( * ) Notice: Subject to any disclaimer, the term of this patent is extended or adjusted under 35 U.S.C. 154(b) by 0 days.

(21) Appl. No.: 19/212,550

(22) Filed: May 19, 2025

(65) Prior Publication Data

US 2025/0284393 A1 Sep. 11, 2025

Related U.S. Application Data

(63) Continuation-in-part of application No. 18/479,024, filed on Sep. 30, 2023, now Pat. No. 12,307,089, (Continued)

(51) Int. Cl.
*G06F 3/06* (2006.01)
*H03M 7/30* (2006.01)

(52) U.S. Cl.
CPC .......... *G06F 3/0608* (2013.01); *G06F 3/0623* (2013.01); *G06F 3/0659* (2013.01); (Continued)

(58) Field of Classification Search
CPC .... G06F 3/0608; G06F 3/0623; G06F 3/0659; G06F 3/067; H03M 7/6005; H03M 7/6011; H03M 7/30
See application file for complete search history.

(56) References Cited

U.S. PATENT DOCUMENTS 6,253,222 B1 * 6/2001 Dyer .................... H03M 7/30 708/203
6,396,420 B1 * 5/2002 Augustine .............. H03M 7/24 341/87

(Continued)

*Primary Examiner* — Michael Alsip
(74) *Attorney, Agent, or Firm* — GALVIN PATENT LAW LLC; Brian R. Galvin; Erin L. Johnston

(57) ABSTRACT

A system and method for multi-level compaction of floating-point numbers and associated metadata within datasets. The system identifies floating-point numbers and their associated metadata, pre-encodes numbers into binary string representations, and encodes metadata into compact binary form. These encoded elements are linked together and indexed to indicate they represent floating-point numbers with metadata. The dataset is organized into multiple compaction levels based on semantic relationships between metadata elements. The system creates specialized indices for metadata-based retrieval, maintains relationship maps, and implements inheritance policies across hierarchical levels. During retrieval, the system reconstructs both the original floating-point values and their associated metadata, preserving hierarchical relationships. This approach enables more intelligent data organization, richer contextual information preservation, and more powerful query capabilities while maintaining efficient floating-point compaction.

14 Claims, 48 Drawing Sheets

Related U.S. Application Data which is a continuation of application No. 18/083,437, filed on Dec. 16, 2022, now Pat. No. 11,868,616, which is a continuation-in-part of application No. 17/953,946, filed on Sep. 27, 2022, now abandoned, which is a continuation of application No. 17/727,913, filed on Apr. 25, 2022, now Pat. No. 11,620,051, which is a continuation of application No. 17/404,699, filed on Aug. 17, 2021, now Pat. No. 11,385,794.

(60) Provisional application No. 63/248,665, filed on Sep. 27, 2021.

(52) U.S. Cl.
CPC .......... *G06F 3/067* (2013.01); *H03M 7/6005* (2013.01); *H03M 7/6011* (2013.01)

(56) References Cited

U.S. PATENT DOCUMENTS

| | | | | |
|---|---|---|---|---|
| 9,513,813 | B1 | 12/2016 | Blaettler et al. | |
| 2007/0208792 | A1 * | 9/2007 | Berjon | G06T 9/001 708/207 |
| 2014/0208068 | A1 | 7/2014 | Wegener | |
| 2018/0196609 | A1 | 7/2018 | Niesen | |
| 2020/0395955 | A1 | 12/2020 | Choi et al. | |
| 2021/0351786 | A1 | 11/2021 | Lacey et al. | |
| 2022/0368343 | A1 * | 11/2022 | Motta | G06N 3/063 |
| 2023/0280902 | A1 | 9/2023 | Snyder et al. | |

* cited by examiner

Retrieving Data
901
Receive request for data
902
Retrieve codewords
903
Pass reference codes to library management module
904
Receive sourceblocks from library management module
905
Assemble sourceblocks into original data
906
Send data out to requestor

900

3401

| Bit | 7 | 6 | 5 | 4 | 3 | 2 | 1 | 0 |
|---|---|---|---|---|---|---|---|---|
| | N | R | R | R | I | C | C | C |

Control Byte

N= Next nibble (If 1, the next 4 bits (I C C C) are control bits)

RRR = Residual count (bits not used in the last byte of the code packet)

I for Codebook ID. (1 if UUID follows in the next four bytes; if the I flag is off, then use the CCC bits to index the Codebook in the cache.)

CCC = Codebook cache index

SYSTEM AND METHOD FOR COMPACTION OF FLOATING-POINT NUMBERS WITHIN A DATASET WITH METADATA TAGGING

CROSS-REFERENCE TO RELATED APPLICATIONS

Priority is claimed in the application data sheet to the following patents or patent applications, each of which is expressly incorporated herein by reference in its entirety:

Ser. No. 18/479,024
Ser. No. 18/083,437
Ser. No. 17/953,946
Ser. No. 17/727,913
Ser. No. 17/404,699
63/248,665

BACKGROUND OF THE INVENTION

Field of the Invention

The present invention is in the field of computer data encoding, and in particular, the multi-level compaction of floating-point numbers with metadata tagging for enhanced storage efficiency, retrieval, and contextual data organization.

Discussion of the State of the Art

As computers become an ever-greater part of our lives, data storage has become an increasingly critical challenge. Prior to 2010, the growth of data storage capacity far exceeded the growth in storage demand, leading many to believe that storage would never again be a limiting factor. However, the rapid expansion of cloud computing, artificial intelligence, social media, high-tech industries, and biotech research has driven an unprecedented surge in global data production. By 2020, global data storage demand had already surpassed 50 zettabytes, and as of 2025, projections estimate that the total volume of stored digital data has exceeded 150 zettabytes. Meanwhile, digital storage manufacturing has not scaled at a comparable rate, with physical storage production lagging behind the exponential growth in data creation. As a result, efficient data storage and retrieval technologies are now more essential than ever.

The primary solutions available today include expanding physical storage capacity and improving data compression techniques. However, simply increasing storage infrastructure is not a sustainable solution, as the demand for data storage has already outpaced global manufacturing capabilities. Data compression, while useful, also presents limitations. Conventional lossless compression techniques yield an average compression ratio of around 2:1, doubling storage capacity at best. However, as global data trends increasingly shift toward multimedia content-including high-resolution video, images, and sensor-generated data-compression savings become significantly reduced. Lossless compression can only achieve marginal gains, while lossy compression introduces data degradation, which is not acceptable for many critical applications. Even assuming an optimized doubling of storage capacity through compression, it remains insufficient to address the scale of the global data storage problem.

Beyond storage concerns, data transmission bandwidth has emerged as a major bottleneck. Massive datasets require substantial bandwidth for efficient transmission, particularly in high-performance computing environments, large-scale cloud data centers, and distributed computing systems. At the same time, the rapid expansion of the Internet of Things (IoT) has added billions of low-bandwidth devices to global networks, further straining existing transmission infrastructures. Without more advanced encoding and compaction techniques, network congestion will continue to limit the scalability of modern data-driven applications.

Additionally, the imminent arrival of quantum computing presents significant security challenges. As quantum capabilities advance, conventional encryption methods will become increasingly vulnerable, raising concerns about the long-term security of both stored and transmitted data. Future-proof data encoding techniques that integrate compaction with robust security measures are necessary to mitigate these risks.

Current data encoding approaches typically rely on a single encoding algorithm per file, with many systems using the same algorithm across entire datasets, storage devices, or distributed networks. While this simplifies decoding, it significantly limits compaction efficiency and introduces security vulnerabilities. A single, uniform encoding scheme makes data more predictable and therefore more susceptible to exploitation.

What is needed is an advanced system and method for multi-level compaction of floating-point numbers with metadata tagging, enabling more efficient data storage, faster retrieval, and improved security. By integrating hierarchical compaction, metadata-aware indexing, and adaptive encoding strategies, such a system can optimize storage while preserving critical contextual information for data interpretation and analysis.

SUMMARY OF THE INVENTION

The inventor has conceived and reduced to practice a system and method for multi-level compaction of floating-point numbers and associated metadata within datasets. The system identifies floating-point numbers and their associated metadata from source data, pre-encodes the floating-point numbers into binary string representations while encoding the metadata into compact binary form. These encoded elements are linked together and indexed, then organized into multiple compaction levels based on semantic relationships. The system creates specialized indices for efficient metadata-based retrieval and implements inheritance policies across hierarchical levels. During retrieval, the system reconstructs both the original floating-point values and their associated metadata while preserving all hierarchical relationships. This approach enables more intelligent data organization, richer contextual information preservation, and powerful query capabilities while maintaining efficient compaction of floating-point numbers.

According to a preferred embodiment, a computer system is configured to execute software instructions that receive a dataset containing floating-point numbers and associated metadata, scan the dataset to identify these elements, and pre-encode each floating-point number into a binary string representation. The system also encodes the extracted metadata associated with each floating-point number into a compact binary representation and links these encoded elements together. It then replaces the original floating-point numbers with their linked representations, creates indices to indicate these representations, and organizes the entire dataset into multiple compaction levels based on semantic relationships between the metadata.

According to another preferred embodiment, a method for compaction of floating-point numbers and associated metadata within a dataset performs the same steps as the computer system described above.

According to an aspect of an embodiment, the system creates specialized indices for retrieval based on the associated metadata and maintains relationship maps between the metadata and floating-point values.

According to an aspect of an embodiment, the system receives the pre-encoded dataset, deconstructs it into sourceblocks, and compacts each sourceblock by assigning codewords to reference codes that incorporate metadata information.

According to an aspect of an embodiment, the system implements policies for metadata inheritance across the multiple compaction levels and optimizes storage allocation across these levels.

According to an aspect of an embodiment, the binary string representations are low-distortion embeddings of real numbers into Hamming space.

According to an aspect of an embodiment, the binary string representation is a fixed-point representation.

According to an aspect of an embodiment, the system includes a codeword database configured to store codewords that include relationships between elements of the associated metadata.

According to an aspect of an embodiment, the system receives sourceblocks, checks whether each is linked to an index indicating it represents a floating-point number, extracts encoded metadata, applies decoding algorithms to recover original metadata, reconstructs relationships between metadata elements, and transforms the sourceblocks back into their floating-point form.

BRIEF DESCRIPTION OF THE DRAWING FIGURES

The accompanying drawings illustrate several aspects and, together with the description, serve to explain the principles of the invention according to the aspects. It will be appreciated by one skilled in the art that the particular arrangements illustrated in the drawings are merely exemplary, and are not to be considered as limiting of the scope of the invention or the claims herein in any way.

DETAILED DESCRIPTION OF THE INVENTION

Figure 1:
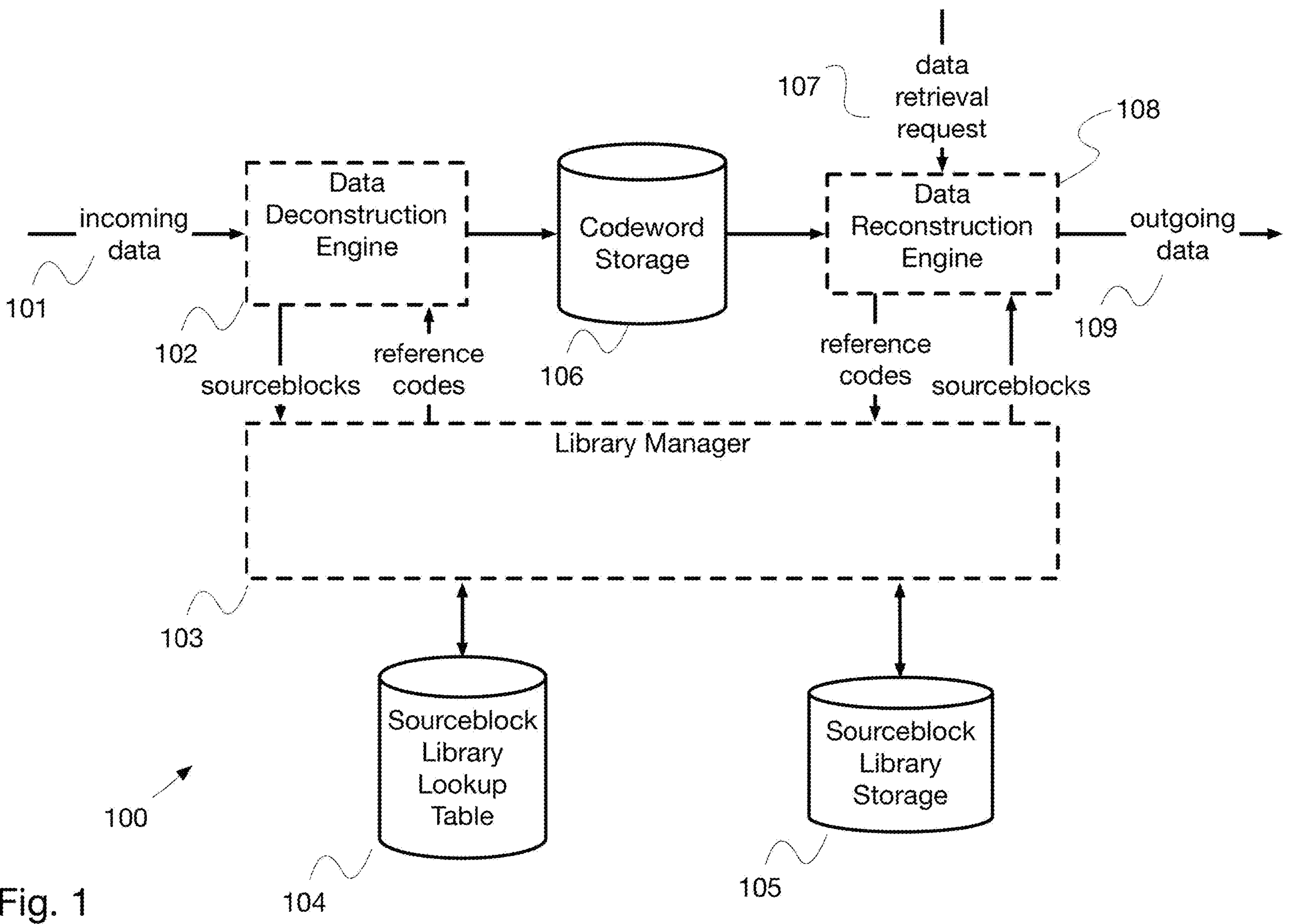
FIG. 1 is a diagram showing an embodiment of the system in which all components of the system are operated locally.

The inventor has conceived, and reduced to practice, a system and method for multi-level compaction of floating-point numbers with metadata tagging within a dataset. The system extends the capabilities of the base floating-point compaction approach by incorporating contextual metadata and organizing data into hierarchical structures based on semantic relationships. The system comprises, in a preferred embodiment, a metadata extractor, a metadata encoder, a composite encoding manager, a hierarchical compaction controller, a metadata indexing system, and a metadata decoder. These elements work in conjunction with a pre-encoder, a data deconstruction engine, a library manager, a codeword storage, and a data reconstruction engine.

In an embodiment, when a dataset containing floating-point numbers and associated metadata is received, a metadata extractor analyzes the incoming data to identify relevant metadata associated with the floating-point numbers. This metadata may include data source identifiers, timestamps, confidence levels, semantic context, and other relevant information that provides context for the floating-point values. The metadata extractor works in parallel with a pre-encoder, which identifies and processes the floating-point numbers themselves.

As a pre-encoder converts floating-point numbers into binary string representations through low-distortion embedding techniques, a metadata encoder converts the extracted metadata into compact binary forms using type-specific encoding schemes optimized for different categories of metadata. A composite encoding manager then combines these pre-encoded floating-point binary strings with their associated encoded metadata, implementing various linking strategies based on data patterns and usage context.

The linked data and metadata are organized by a hierarchical compaction controller into multiple compaction levels based on semantic relationships. This controller implements policies for metadata inheritance across hierarchical levels and optimizes storage allocation across the various compaction levels. A metadata indexing system creates specialized indices for efficient metadata-based retrieval, maintaining relationship maps between metadata and associated floating-point values.

During the compaction process, a data deconstruction engine breaks down the pre-encoded dataset with metadata into sourceblocks. A library manager assigns reference codes to these sourceblocks, now incorporating metadata information into the reference code structure. The sourceblocks are then processed into codewords that include hierarchical metadata relationships and stored in an enhanced codeword storage.

For data retrieval, a data reconstruction engine interprets both content-based and metadata-based query parameters. It retrieves codewords from storage based on these parameters and works with a library manager to access the appropriate sourceblocks. A metadata decoder reverses the encoding process to recover the original metadata, reconstructing hierarchical relationships and ensuring metadata integrity. Meanwhile, an integer integrator transforms the binary string representations back into their original floating-point form.

This multi-level compaction with metadata tagging approach significantly enhances the capabilities of floating-point compaction while maintaining compatibility with fundamental data storage architectures. It enables more intelligent data organization, preservation of rich contextual information, and powerful query capabilities that leverage both the numerical values and their associated metadata.

The system supports complex analytical operations that can filter, aggregate, and analyze data based on both content and context. By preserving provenance information throughout the data lifecycle, it ensures that floating-point values retain their semantic meaning and relationships, enabling more meaningful data analysis and interpretation.

One or more different aspects may be described in the present application. Further, for one or more of the aspects described herein, numerous alternative arrangements may be described; it should be appreciated that these are presented for illustrative purposes only and are not limiting of the aspects contained herein or the claims presented herein in any way. One or more of the arrangements may be widely applicable to numerous aspects, as may be readily apparent from the disclosure. In general, arrangements are described in sufficient detail to enable those skilled in the art to practice one or more of the aspects, and it should be appreciated that other arrangements may be utilized and that structural, logical, software, electrical and other changes may be made without departing from the scope of the particular aspects. Particular features of one or more of the aspects described herein may be described with reference to one or more particular aspects or figures that form a part of the present disclosure, and in which are shown, by way of illustration, specific arrangements of one or more of the aspects. It should be appreciated, however, that such features are not limited to usage in the one or more particular aspects or figures with reference to which they are described. The present disclosure is neither a literal description of all arrangements of one or more of the aspects nor a listing of features of one or more of the aspects that must be present in all arrangements.

Headings of sections provided in this patent application and the title of this patent application are for convenience only, and are not to be taken as limiting the disclosure in any way.

Devices that are in communication with each other need not be in continuous communication with each other, unless expressly specified otherwise. In addition, devices that are in communication with each other may communicate directly or indirectly through one or more communication means or intermediaries, logical or physical.

A description of an aspect with several components in communication with each other does not imply that all such components are required. To the contrary, a variety of optional components may be described to illustrate a wide variety of possible aspects and in order to more fully illustrate one or more aspects. Similarly, although process steps, method steps, algorithms or the like may be described in a sequential order, such processes, methods and algorithms may generally be configured to work in alternate orders, unless specifically stated to the contrary. In other words, any sequence or order of steps that may be described in this patent application does not, in and of itself, indicate a requirement that the steps be performed in that order. The steps of described processes may be performed in any order practical. Further, some steps may be performed simultaneously despite being described or implied as occurring non-simultaneously (e.g., because one step is described after the other step). Moreover, the illustration of a process by its depiction in a drawing does not imply that the illustrated process is exclusive of other variations and modifications thereto, does not imply that the illustrated process or any of its steps are necessary to one or more of the aspects, and does not imply that the illustrated process is preferred. Also, steps are generally described once per aspect, but this does not mean they must occur once, or that they may only occur once each time a process, method, or algorithm is carried out or executed. Some steps may be omitted in some aspects or some occurrences, or some steps may be executed more than once in a given aspect or occurrence.

When a single device or article is described herein, it will be readily apparent that more than one device or article may be used in place of a single device or article. Similarly, where more than one device or article is described herein, it will be readily apparent that a single device or article may be used in place of the more than one device or article.

The functionality or the features of a device may be alternatively embodied by one or more other devices that are not explicitly described as having such functionality or features. Thus, other aspects need not include the device itself.

Techniques and mechanisms described or referenced herein will sometimes be described in singular form for clarity. However, it should be appreciated that particular aspects may include multiple iterations of a technique or multiple instantiations of a mechanism unless noted otherwise. Process descriptions or blocks in figures should be understood as representing modules, segments, or portions of code which include one or more executable instructions for implementing specific logical functions or steps in the process. Alternate implementations are included within the scope of various aspects in which, for example, functions may be executed out of order from that shown or discussed, including substantially concurrently or in reverse order, depending on the functionality involved, as would be understood by those having ordinary skill in the art.

Definitions

The term "bit" refers to the smallest unit of information that can be stored or transmitted. It is in the form of a binary digit (either 0 or 1). In terms of hardware, the bit is represented as an electrical signal that is either off (representing 0) or on (representing 1).

The term "byte" refers to a series of bits exactly eight bits in length.

The term "codebook" refers to a database containing sourceblocks each with a pattern of bits and reference code unique within that library. The terms "library" and "encoding/decoding library" are synonymous with the term codebook.

The terms "compression" and "deflation" as used herein mean the representation of data in a more compact form than the original dataset. Compression and/or deflation may be either "lossless", in which the data can be reconstructed in its original form without any loss of the original data, or "lossy" in which the data can be reconstructed in its original form, but with some loss of the original data.

The terms "compression factor" and "deflation factor" as used herein mean the net reduction in size of the compressed data relative to the original data (e.g., if the new data is 70% of the size of the original, then the deflation/compression factor is 30% or 0.3.)

The terms "compression ratio" and "deflation ratio", and as used herein all mean the size of the original data relative to the size of the compressed data (e.g., if the new data is 70% of the size of the original, then the deflation/compression ratio is 70% or 0.7.)

The term "data" means information in any computer-readable form.

The term "data set" refers to a grouping of data for a particular purpose. One example of a data set might be a word processing file containing text and formatting information.

The term "effective compression" or "effective compression ratio" refers to the additional amount data that can be stored using the method herein described versus conventional data storage methods. Although the method herein described is not data compression, per se, expressing the additional capacity in terms of compression is a useful comparison.

The phrase "low-distortion embedding" means a mapping of two metric spaces wherein the relative distances between each pair of points in each metric space are preserved when translating to the other metric space to within a small factor of distortion.

The term "sourcepacket" as used herein means a packet of data received for encoding or decoding. A sourcepacket may be a portion of a data set.

The term "sourceblock" as used herein means a defined number of bits or bytes used as the block size for encoding or decoding. A sourcepacket may be divisible into a number of sourceblocks. As one non-limiting example, a 1 megabyte sourcepacket of data may be encoded using 512 byte sourceblocks. The number of bits in a sourceblock may be dynamically optimized by the system during operation. In one aspect, a sourceblock may be of the same length as the block size used by a particular file system, typically 512 bytes or 4,096 bytes.

The term "codeword" refers to the reference code form in which data is stored or transmitted in an aspect of the system. A codeword consists of a reference code to a sourceblock in the library plus an indication of that sourceblock's location in a particular data set.

Conceptual Architecture

FIG. 1 is a diagram showing an embodiment 100 of the system in which all components of the system are operated locally. As incoming data 101 is received by data deconstruction engine 102. Data deconstruction engine 102 breaks the incoming data into sourceblocks, which are then sent to library manager 103. Using the information contained in sourceblock library lookup table 104 and sourceblock library storage 105, library manager 103 returns reference codes to data deconstruction engine 102 for processing into codewords, which are stored in codeword storage 106. When a data retrieval request 107 is received, data reconstruction engine 108 obtains the codewords associated with the data from codeword storage 106, and sends them to library manager 103. Library manager 103 returns the appropriate sourceblocks to data reconstruction engine 108, which assembles them into the proper order and sends out the data in its original form 109.

Figure 2:
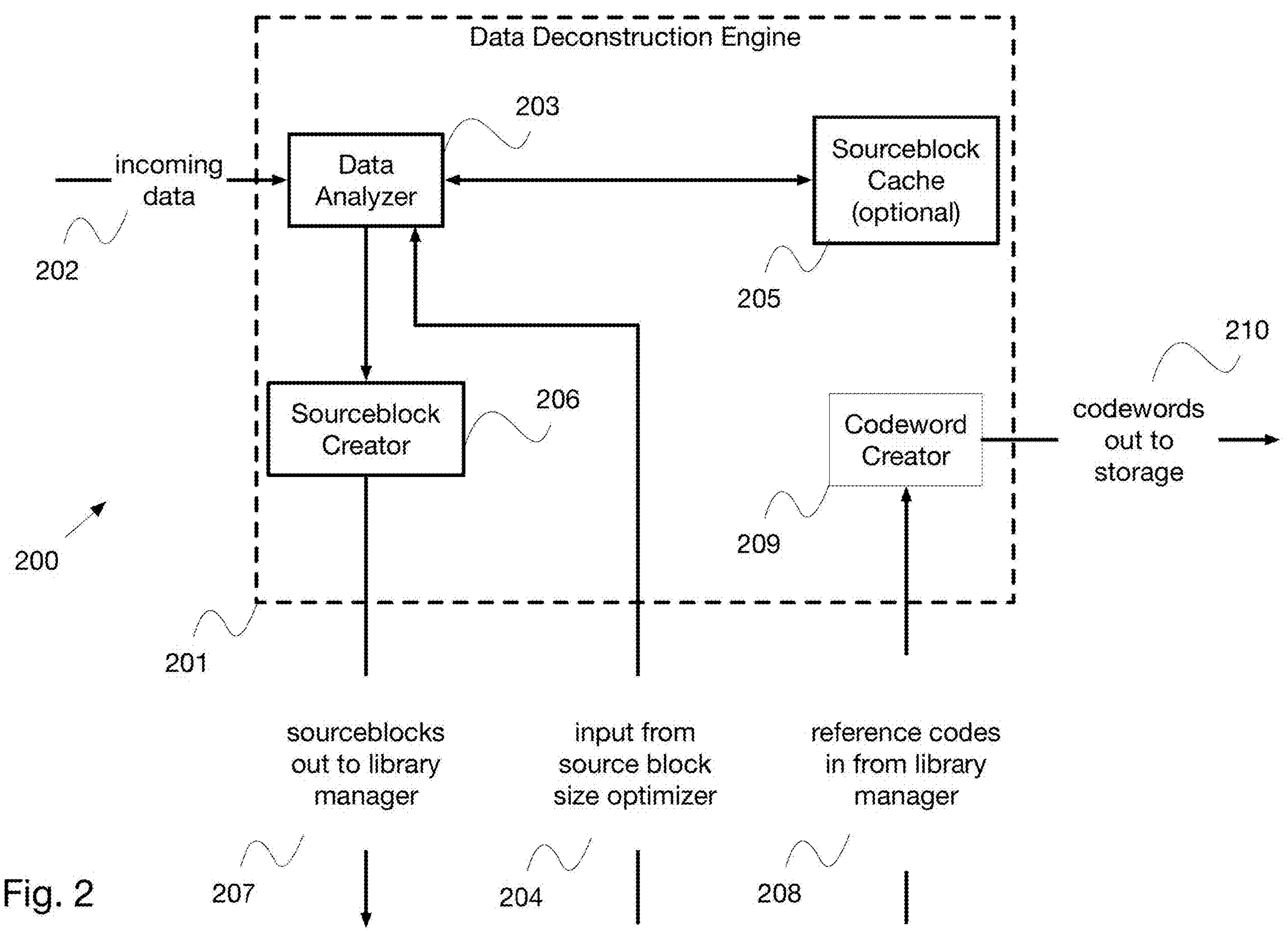
FIG. 2 is a diagram showing an embodiment of one aspect of the system, the data deconstruction engine.

FIG. 2 is a diagram showing an embodiment of one aspect 200 of the system, specifically data deconstruction engine 201. Incoming data 202 is received by data analyzer 203, which optimally analyzes the data based on machine learning algorithms and input 204 from a sourceblock size optimizer, which is disclosed below. Data analyzer may optionally have access to a sourceblock cache 205 of recently-processed sourceblocks, which can increase the speed of the system by avoiding processing in library manager 103. Based on information from data analyzer 203, the data is broken into sourceblocks by sourceblock creator 206, which sends sourceblocks 207 to library manager 203 for additional processing. Data deconstruction engine 201 receives reference codes 208 from library manager 103, corresponding to the sourceblocks in the library that match the sourceblocks sent by sourceblock creator 206, and codeword creator 209 processes the reference codes into codewords comprising a reference code to a sourceblock and a location of that sourceblock within the data set. The original data may be discarded, and the codewords representing the data are sent out to storage 210.

Figure 3:
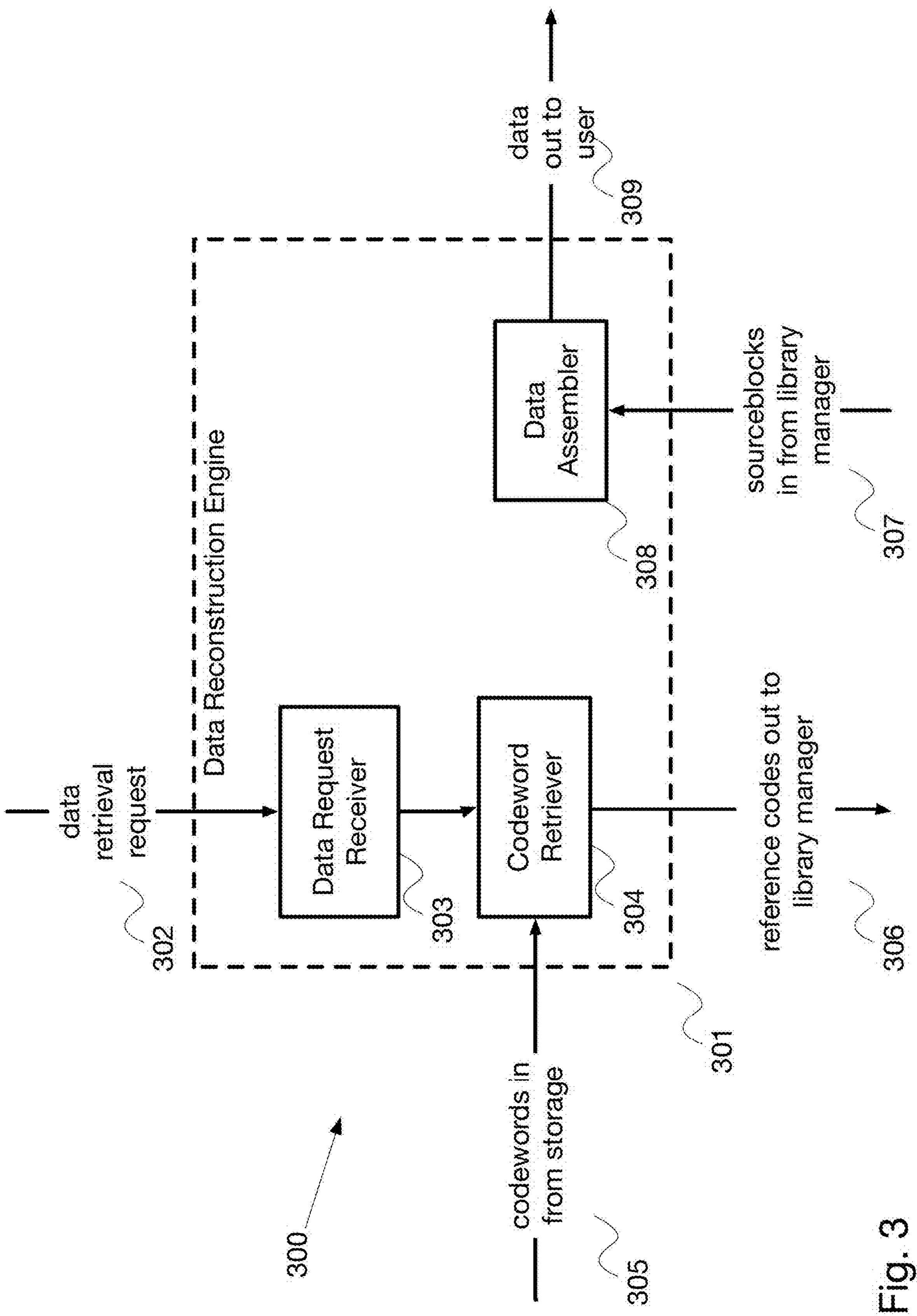
FIG. 3 is a diagram showing an embodiment of one aspect of the system, the data reconstruction engine.

FIG. 3 is a diagram showing an embodiment of another aspect of system 300, specifically data reconstruction engine 301. When a data retrieval request 302 is received by data request receiver 303 (in the form of a plurality of codewords corresponding to a desired final data set), it passes the information to data retriever 304, which obtains the requested data 305 from storage. Data retriever 304 sends, for each codeword received, a reference codes from the codeword 306 to library manager 103 for retrieval of the specific sourceblock associated with the reference code. Data assembler 308 receives the sourceblock 307 from library manager 103 and, after receiving a plurality of sourceblocks corresponding to a plurality of codewords, assembles them into the proper order based on the location information contained in each codeword (recall each codeword comprises a sourceblock reference code and a location identifier that specifies where in the resulting data set the specific sourceblock should be restored to. The requested data is then sent to user 309 in its original form.

Figure 4:
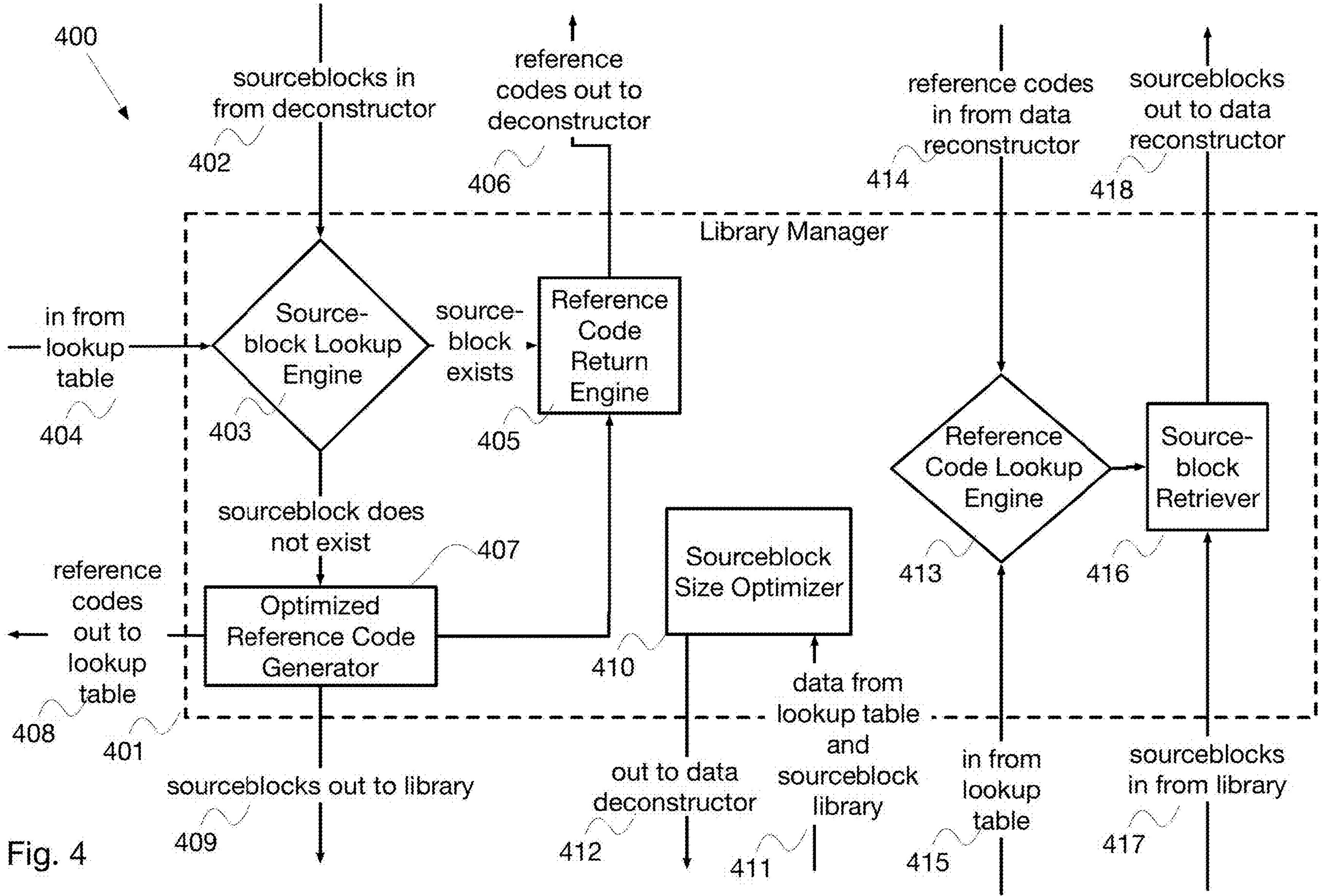
FIG. 4 is a diagram showing an embodiment of one aspect of the system, the library management module.

FIG. 4 is a diagram showing an embodiment of another aspect of the system 400, specifically library manager 401. One function of library manager 401 is to generate reference codes from sourceblocks received from data deconstruction engine 301. As sourceblocks are received 402 from data deconstruction engine 301, sourceblock lookup engine 403 checks sourceblock library lookup table 404 to determine whether those sourceblocks already exist in sourceblock library storage 105. If a particular sourceblock exists in sourceblock library storage 105, reference code return engine 405 sends the appropriate reference code 406 to data deconstruction engine 301. If the sourceblock does not exist in sourceblock library storage 105, optimized reference code generator 407 generates a new, optimized reference code based on machine learning algorithms. Optimized reference code generator 407 then saves the reference code 408 to sourceblock library lookup table 104; saves the associated sourceblock 409 to sourceblock library storage 105; and passes the reference code to reference code return engine 405 for sending 406 to data deconstruction engine 301. Another function of library manager 401 is to optimize the size of sourceblocks in the system. Based on information 411 contained in sourceblock library lookup table 104, sourceblock size optimizer 410 dynamically adjusts the size of sourceblocks in the system based on machine learning algorithms and outputs that information 412 to data analyzer 203. Another function of library manager 401 is to return sourceblocks associated with reference codes received from data reconstruction engine 301. As reference codes are received 414 from data reconstruction engine 301, reference code lookup engine 413 checks sourceblock library lookup table 415 to identify the associated sourceblocks; passes that information to sourceblock retriever 416, which obtains the sourceblocks 417 from sourceblock library storage 105; and passes them 418 to data reconstruction engine 301.

Figure 5:
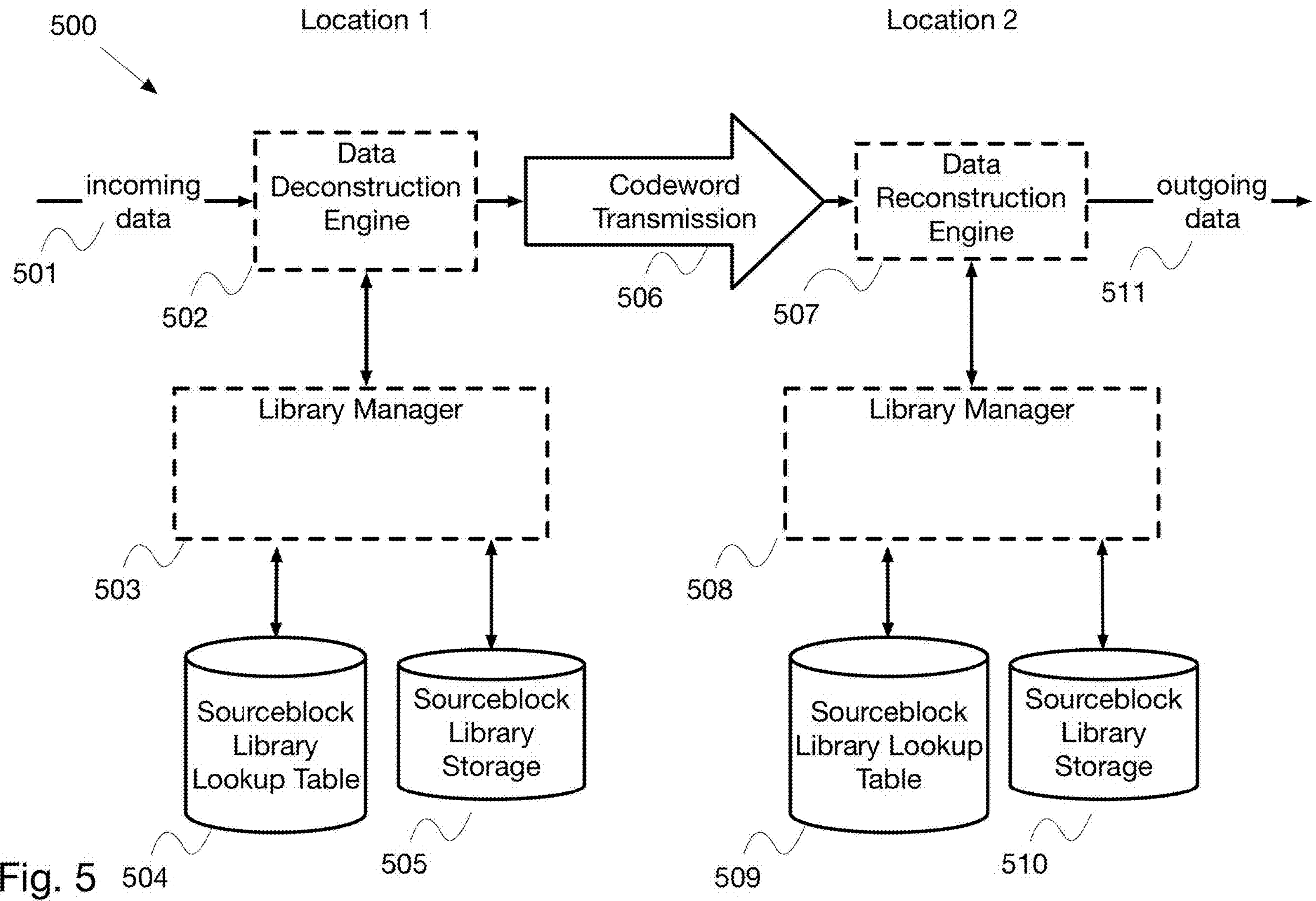
FIG. 5 is a diagram showing another embodiment of the system in which data is transferred between remote locations.

FIG. 5 is a diagram showing another embodiment of system 500, in which data is transferred between remote locations. As incoming data 501 is received by data deconstruction engine 502 at Location 1, data deconstruction engine 301 breaks the incoming data into sourceblocks, which are then sent to library manager 503 at Location 1. Using the information contained in sourceblock library lookup table 504 at Location 1 and sourceblock library storage 505 at Location 1, library manager 503 returns reference codes to data deconstruction engine 301 for processing into codewords, which are transmitted 506 to data reconstruction engine 507 at Location 2. In the case where the reference codes contained in a particular codeword have been newly generated by library manager 503 at Location 1, the codeword is transmitted along with a copy of the associated sourceblock. As data reconstruction engine 507 at Location 2 receives the codewords, it passes them to library manager module 508 at Location 2, which looks up the sourceblock in sourceblock library lookup table 509 at Location 2, and retrieves the associated from sourceblock library storage 510. Where a sourceblock has been transmitted along with a codeword, the sourceblock is stored in sourceblock library storage 510 and sourceblock library lookup table 504 is updated. Library manager 503 returns the appropriate sourceblocks to data reconstruction engine 507, which assembles them into the proper order and sends the data in its original form 511.

Figure 6:
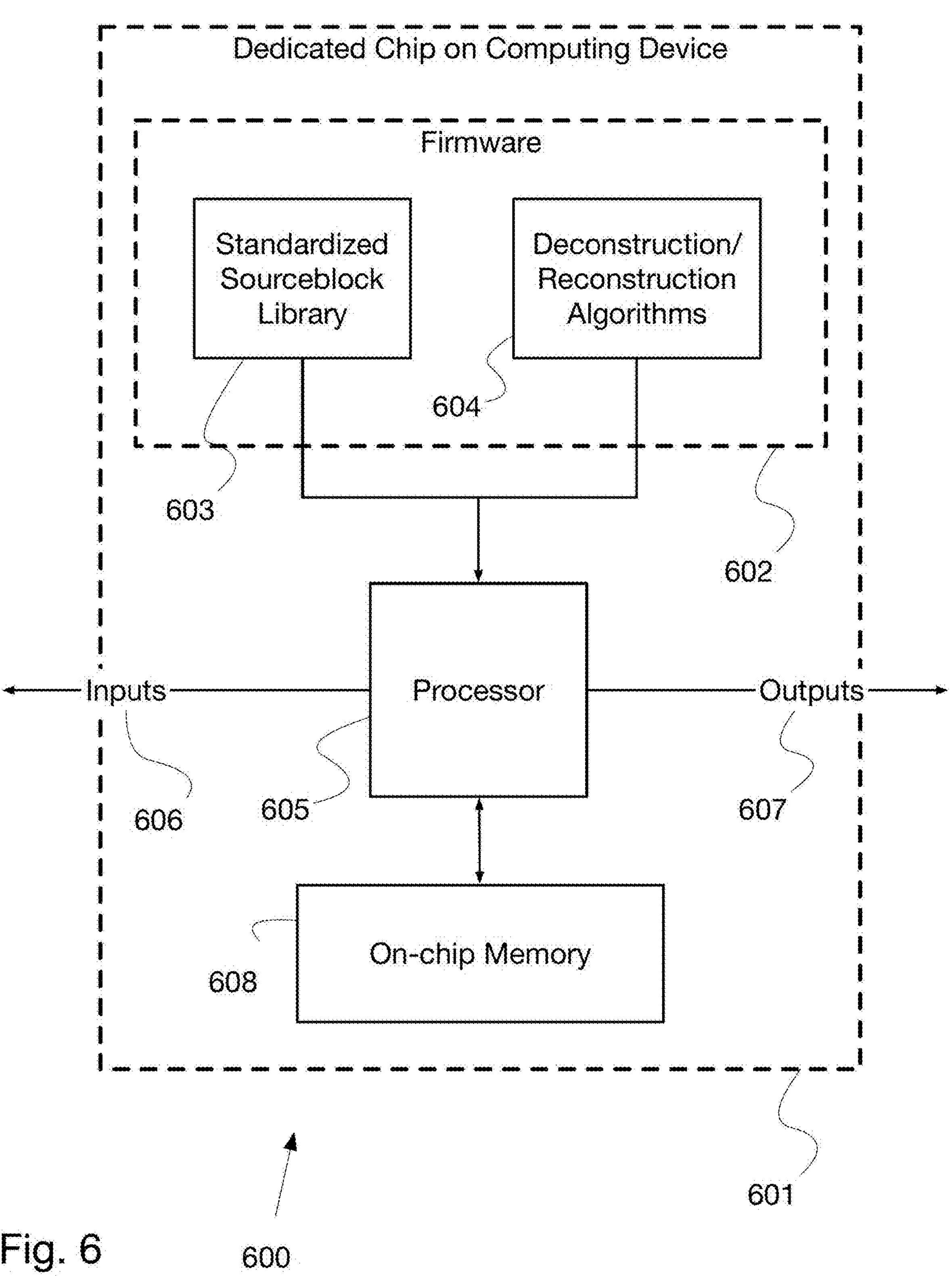
FIG. 6 is a diagram showing an embodiment in which a standardized version of the sourceblock library and associated algorithms would be encoded as firmware on a dedicated processing chip included as part of the hardware of a plurality of devices.

FIG. 6 is a diagram showing an embodiment 600 in which a standardized version of a sourceblock library 603 and associated algorithms 604 would be encoded as firmware 602 on a dedicated processing chip 601 included as part of the hardware of a plurality of devices 600. Contained on dedicated chip 601 would be a firmware area 602, on which would be stored a copy of a standardized sourceblock library 603 and deconstruction/reconstruction algorithms 604 for processing the data. Processor 605 would have both inputs 606 and outputs 607 to other hardware on the device 600. Processor 605 would store incoming data for processing on on-chip memory 608, process the data using standardized sourceblock library 603 and deconstruction/reconstruction algorithms 604, and send the processed data to other hardware on device 600. Using this embodiment, the encoding and decoding of data would be handled by dedicated chip 601, keeping the burden of data processing off device's 600 primary processors. Any device equipped with this embodiment would be able to store and transmit data in a highly optimized, bandwidth-efficient format with any other device equipped with this embodiment.

Figure 12:
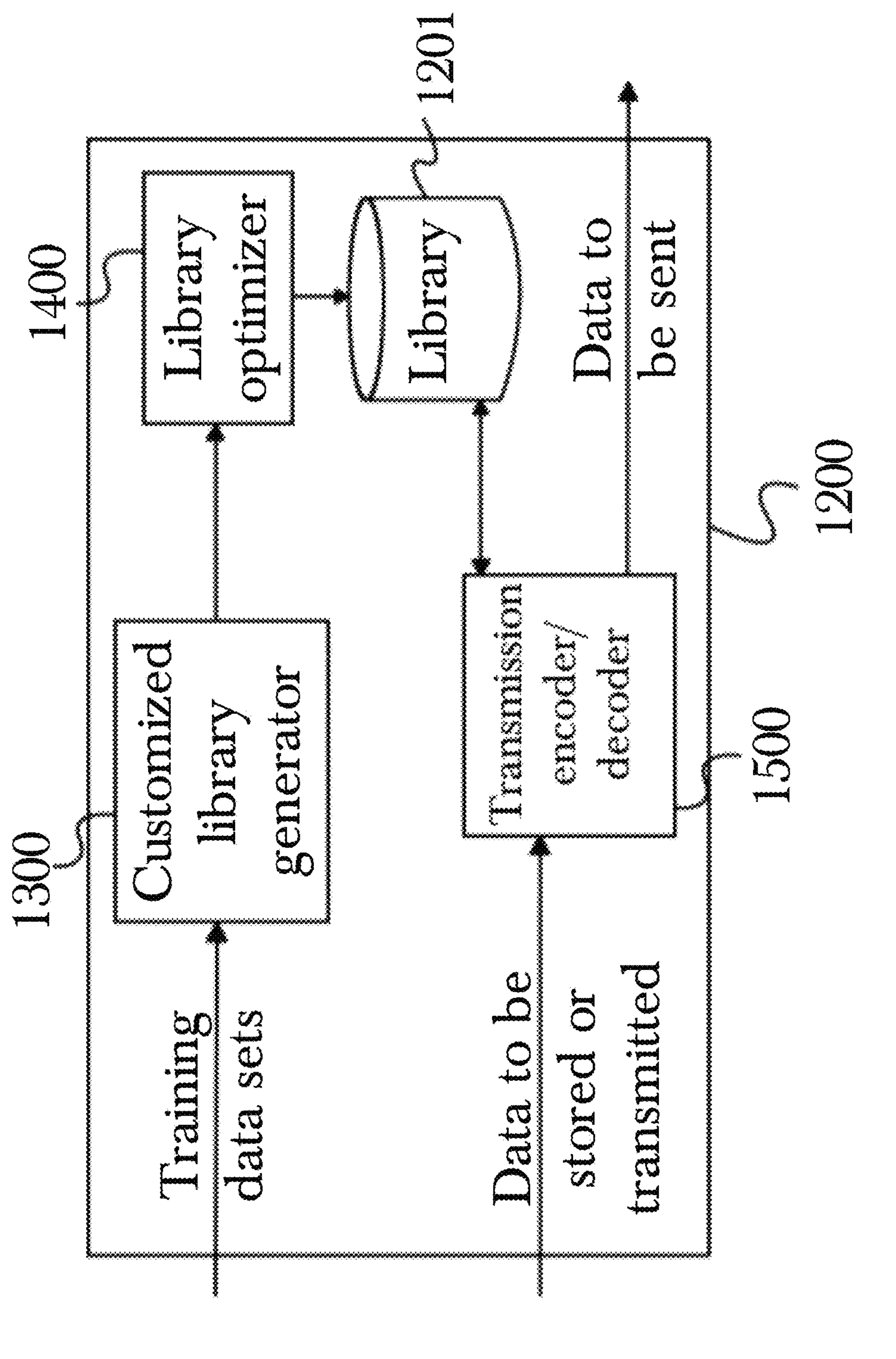
FIG. 12 is a diagram showing an exemplary system architecture, according to a preferred embodiment of the invention.

FIG. 12 is a diagram showing an exemplary system architecture 1200, according to a preferred embodiment of the invention. Incoming training data sets may be received at a customized library generator 1300 that processes training data to produce a customized word library 1201 comprising key-value pairs of data words (each comprising a string of bits) and their corresponding calculated binary Huffman codewords. The resultant word library 1201 may then be processed by a library optimizer 1400 to reduce size and improve efficiency, for example by pruning low-occurrence data entries or calculating approximate codewords that may be used to match more than one data word. A transmission encoder/decoder 1500 may be used to receive incoming data intended for storage or transmission, process the data using a word library 1201 to retrieve codewords for the words in the incoming data, and then append the codewords (rather than the original data) to an outbound data stream. Each of these components is described in greater detail below, illustrating the particulars of their respective processing and other functions, referring to FIGS. 2-4.

System 1200 provides near-instantaneous source coding that is dictionary-based and learned in advance from sample training data, so that encoding and decoding may happen concurrently with data transmission. This results in computational latency that is near zero but the data size reduction is comparable to classical compression. For example, if N bits are to be transmitted from sender to receiver, the compression ratio of classical compression is C, the ratio between the deflation factor of system 1200 and that of multi-pass source coding is p, the classical compression encoding rate is $R_C$ bit/s and the decoding rate is $R_D$ bit/s, and the transmission speed is S bit/s, the compress-send-decompress time will be $$T_{old} = \frac{N}{R_C} + \frac{N}{CS} + \frac{N}{CR_D}$$

while the transmit-while-coding time for system 1200 will be (assuming that encoding and decoding happen at least as quickly as network latency):

$$T_{new} = \frac{N_p}{CS}$$

so that the total data transit time improvement factor is $$\frac{T_{old}}{T_{new}} = \frac{\frac{CS}{R_C} + 1 + \frac{S}{R_D}}{p}$$

which presents a savings whenever $$\frac{CS}{R_C} + \frac{S}{R_D} > p - 1.$$

This is a reasonable scenario given that typical values in real-world practice are C=0.32, $R_C=1.1\cdot10^{12}$, $R_D=4.2\cdot10^{12}$, $S=10^{11}$, giving $$\frac{CS}{R_C} + \frac{S}{R_D} = 0.053 \ldots ,$$

such that system 1200 will outperform the total transit time of the best compression technology available as long as its deflation factor is no more than 5% worse than compression. Such customized dictionary-based encoding will also sometimes exceed the deflation ratio of classical compression, particularly when network speeds increase beyond 100 Gb/s.

The delay between data creation and its readiness for use at a receiving end will be equal to only the source word length t (typically 5-15 bytes), divided by the deflation factor C/p and the network speed S, i.e.

$$\text{delay}_{invention} = \frac{tp}{CS}$$

since encoding and decoding occur concurrently with data transmission. On the other hand, the latency associated with classical compression is $$\text{delay}_{priorart} = \frac{N}{R_C} + \frac{N}{CS} + \frac{N}{CR_D}$$

where N is the packet/file size. Even with the generous values chosen above as well as N=512K, t=10, and p=1.05, this results in $\text{delay}_{invention} \approx 3.3\cdot10^{-10}$ while $\text{delay}_{priorart} \approx 1.3\cdot10^{-7}$, a more than 400-fold reduction in latency.

A key factor in the efficiency of Huffman coding used by system 1200 is that key-value pairs be chosen carefully to minimize expected coding length, so that the average deflation/compression ratio is minimized. It is possible to achieve the best possible expected code length among all instantaneous codes using Huffman codes if one has access to the exact probability distribution of source words of a given desired length from the random variable generating them. In practice this is impossible, as data is received in a wide variety of formats and the random processes underlying the source data are a mixture of human input, unpredictable (though in principle, deterministic) physical events, and noise. System 1200 addresses this by restriction of data types and density estimation; training data is provided that is representative of the type of data anticipated in "real-world" use of system 1200, which is then used to model the distribution of binary strings in the data in order to build a Huffman code word library 1200.

Figure 13:
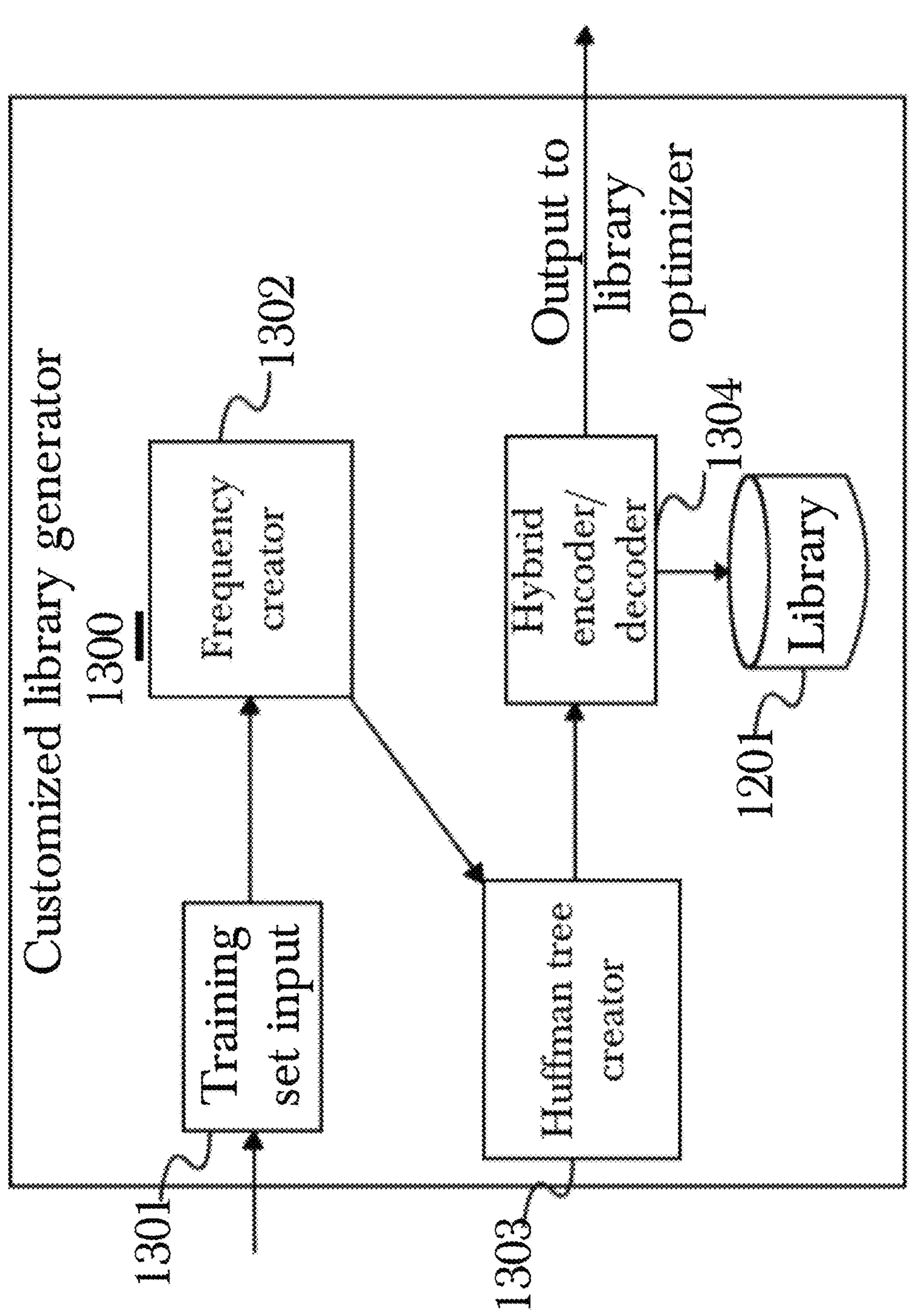
FIG. 13 is a diagram showing a more detailed architecture for a customized library generator.

FIG. 13 is a diagram showing a more detailed architecture for a customized library generator 1300. When an incoming training data set 1301 is received, it may be analyzed using a frequency creator 1302 to analyze for word frequency (that is, the frequency with which a given word occurs in the training data set). Word frequency may be analyzed by scanning all substrings of bits and directly calculating the frequency of each substring by iterating over the data set to produce an occurrence frequency, which may then be used to estimate the rate of word occurrence in non-training data. A first Huffman binary tree is created based on the frequency of occurrences of each word in the first dataset, and a Huffman codeword is assigned to each observed word in the first dataset according to the first Huffman binary tree. Machine learning may be utilized to improve results by processing a number of training data sets and using the results of each training set to refine the frequency estimations for non-training data, so that the estimation yield better results when used with real-world data (rather than, for example, being only based on a single training data set that may not be very similar to a received non-training data set). A second Huffman tree creator 1303 may be utilized to identify words that do not match any existing entries in a word library 1201 and pass them to a hybrid encoder/decoder 1304, that then calculates a binary Huffman codeword for the mismatched word and adds the codeword and original data to the word library 1201 as a new key-value pair. In this manner, customized library generator 1300 may be used both to establish an initial word library 1201 from a first training set, as well as expand the word library 1201 using additional training data to improve operation.

Figure 14:
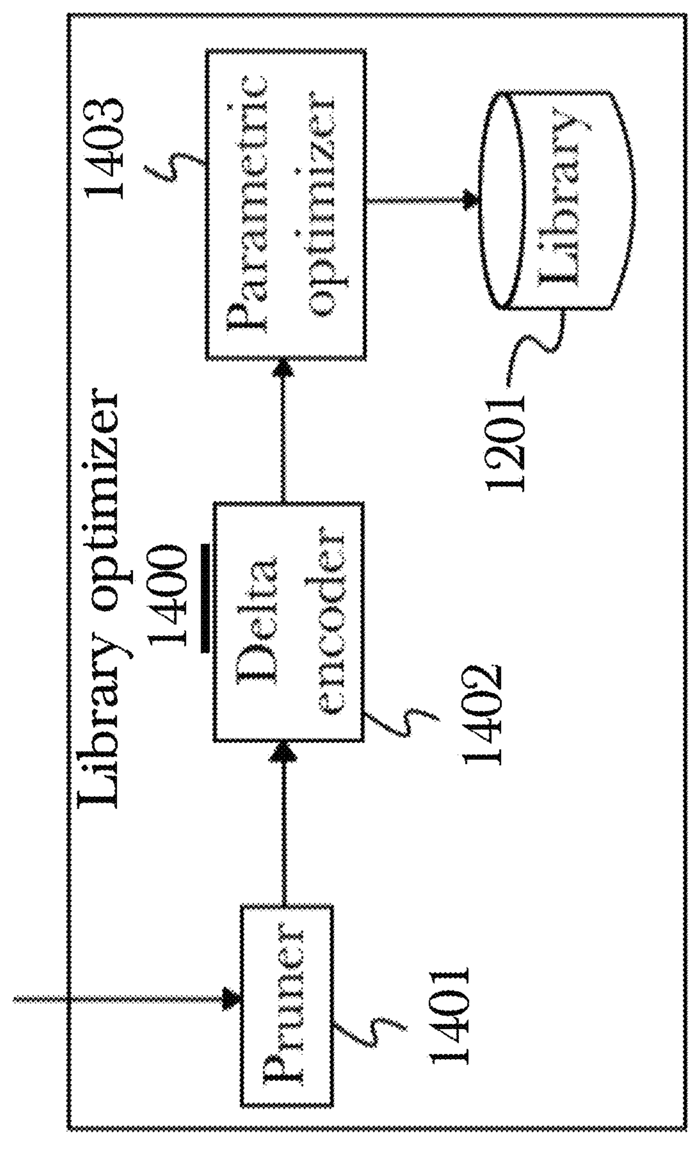
FIG. 14 is a diagram showing a more detailed architecture for a library optimizer.

FIG. 14 is a diagram showing a more detailed architecture for a library optimizer 1400. A pruner 1401 may be used to load a word library 1201 and reduce its size for efficient operation, for example by sorting the word library 1201 based on the known occurrence probability of each key-value pair and removing low-probability key-value pairs based on a loaded threshold parameter. This prunes low-value data from the word library to trim the size, eliminating large quantities of very-low-frequency key-value pairs such as single-occurrence words that are unlikely to be encountered again in a data set. Pruning eliminates the least-probable entries from word library 1201 up to a given threshold, which will have a negligible impact on the deflation factor since the removed entries are only the least-common ones, while the impact on word library size will be larger because samples drawn from asymptotically normal distributions (such as the log-probabilities of words generated by a probabilistic finite state machine, a model well-suited to a wide variety of real-world data) which occur in tails of the distribution are disproportionately large in counting measure. A delta encoder 1402 may be utilized to apply delta encoding to a plurality of words to store an approximate codeword as a value in the word library, for which each of the plurality of source words is a valid corresponding key. This may be used to reduce library size by replacing numerous key-value pairs with a single entry for the approximate codeword and then represent actual codewords using the approximate codeword plus a delta value representing the difference between the approximate codeword and the actual codeword. Approximate coding is optimized for low-weight sources such as Golomb coding, run-length coding, and similar techniques. The approximate source words may be chosen by locality-sensitive hashing, so as to approximate Hamming distance without incurring the intractability of nearest-neighbor-search in Hamming space. A parametric optimizer 1403 may load configuration parameters for operation to optimize the use of the word library 1201 during operation. Best-practice parameter/hyperparameter optimization strategies such as stochastic gradient descent, quasi-random grid search, and evolutionary search may be used to make optimal choices for all interdependent settings playing a role in the functionality of system 1200. In cases where lossless compression is not required, the delta value may be discarded at the expense of introducing some limited errors into any decoded (reconstructed) data.

Figure 15:
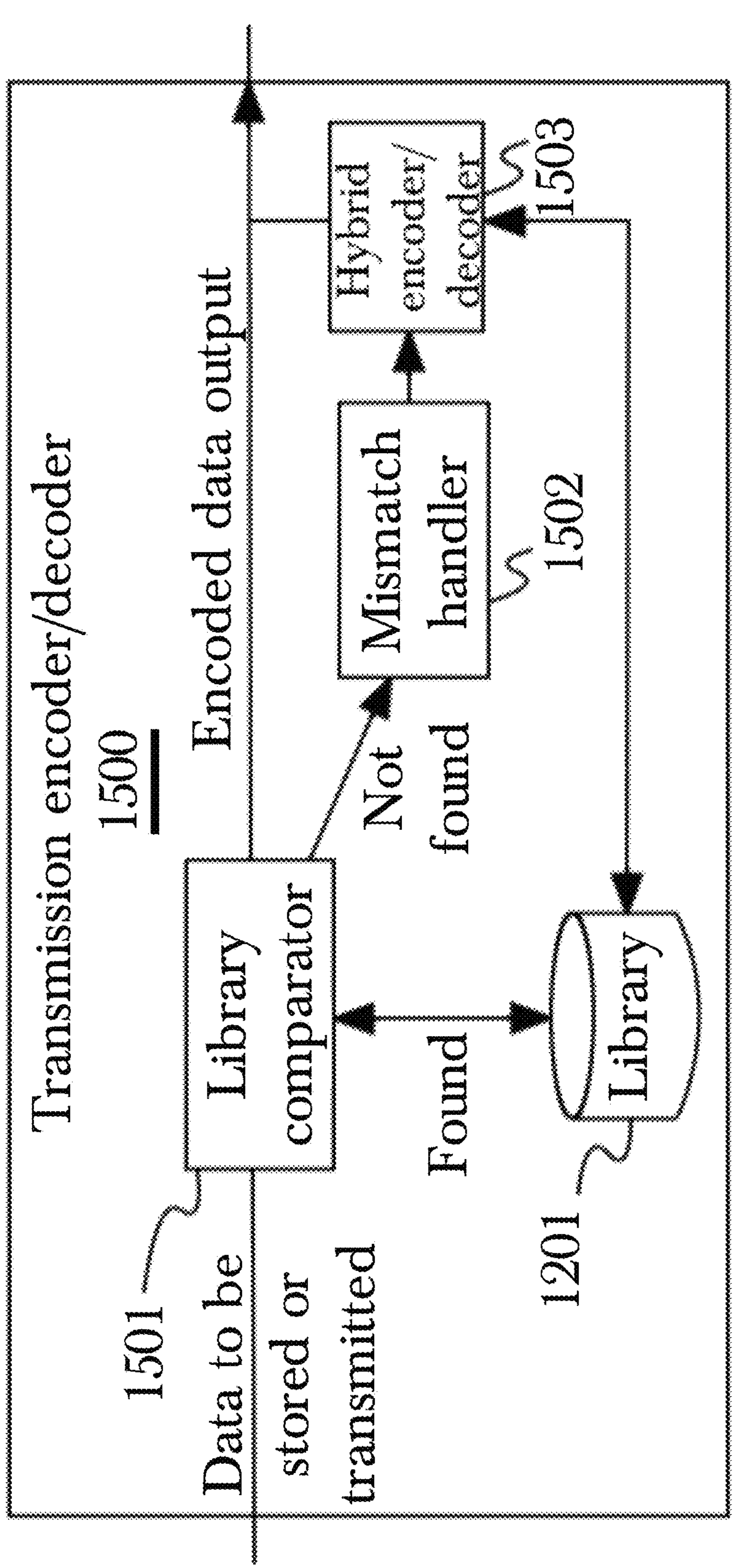
FIG. 15 is a diagram showing a more detailed architecture for a transmission and storage engine.

FIG. 15 is a diagram showing a more detailed architecture for a transmission encoder/decoder 1500. According to various arrangements, transmission encoder/decoder 1500 may be used to deconstruct data for storage or transmission, or to reconstruct data that has been received, using a word library 1201. A library comparator 1501 may be used to receive data comprising words or codewords, and compare against a word library 1201 by dividing the incoming stream into substrings of length t and using a fast hash to check word library 1201 for each substring. If a substring is found in word library 1201, the corresponding key/value (that is, the corresponding source word or codeword, according to whether the substring used in comparison was itself a word or codeword) is returned and appended to an output stream. If a given substring is not found in word library 1201, a mismatch handler 1502 and hybrid encoder/decoder 1503 may be used to handle the mismatch similarly to operation during the construction or expansion of word library 1201. A mismatch handler 1502 may be utilized to identify words that do not match any existing entries in a word library 1201 and pass them to a hybrid encoder/decoder 1503, that then calculates a binary Huffman codeword for the mismatched word and adds the codeword and original data to the word library 1201 as a new key-value pair. The newly-produced codeword may then be appended to the output stream. In arrangements where a mismatch indicator is included in a received data stream, this may be used to preemptively identify a substring that is not in word library 1201 (for example, if it was identified as a mismatch on the transmission end), and handled accordingly without the need for a library lookup.

Figure 19:
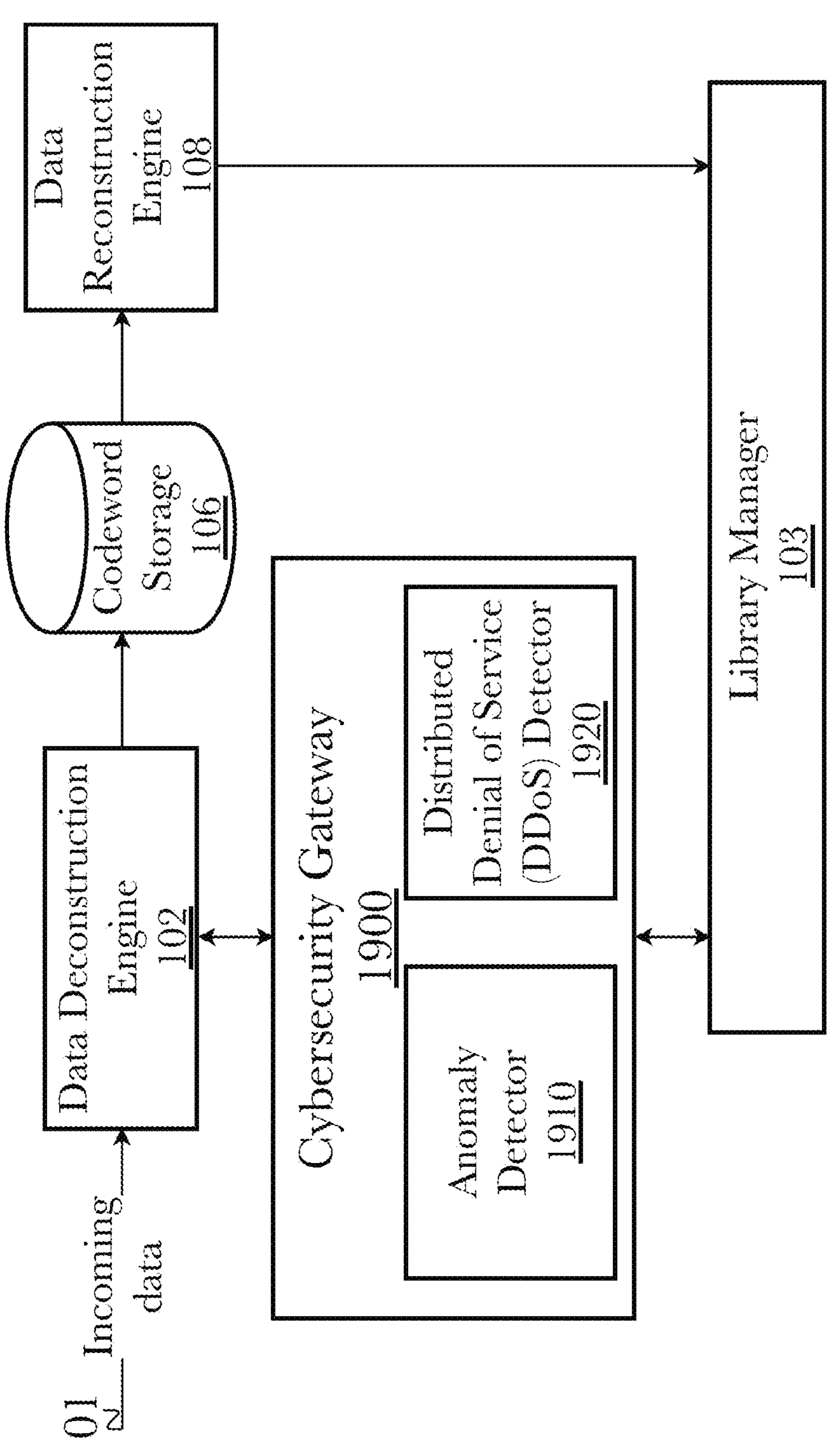
FIG. 19 is an exemplary system architecture of a data encoding system used for cyber security purposes.

FIG. 19 is an exemplary system architecture of a data encoding system used for cyber security purposes. Much like in FIG. 1, incoming data 101 to be deconstructed is sent to a data deconstruction engine 102, which may attempt to deconstruct the data and turn it into a collection of codewords using a library manager 103. Codeword storage 106 serves to store unique codewords from this process, and may be queried by a data reconstruction engine 108 which may reconstruct the original data from the codewords, using a library manager 103. However, a cybersecurity gateway 1900 is present, communicating in-between a library manager 103 and a deconstruction engine 102, and containing an anomaly detector 1910 and distributed denial of service (DDoS) detector 1920. The anomaly detector examines incoming data to determine whether there is a disproportionate number of incoming reference codes that do not match reference codes in the existing library. A disproportionate number of non-matching reference codes may indicate that data is being received from an unknown source, of an unknown type, or contains unexpected (possibly malicious) data. If the disproportionate number of non-matching reference codes exceeds an established threshold or persists for a certain length of time, the anomaly detector 1910 raises a warning to a system administrator. Likewise, the DDOS detector 1920 examines incoming data to determine whether there is a disproportionate amount of repetitive data. A disproportionate amount of repetitive data may indicate that a DDOS attack is in progress. If the disproportionate amount of repetitive data exceeds an established threshold or persists for a certain length of time, the DDOS detector 1910 raises a warning to a system administrator. In this way, a data encoding system may detect and warn users of, or help mitigate, common cyber-attacks that result from a flow of unexpected and potentially harmful data, or attacks that result from a flow of too much irrelevant data meant to slow down a network or system, as in the case of a DDOS attack.

Figure 22:
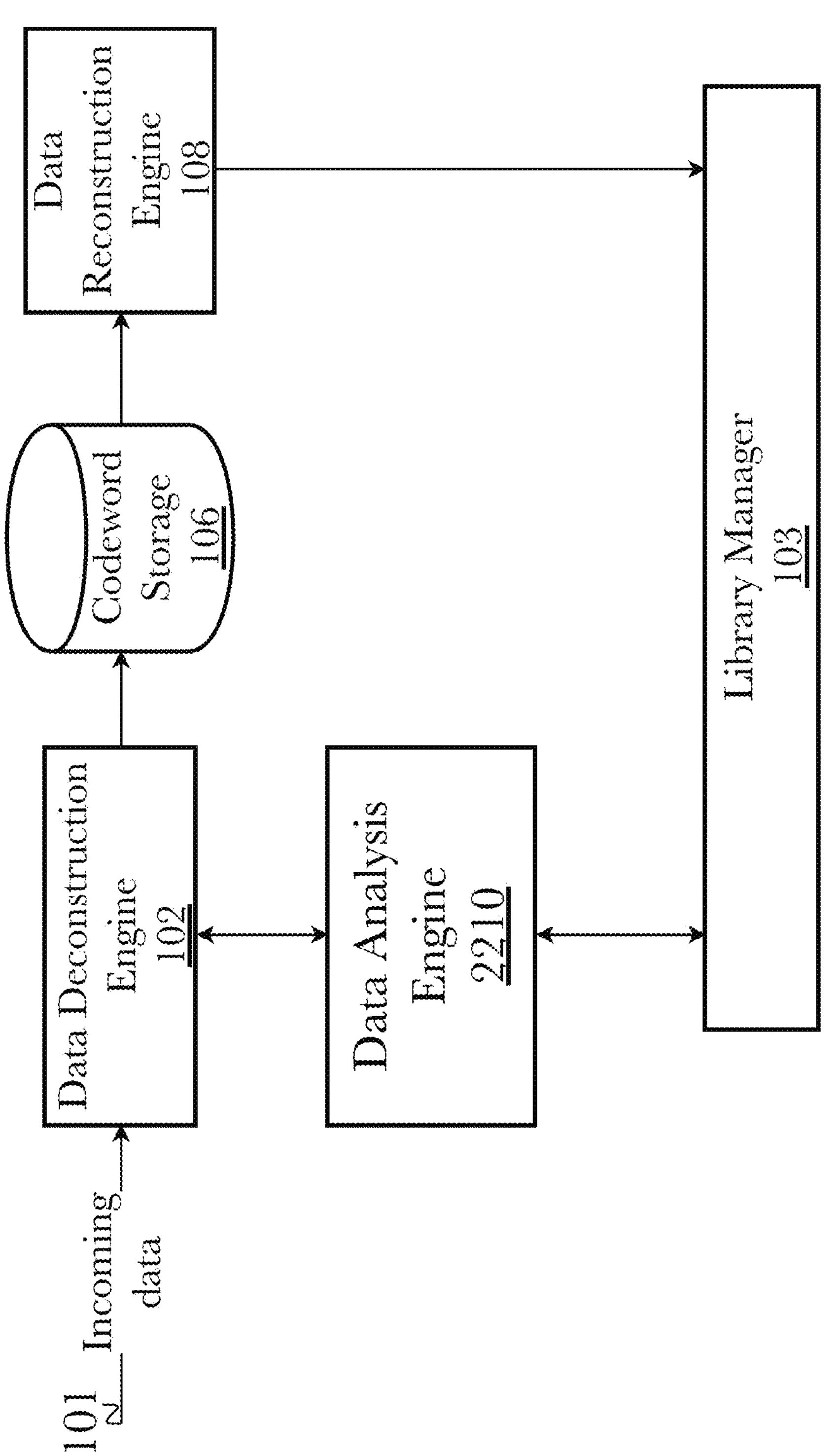
FIG. 22 is an exemplary system architecture of a data encoding system used for data mining and analysis purposes.

FIG. 22 is an exemplary system architecture of a data encoding system used for data mining and analysis purposes. Much like in FIG. 1, incoming data 101 to be deconstructed is sent to a data deconstruction engine 102, which may attempt to deconstruct the data and turn it into a collection of codewords using a library manager 103. Codeword storage 106 serves to store unique codewords from this process, and may be queried by a data reconstruction engine 108 which may reconstruct the original data from the codewords, using a library manager 103. A data analysis engine 2210, typically operating while the system is otherwise idle, sends requests for data to the data reconstruction engine 108, which retrieves the codewords representing the requested data from codeword storage 106, reconstructs them into the data represented by the codewords, and send the reconstructed data to the data analysis engine 2210 for analysis and extraction of useful data (i.e., data mining). Because the speed of reconstruction is significantly faster than decompression using traditional compression technologies (i.e., significantly less decompression latency), this approach makes data mining feasible. Very often, data stored using traditional compression is not mined precisely because decompression lag makes it unfeasible, especially during shorter periods of system idleness. Increasing the speed of data reconstruction broadens the circumstances under which data mining of stored data is feasible.

Figure 24:
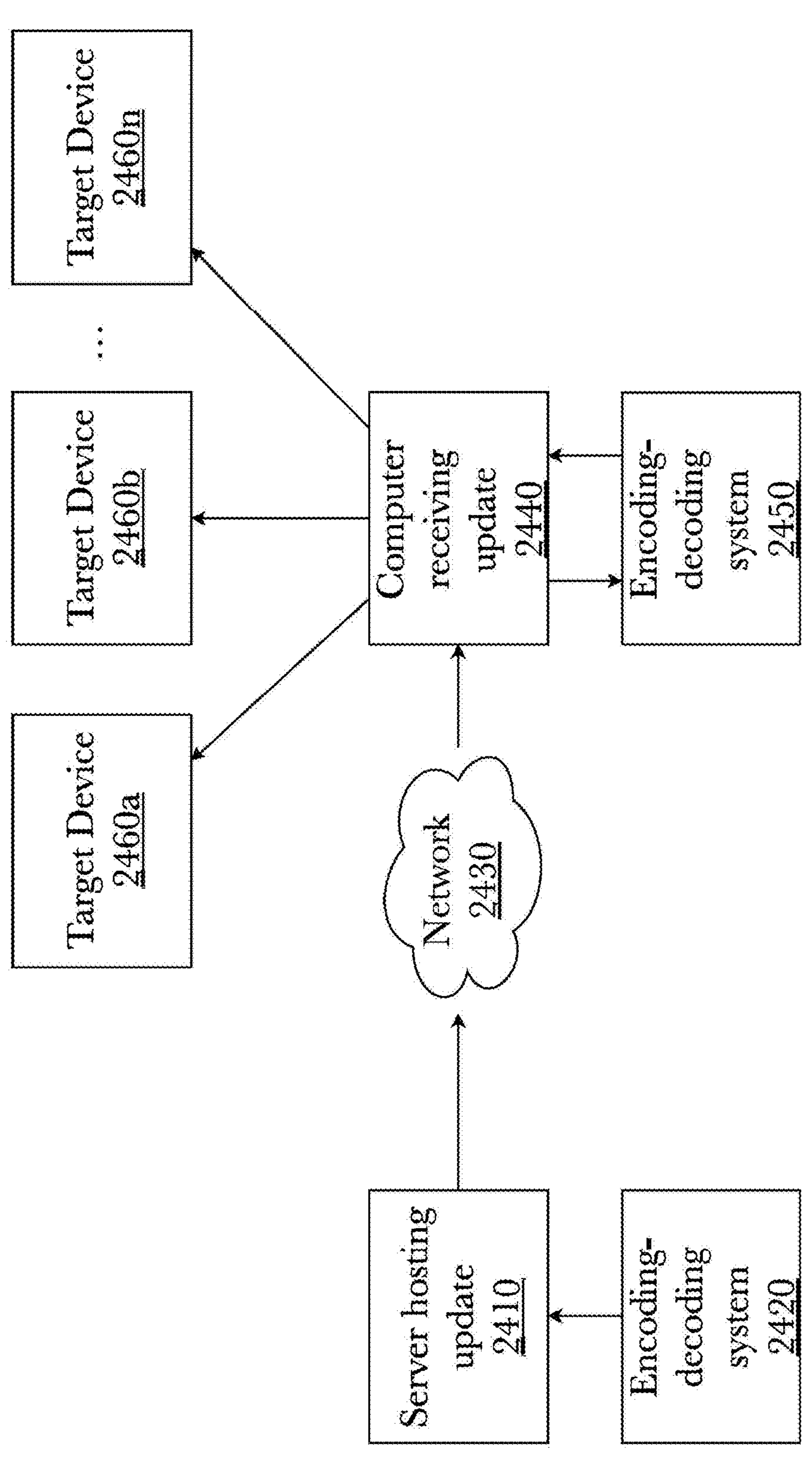
FIG. 24 is an exemplary system architecture of a data encoding system used for remote software and firmware updates.

FIG. 24 is an exemplary system architecture of a data encoding system used for remote software and firmware updates. Software and firmware updates typically require smaller, but more frequent, file transfers. A server which hosts a software or firmware update 2410 may host an encoding-decoding system 2420, allowing for data to be encoded into, and decoded from, sourceblocks or codewords, as disclosed in previous figures. Such a server may possess a software update, operating system update, firmware update, device driver update, or any other form of software update, which in some cases may be minor changes to a file, but nevertheless necessitate sending the new, completed file to the recipient. Such a server is connected over a network 2430, which is further connected to a recipient computer 2440, which may be connected to a server 2410 for receiving such an update to its system. In this instance, the recipient device 2440 also hosts the encoding and decoding system 2450, along with a codebook or library of reference codes that the hosting server 2410 also shares. The updates are retrieved from storage at the hosting server 2410 in the form of codewords, transferred over the network 2430 in the form of codewords, and reconstructed on the receiving computer 2440. In this way, a far smaller file size, and smaller total update size, may be sent over a network. The receiving computer 2440 may then install the updates on any number of target computing devices 2460*a-n*, using a local network or other high-bandwidth connection.

Figure 26:
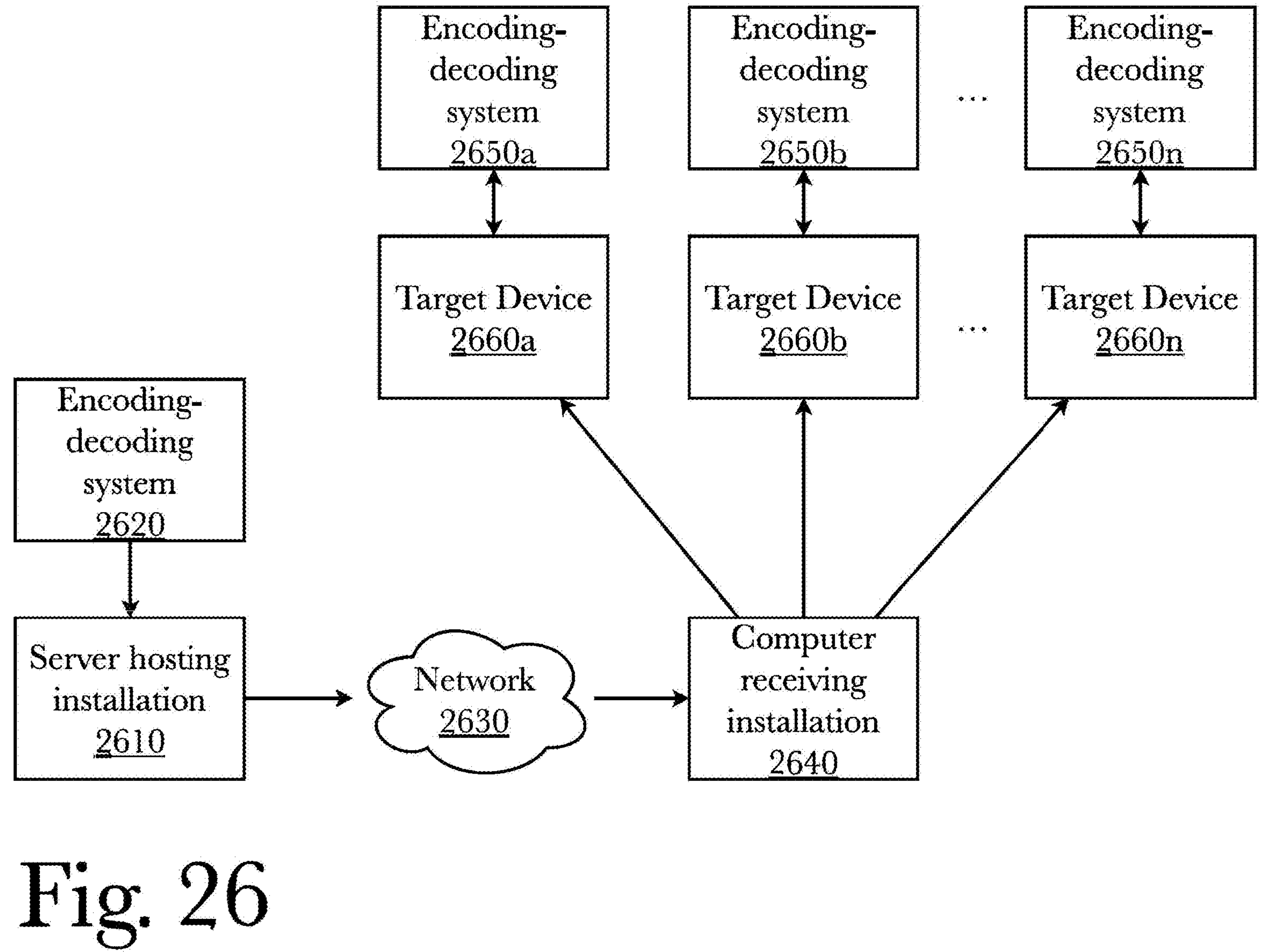
FIG. 26 is an exemplary system architecture of a data encoding system used for large-scale software installation such as operating systems.

FIG. 26 is an exemplary system architecture of a data encoding system used for large-scale software installation such as operating systems. Large-scale software installations typically require very large, but infrequent, file transfers. A server which hosts an installable software 2610 may host an encoding-decoding system 2620, allowing for data to be encoded into, and decoded from, sourceblocks or codewords, as disclosed in previous figures. The files for the large scale software installation are hosted on the server 2610, which is connected over a network 2630 to a recipient computer 2640. In this instance, the encoding and decoding system 2650*a-n* is stored on or connected to one or more target devices 2660*a-n*, along with a codebook or library of reference codes that the hosting server 2610 shares. The software is retrieved from storage at the hosting server 2610 in the form of codewords, and transferred over the network 2630 in the form of codewords to the receiving computer 2640. However, instead of being reconstructed at the receiving computer 2640, the codewords are transmitted to one or more target computing devices, and reconstructed and installed directly on the target devices 2660*a-n*. In this way, a far smaller file size, and smaller total update size, may be sent over a network or transferred between computing devices, even where the network 2630 between the receiving computer 2640 and target devices 2660*a-n* is low bandwidth, or where there are many target devices 2660*a-n*.

Figure 28:
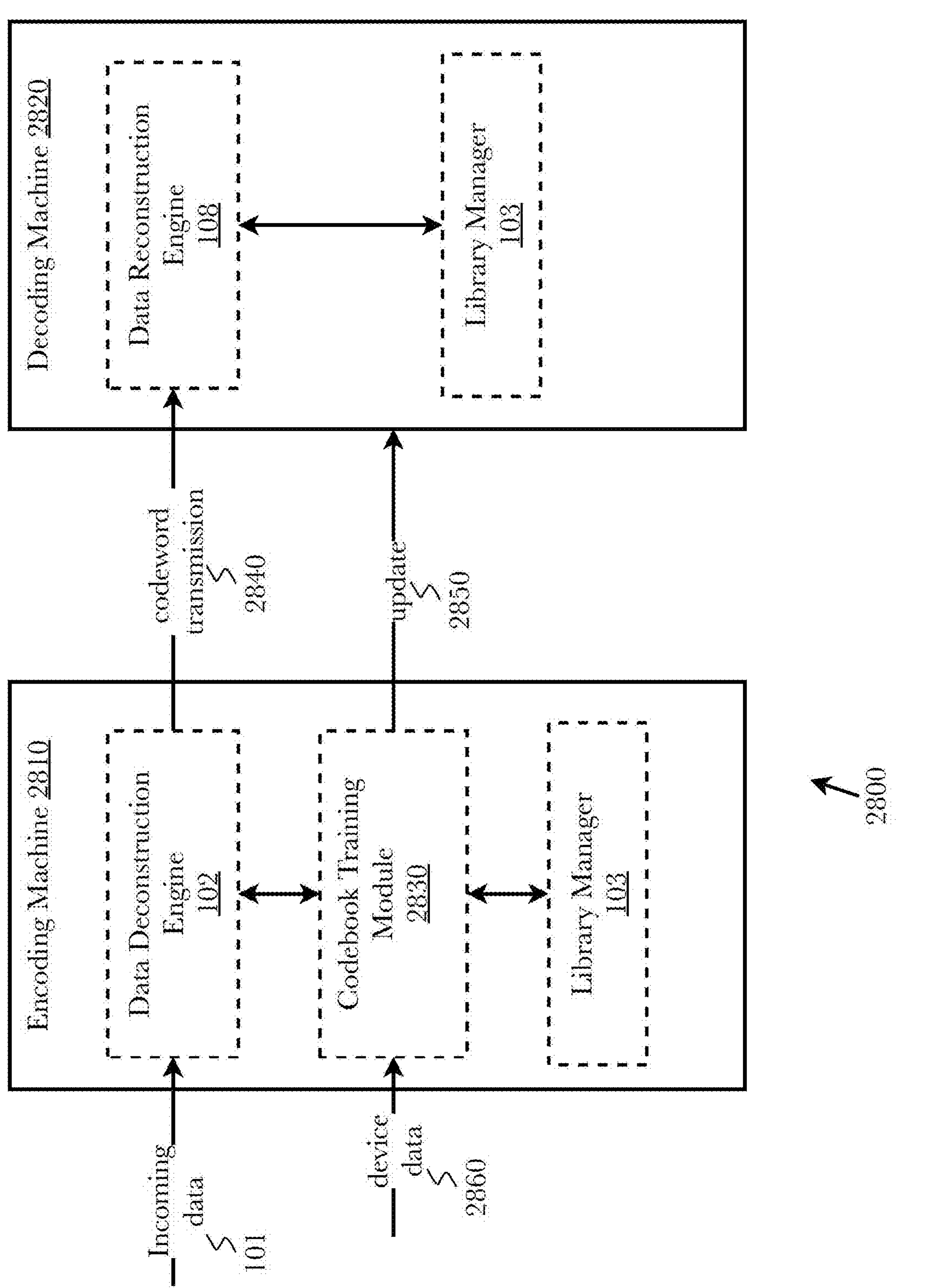
FIG. 28 is a block diagram of an exemplary system architecture of a codebook training system for a data encoding system, according to an embodiment.

FIG. 28 is a block diagram of an exemplary system architecture 2800 of a codebook training system for a data encoding system, according to an embodiment. According to this embodiment, two separate machines may be used for encoding 2810 and decoding 2820. Much like in FIG. 1, incoming data 101 to be deconstructed is sent to a data deconstruction engine 102 residing on encoding machine 2810, which may attempt to deconstruct the data and turn it into a collection of codewords using a library manager 103. Codewords may be transmitted 2840 to a data reconstruction engine 108 residing on decoding machine 2820, which may reconstruct the original data from the codewords, using a library manager 103. However, according to this embodiment, a codebook training module 2830 is present on the decoding machine 2810, communicating in-between a library manager 103 and a deconstruction engine 102. According to other embodiments, codebook training module 2830 may reside instead on decoding machine 2820 if the machine has enough computing resources available; which machine the module 2830 is located on may depend on the system user's architecture and network structure. Codebook training module 2830 may send requests for data to the data reconstruction engine 2810, which routes incoming data 101 to codebook training module 2830. Codebook training module 2830 may perform analyses on the requested data in order to gather information about the distribution of incoming data 101 as well as monitor the encoding/decoding model performance.

Additionally, codebook training module 2830 may also request and receive device data 2860 to supervise network connected devices and their processes and, according to some embodiments, to allocate training resources when requested by devices running the encoding system. Devices may include, but are not limited to, encoding and decoding machines, training machines, sensors, mobile computing devices, and Internet-of-things ("IoT") devices. Based on the results of the analyses, the codebook training module 2830 may create a new training dataset from a subset of the requested data in order to counteract the effects of data drift on the encoding/decoding models, and then publish updated 2850 codebooks to both the encoding machine 2810 and decoding machine 2820.

Figure 29:
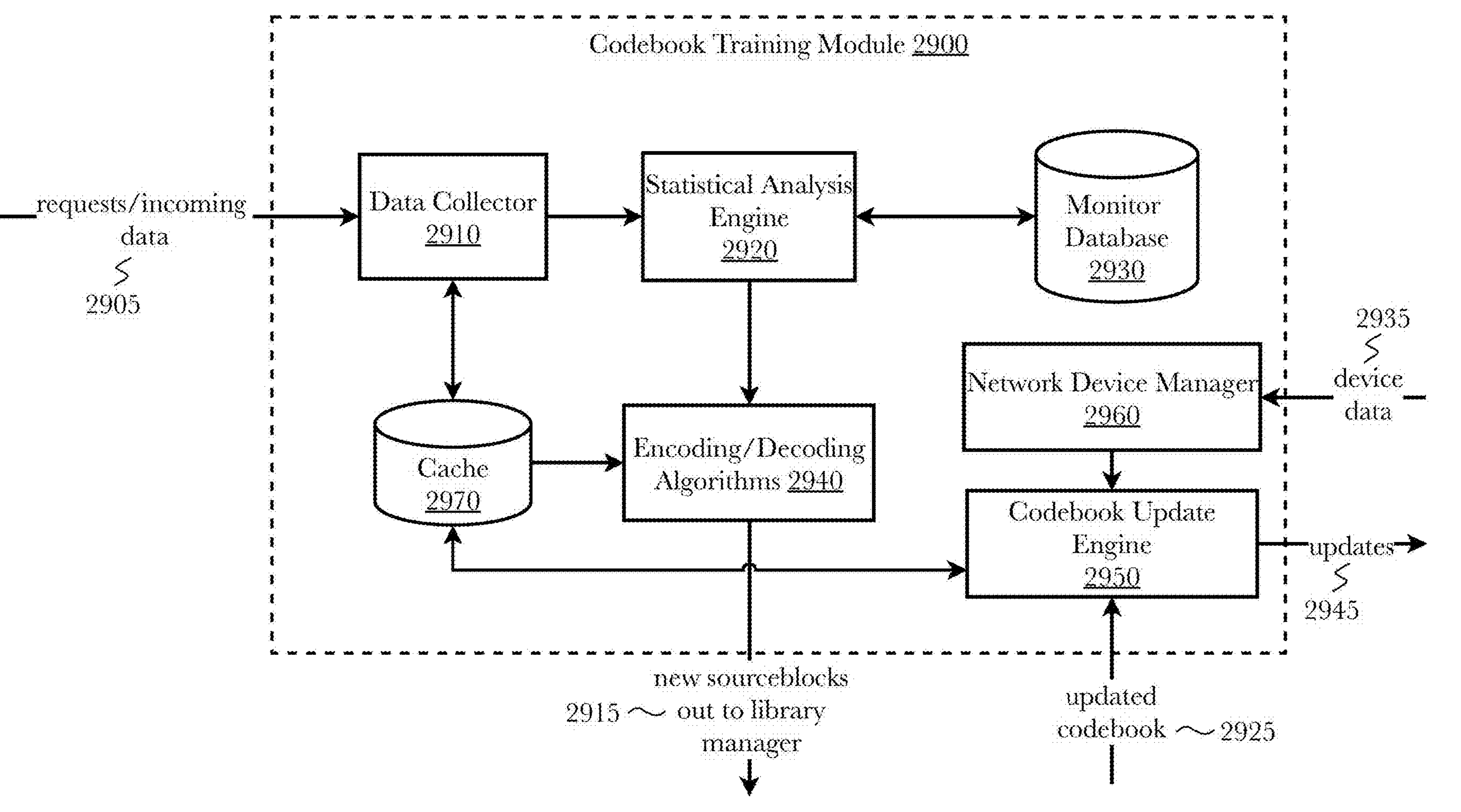
FIG. 29 is a block diagram of an exemplary architecture for a codebook training module, according to an embodiment.

FIG. 29 is a block diagram of an exemplary architecture for a codebook training module 2900, according to an embodiment. According to the embodiment, a data collector 2910 is present which may send requests for incoming data 2905 to a data deconstruction engine 102 which may receive the request and route incoming data to codebook training module 2900 where it may be received by data collector 2910. Data collector 2910 may be configured to request data periodically such as at schedule time intervals, or for example, it may be configured to request data after a certain amount of data has been processed through the encoding machine 2810 or decoding machine 2820. The received data may be a plurality of sourceblocks, which are a series of binary digits, originating from a source packet otherwise referred to as a datagram. The received data may be compiled into a test dataset and temporarily stored in a cache 2970. Once stored, the test dataset may be forwarded to a statistical analysis engine 2920 which may utilize one or more algorithms to determine the probability distribution of the test dataset. Best-practice probability distribution algorithms such as Kullback-Leibler divergence, adaptive windowing, and Jensen-Shannon divergence may be used to compute the probability distribution of training and test datasets. A monitoring database 2930 may be used to store a variety of statistical data related to training datasets and model performance metrics in one place to facilitate quick and accurate system monitoring capabilities as well as assist in system debugging functions. For example, the original or current training dataset and the calculated probability distribution of this training dataset used to develop the current encoding and decoding algorithms may be stored in monitor database 2930.

Since data drifts involve statistical change in the data, the best approach to detect drift is by monitoring the incoming data's statistical properties, the model's predictions, and their correlation with other factors. After statistical analysis engine 2920 calculates the probability distribution of the test dataset it may retrieve from monitor database 2930 the calculated and stored probability distribution of the current training dataset. It may then compare the two probability distributions of the two different datasets in order to verify if the difference in calculated distributions exceeds a predetermined difference threshold. If the difference in distributions does not exceed the difference threshold, that indicates the test dataset, and therefore the incoming data, has not experienced enough data drift to cause the encoding/decoding system performance to degrade significantly, which indicates that no updates are necessary to the existing codebooks. However, if the difference threshold has been surpassed, then the data drift is significant enough to cause the encoding/decoding system performance to degrade to the point where the existing models and accompanying codebooks need to be updated. According to an embodiment, an alert may be generated by statistical analysis engine 2920 if the difference threshold is surpassed or if otherwise unexpected behavior arises.

In the event that an update is required, the test dataset stored in the cache 2970 and its associated calculated probability distribution may be sent to monitor database 2930 for long term storage. This test dataset may be used as a new training dataset to retrain the encoding and decoding algorithms 2940 used to create new sourceblocks based upon the changed probability distribution. The new sourceblocks may be sent out to a library manager 2915 where the sourceblocks can be assigned new codewords. Each new sourceblock and its associated codeword may then be added to a new codebook and stored in a storage device. The new and updated codebook may then be sent back 2925 to codebook training module 2900 and received by a codebook update engine 2950. Codebook update engine 2950 may temporarily store the received updated codebook in the cache 2970 until other network devices and machines are ready, at which point codebook update engine 2950 will publish the updated codebooks 2945 to the necessary network devices.

A network device manager 2960 may also be present which may request and receive network device data 2935 from a plurality of network connected devices and machines. When the disclosed encoding system and codebook training system 2800 are deployed in a production environment, upstream process changes may lead to data drift, or other unexpected behavior. For example, a sensor being replaced that changes the units of measurement from inches to centimeters, data quality issues such as a broken sensor always reading 0, and covariate shift which occurs when there is a change in the distribution of input variables from the training set. These sorts of behavior and issues may be determined from the received device data 2935 in order to identify potential causes of system error that is not related to data drift and therefore does not require an updated codebook. This can save network resources from being unnecessarily used on training new algorithms as well as alert system users to malfunctions and unexpected behavior devices connected to their networks. Network device manager 2960 may also utilize device data 2935 to determine available network resources and device downtime or periods of time when device usage is at its lowest. Codebook update engine 2950 may request network and device availability data from network device manager 2960 in order to determine the most optimal time to transmit updated codebooks (i.e., trained libraries) to encoder and decoder devices and machines.

Figure 30:
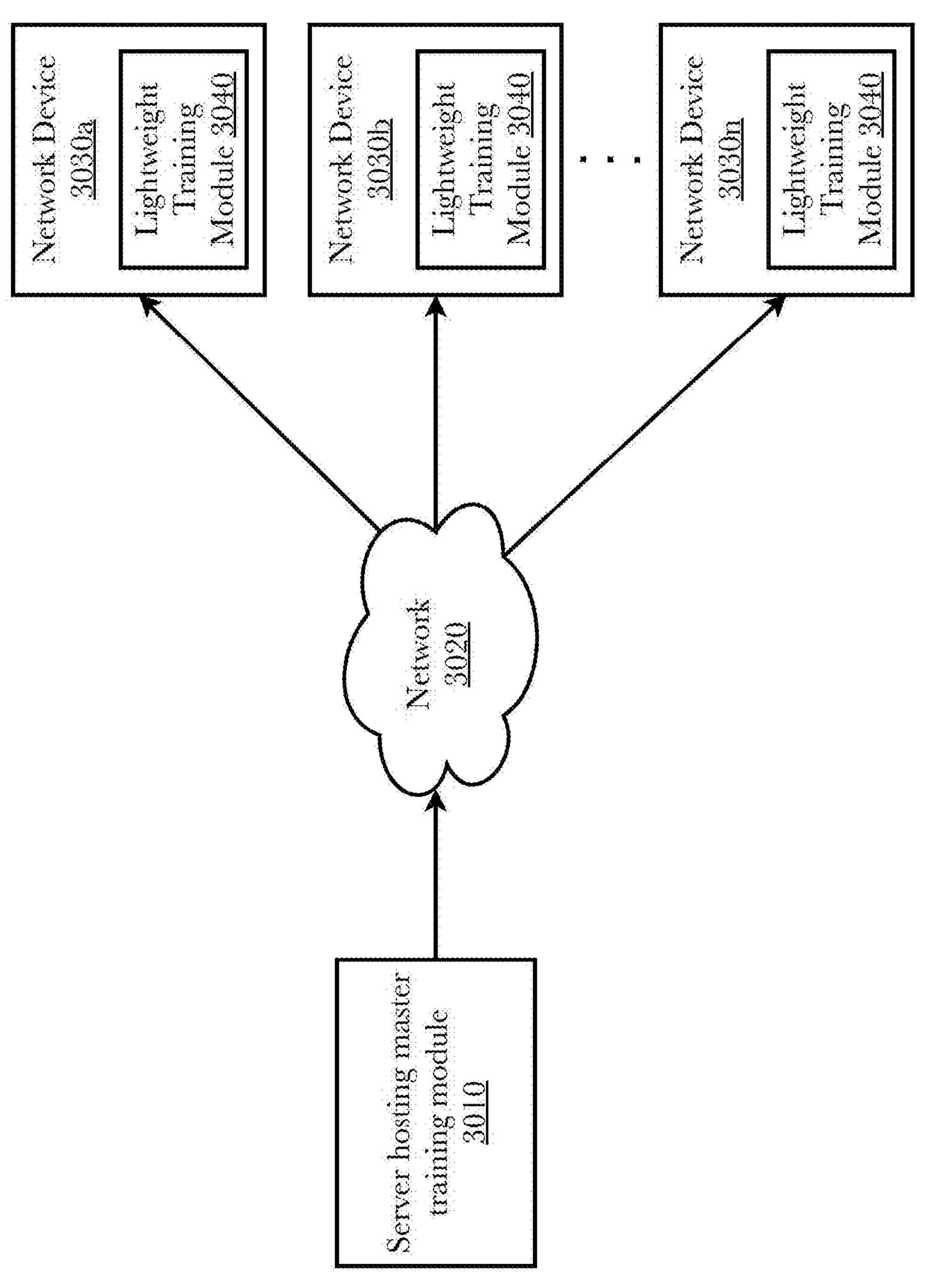
FIG. 30 is a block diagram of another embodiment of the codebook training system using a distributed architecture and a modified training module.

FIG. 30 is a block diagram of another embodiment of the codebook training system using a distributed architecture and a modified training module. According to an embodiment, there may be a server which maintains a master supervisory process over remote training devices hosting a master training module 3010 which communicates via a network 3020 to a plurality of connected network devices 3030*a-n*. The server may be located at the remote training end such as, but not limited to, cloud-based resources, a user-owned data center, etc. The master training module located on the server operates similarly to the codebook training module disclosed in FIG. 29 above, however, the server 3010 utilizes the master training module via the network device manager 2960 to farm out training resources to network devices 3030*a-n*. The server 3010 may allocate resources in a variety of ways, for example, round-robin, priority-based, or other manner, depending on the user needs, costs, and number of devices running the encoding/decoding system. Server 3010 may identify elastic resources which can be employed if available to scale up training when the load becomes too burdensome. On the network devices 3030*a-n* may be present a lightweight version of the training module 3040 that trades a little suboptimality in the codebook for training on limited machinery and/or makes training happen in low-priority threads to take advantage of idle time. In this way the training of new encoding/decoding algorithms may take place in a distributed manner which allows data gathering or generating devices to process and train on data gathered locally, which may improve system latency and optimize available network resources.

Figure 32:
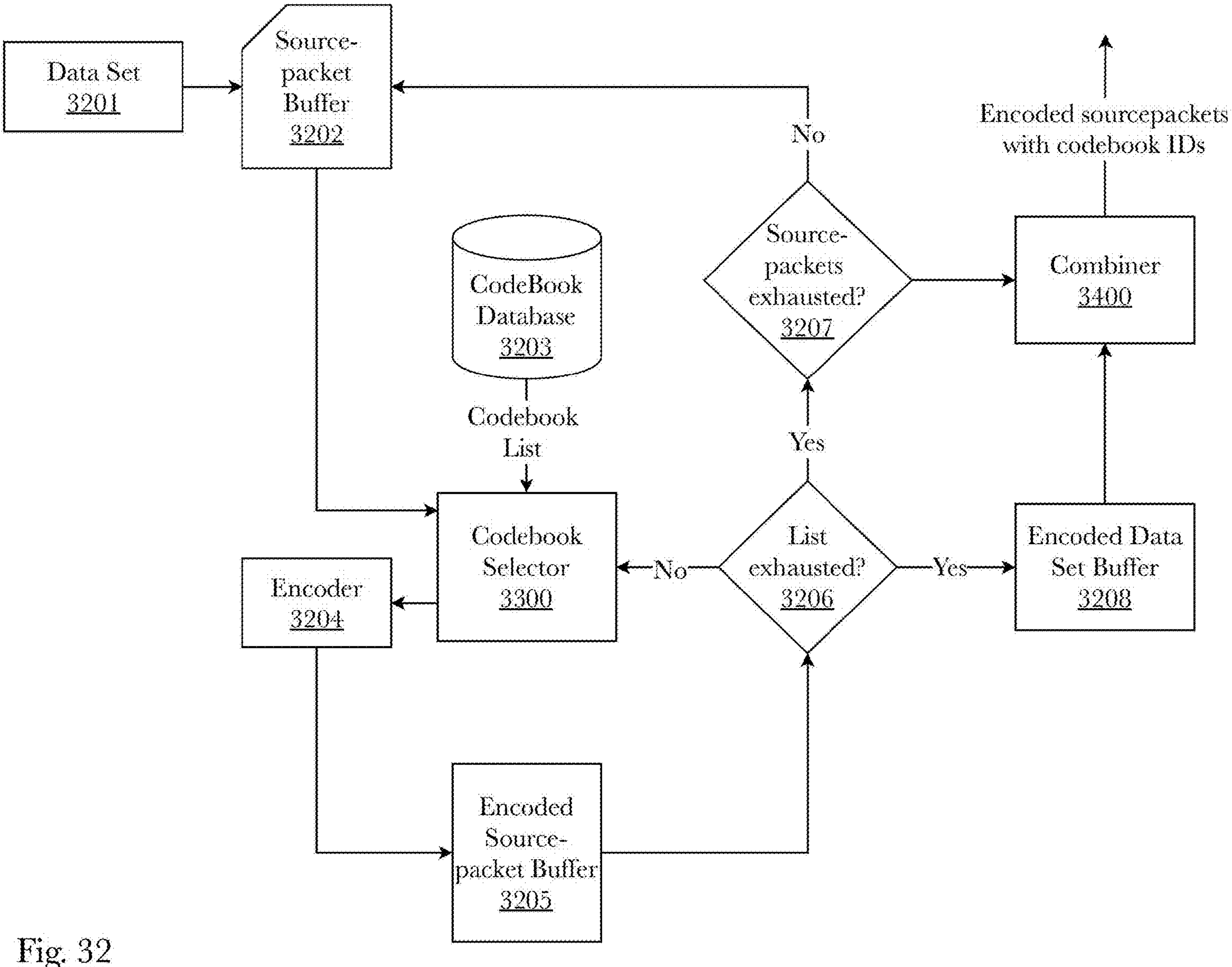
FIG. 32 is an exemplary system architecture for an encoding system with multiple codebooks.

FIG. 32 is an exemplary system architecture for an encoding system with multiple codebooks. A data set to be encoded 3201 is sent to a sourcepacket buffer 3202. The sourcepacket buffer is an array which stores the data which is to be encoded and may contain a plurality of sourcepackets. Each sourcepacket is routed to a codebook selector 3300, which retrieves a list of codebooks from a codebook database 3203. The sourcepacket is encoded using the first codebook on the list via an encoder 3204, and the output is stored in an encoded sourcepacket buffer 3205. The process is repeated with the same sourcepacket using each subsequent codebook on the list until the list of codebooks is exhausted 3206, at which point the most compact encoded version of the sourcepacket is selected from the encoded sourcepacket buffer 3205 and sent to an encoded data set buffer 3208 along with the ID of the codebook used to produce it. The sourcepacket buffer 3202 is determined to be exhausted 3207, a notification is sent to a combiner 3400, which retrieves all of the encoded sourcepackets and codebook IDs from the encoded data set buffer 3208, and combines them into a single file for output.

According to an embodiment, the list of codebooks used in encoding the data set may be consolidated to a single codebook which is provided to the combiner 3400 for output along with the encoded sourcepackets and codebook IDs. In this case, the single codebook will contain the data from, and codebook IDs of, each of the codebooks used to encode the data set. This may provide a reduction in data transfer time, although it is not required since each sourcepacket (or sourceblock) will contain a reference to a specific codebook ID which references a codebook that can be pulled from a database or be sent alongside the encoded data to a receiving device for the decoding process.

In some embodiments, each sourcepacket of a data set 3201 arriving at the encoder 3204 is encoded using a different sourceblock length. Changing the sourceblock length changes the encoding output of a given codebook. Two sourcepackets encoded with the same codebook but using different sourceblock lengths would produce different encoded outputs. Therefore, changing the sourceblock length of some or all sourcepackets in a data set 3201 provides additional security. Even if the codebook was known, the sourceblock length would have to be known or derived for each sourceblock in order to decode the data set 3201. Changing the sourceblock length may be used in conjunction with the use of multiple codebooks.

Figure 33:
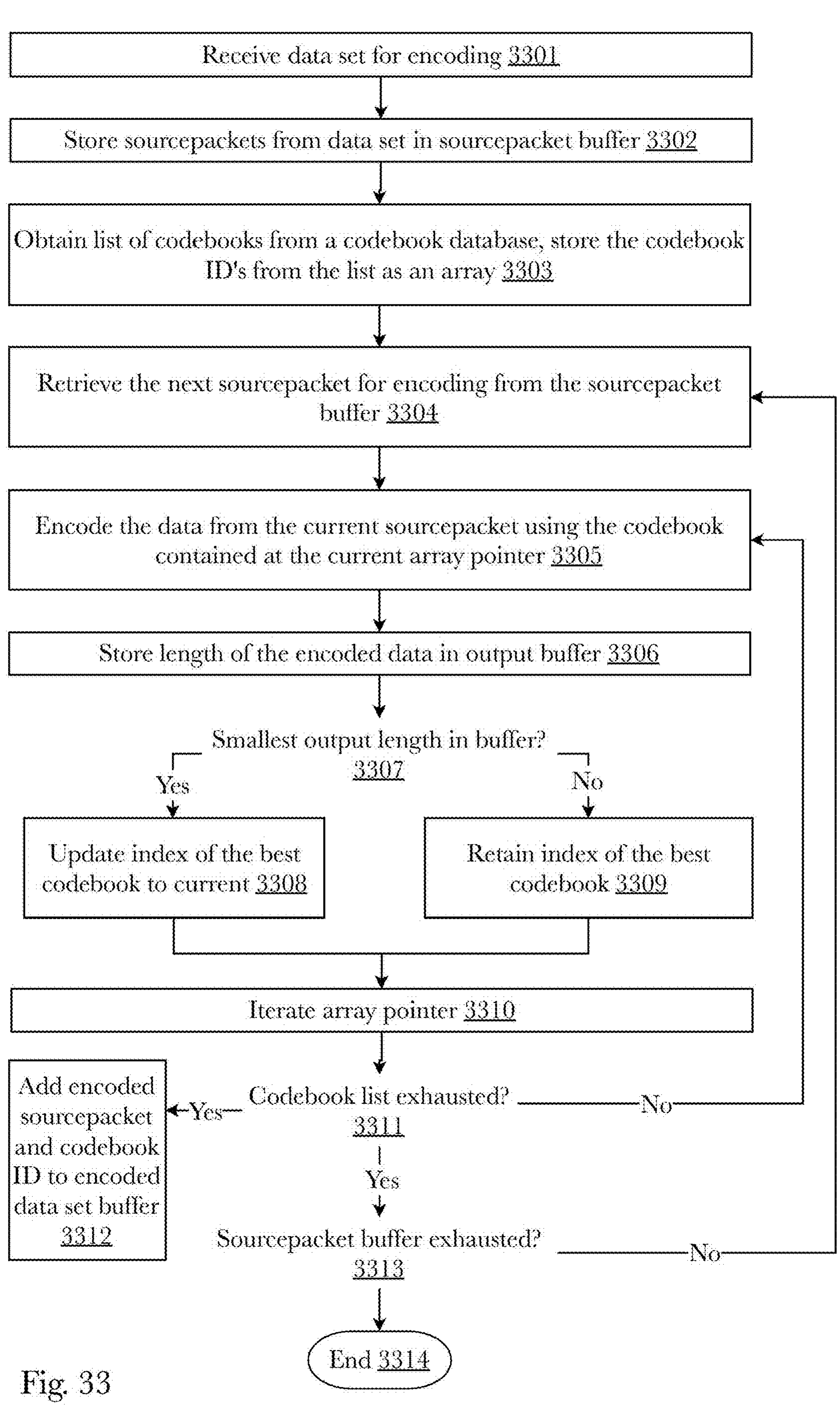
FIG. 33 is a flow diagram describing an exemplary algorithm for encoding of data using multiple codebooks.

FIG. 33 is a flow diagram describing an exemplary algorithm for encoding of data using multiple codebooks. A data set is received for encoding 3301, the data set comprising a plurality of sourcepackets. The sourcepackets are stored in a sourcepacket buffer 3302. A list of codebooks to be used for multiple codebook encoding is retrieved from a codebook database (which may contain more codebooks than are contained in the list) and the codebook IDs for each codebook on the list are stored as an array 3303. The next sourcepacket in the sourcepacket buffer is retrieved from the sourcepacket buffer for encoding 3304. The sourcepacket is encoded using the codebook in the array indicated by a current array pointer 3305. The encoded sourcepacket and length of the encoded sourcepacket is stored in an encoded sourcepacket buffer 3306. If the length of the most recently stored sourcepacket is the shortest in the buffer 3607, an index in the buffer is updated to indicate that the codebook indicated by the current array pointer is the most efficient codebook in the buffer for that sourcepacket. If the length of the most recently stored sourcepacket is not the shortest in the buffer 3607, the index in the buffer is not updated because a previous codebook used to encode that sourcepacket was more efficient 3309. The current array pointer is iterated to select the next codebook in the list 3310. If the list of codebooks has not been exhausted 3311, the process is repeated for the next codebook in the list, starting at step 3305. If the list of codebooks has been exhausted 3311, the encoded sourcepacket in the encoded sourcepacket buffer (the most compact version) and the codebook ID for the codebook that encoded it are added to an encoded data set buffer 3312 for later combination with other encoded sourcepackets from the same data set. At that point, the sourcepacket buffer is checked to see if any sourcepackets remain to be encoded 3313. If the sourcepacket buffer is not exhausted, the next sourcepacket is retrieved 3304 and the process is repeated starting at step 3304. If the sourcepacket buffer is exhausted 3313, the encoding process ends 3314. In some embodiments, rather than storing the encoded sourcepacket itself in the encoded sourcepacket buffer, a universal unique identification (UUID) is assigned to each encoded sourcepacket, and the UUID is stored in the encoded sourcepacket buffer instead of the entire encoded sourcepacket.

Figure 34:
FIG. 34 is a diagram describing an exemplary codebook sorting algorithm for determining a plurality of codebooks to be shuffled between during the encoding process.

FIG. 34 is a diagram showing an exemplary control byte used to combine sourcepackets encoded with multiple codebooks. In this embodiment, a control byte 3401 (i.e., a series of 8 bits) is inserted at the before (or after, depending on the configuration) the encoded sourcepacket with which it is associated, and provides information about the codebook that was used to encode the sourcepacket. In this way, sourcepackets of a data set encoded using multiple codebooks can be combined into a data structure comprising the encoded sourcepackets, each with a control byte that tells the system how the sourcepacket can be decoded. The data structure may be of numerous forms, but in an embodiment, the data structure comprises a continuous series of control bytes followed by the sourcepacket associated with the control byte. In some embodiments, the data structure will comprise a continuous series of control bytes followed by the UUID of the sourcepacket associated with the control byte (and not the encoded sourcepacket, itself). In some embodiments, the data structure may further comprise a UUID inserted to identify the codebook used to encode the sourcepacket, rather than identifying the codebook in the control byte. Note that, while a very short control code (one byte) is used in this example, the control code may be of any length, and may be considerably longer than one byte in cases where the sourceblocks size is large or in cases where a large number of codebooks have been used to encode the sourcepacket or data set.

In this embodiment, for each bit location 3402 of the control byte 3401, a data bit or combinations of data bits 3403 provide information necessary for decoding of the sourcepacket associated with the control byte. Reading in reverse order of bit locations, the first bit N (location 7) indicates whether the entire control byte is used or not. If a single codebook is used to encode all sourcepackets in the data set, N is set to 0, and bits 3 to 0 of the control byte 3401 are ignored. However, where multiple codebooks are used, N is set to 1 and all 8 bits of the control byte 3401 are used. The next three bits RRR (locations 6 to 4) are a residual count of the number of bits that were not used in the last byte of the sourcepacket. Unused bits in the last byte of a sourcepacket can occur depending on the sourceblock size used to encode the sourcepacket. The next bit I (location 3) is used to identify the codebook used to encode the sourcepacket. If bit I is 0, the next three bits CCC (locations 2 to 0) provide the codebook ID used to encode the sourcepacket. The codebook ID may take the form of a codebook cache index, where the codebooks are stored in an enumerated cache. If bit I is 1, then the codebook is identified using a four-byte UUID that follows the control byte.

Figure 35:
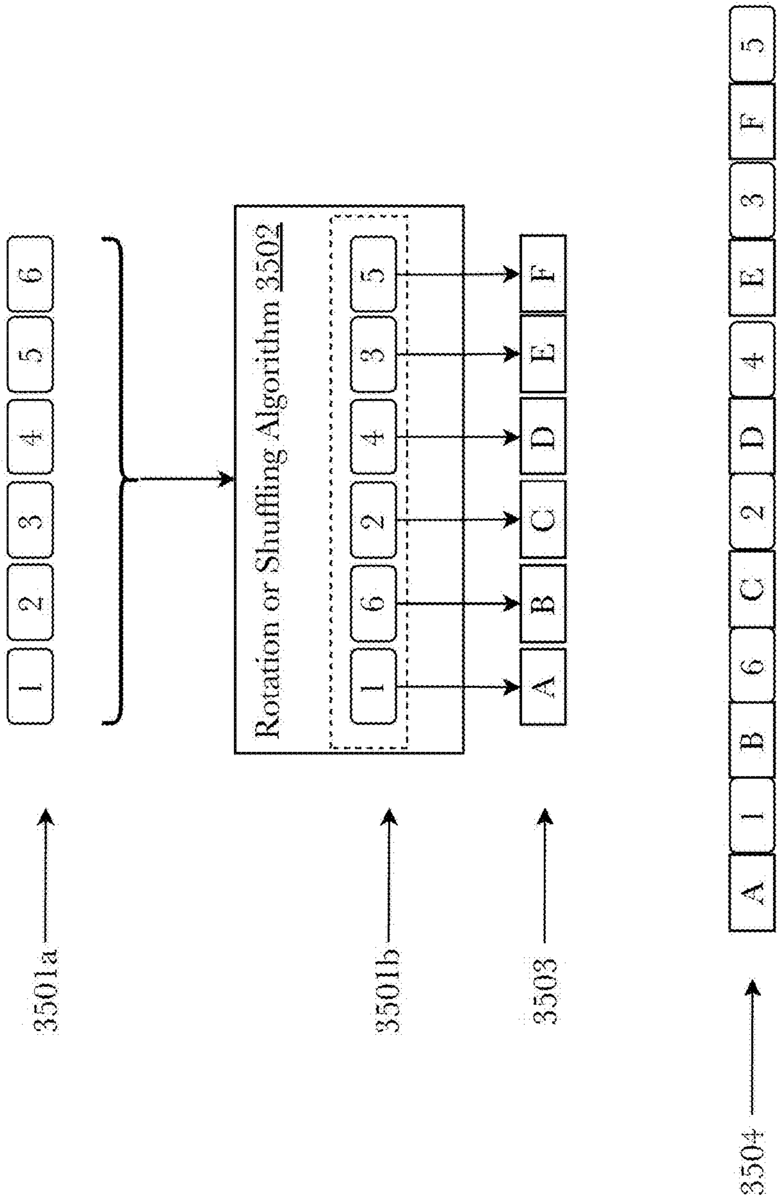
FIG. 35 is a diagram showing an exemplary codebook shuffling method.

FIG. 35 is a diagram showing an exemplary codebook shuffling method. In this embodiment, rather than selecting codebooks for encoding based on their compaction efficiency, codebooks are selected either based on a rotating list or based on a shuffling algorithm. The methodology of this embodiment provides additional security to compacted data, as the data cannot be decoded without knowing the precise sequence of codebooks used to encode any given sourcepacket or data set.

Here, a list of six codebooks is selected for shuffling, each identified by a number from 1 to 6 3501*a*. The list of codebooks is sent to a rotation or shuffling algorithm 3502, and reorganized according to the algorithm 3501*b*. The first six of a series of sourcepackets, each identified by a letter from A to E, 3503 is each encoded by one of the algorithms, in this case A is encoded by codebook 1, B is encoded by codebook 6, C is encoded by codebook 2, D is encoded by codebook 4, E is encoded by codebook 13 A is encoded by codebook 5. The encoded sourcepackets 3503 and their associated codebook identifiers 3501*b* are combined into a data structure 3504 in which each encoded sourcepacket is followed by the identifier of the codebook used to encode that particular sourcepacket.

According to an embodiment, the codebook rotation or shuffling algorithm 3502 may produce a random or pseudo-random selection of codebooks based on a function. Some non-limiting functions that may be used for shuffling include:

1. given a function f(n) which returns a codebook according to an input parameter n in the range 1 to N are, and given t the number of the current sourcepacket or sourceblock: f(t*M modulo p), where M is an arbitrary multiplying factor (1<=M<=p-1) which acts as a key, and p is a large prime number less than or equal to N;
2. f(A^t modulo p), where A is a base relatively prime to p-1 which acts as a key, and p is a large prime number less than or equal to N;
3. f(floor(t*x) modulo N), and x is an irrational number chosen randomly to act as a key;
4. f(t XOR K) where the XOR is performed bit-wise on the binary representations of t and a key K with same number of bits in its representation of N. The function f(n) may return the nth codebook simply by referencing the nth element in a list of codebooks, or it could return the nth codebook given by a formula chosen by a user.

In one embodiment, prior to transmission, the endpoints (users or devices) of a transmission agree in advance about the rotation list or shuffling function to be used, along with any necessary input parameters such as a list order, function code, cryptographic key, or other indicator, depending on the requirements of the type of list or function being used. Once the rotation list or shuffling function is agreed, the endpoints can encode and decode transmissions from one another using the encodings set forth in the current codebook in the rotation or shuffle plus any necessary input parameters.

In some embodiments, the shuffling function may be restricted to permutations within a set of codewords of a given length.

Note that the rotation or shuffling algorithm is not limited to cycling through codebooks in a defined order. In some embodiments, the order may change in each round of encoding. In some embodiments, there may be no restrictions on repetition of the use of codebooks.

In some embodiments, codebooks may be chosen based on some combination of compaction performance and rotation or shuffling. For example, codebook shuffling may be repeatedly applied to each sourcepacket until a codebook is found that meets a minimum level of compaction for that sourcepacket. Thus, codebooks are chosen randomly or pseudo-randomly for each sourcepacket, but only those that produce encodings of the sourcepacket better than a threshold will be used.

Figure 36:
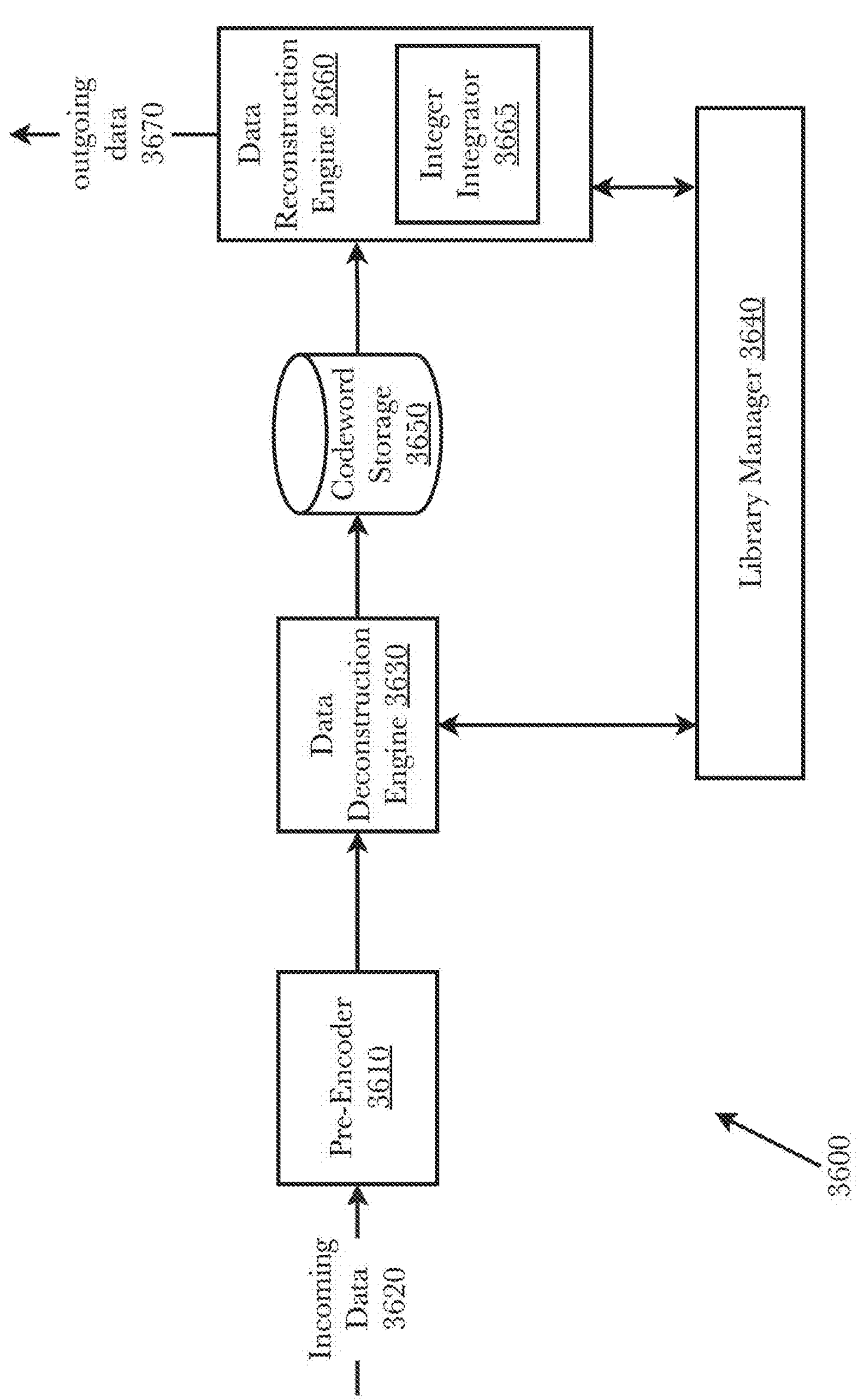
FIG. 36 is a block diagram illustrating an exemplary system architecture for a low-distortion compaction of floating-point numbers, according to an embodiment.

FIG. 36 is a block diagram illustrating an exemplary system 3600 architecture for a low-distortion compaction of floating-point numbers, according to an embodiment. According to an embodiment, the low-distortion compaction system 3600 may comprise a pre-encoder 3610, a data deconstruction engine 3630, a library manager 3640, one or more databases configured for codeword storage 3650, a data reconstruction engine 3660, and a plurality of data 3620 to be compacted and pre-encoded as necessary. A plurality of incoming data 3620 may be received from various sourcepackets, the sourcepackets may include data of a plurality of types. Examples of the types of data that may be included in sourcepackets and processed by low-distortion compaction system 3600 can include, but is not limited to: qualitative data such as nominal and/or ordinal data; quantitative data such as discrete and/or continuous data; structured information (e.g., spreadsheet data, searchable data, scientific or engineering related data, quantitative data, pre-defined format, etc.); and unstructured information (e.g., image, video, and/or voice data, log files, sensor or social media posts, etc.). The disclosed system 3600 and its various components may be configured to process all or some of the above described data types, according to an aspect.

According to an embodiment, as system 3600 receives an incoming data sourcepacket 3620 it may be first processed by a pre-encoder 3610 which may be configured to encode floating point numbers in a way that maximizes the benefit of data compaction as carried out by components deconstruction engine 3630 and library manager 3640. Pre-encoder 3610 may be configured to analyze incoming data 3620 to identify any floating point numbers contained within the incoming data 3620. Pre-encoder 3610 may be configured to pre-encode the identified floating point numbers with a binary string representation and then replace the floating point numbers in the sourcepacket with the encoded binary string representation. For a more detailed description of pre-encoder 3610, please refer to FIG. 37. According to some embodiments, binary string representations of floating point numbers that replace the floating point numbers in the sourcepacket may be indexed in such a way that library manager 3640 is able to distinguish between received sourceblocks that are associated with binary string representations of floating point numbers and sourceblocks that are not associated with floating point numbers. Pre-encoder 3610 can forward the processed and pre-encoded sourcepacket to data deconstruction engine 3630 which performs data deconstruction functions as described in more detail in FIG. 38 before sending the deconstructed data to library manager 3640 which receives deconstructed sourcepackets information in the form of sourceblocks and assigns a reference code to each of the received sourcepackets. In addition to assigning a reference code, when library manager 3640 receives a sourceblock representing a binary string encoding of a floating point number it may also include (e.g., logically link) the index that indicates the sourceblock is a binary string with the generated reference code in one or more libraries 105, 106 where it may be persisted for further use.

Data deconstruction engine 3630 may receive, from library manager 3640, references codes associated with processed sourceblocks and process the reference codes into codewords before sending the codewords to codeword storage 3650. Data reconstruction engine 3660 may receive a data retrieval request and/or transmitted data and obtain the codeword associated with the data form codeword storage 3650, and sends them to library manager 3640. Library manager 3640 returns the appropriate sourceblocks to data reconstruction engine 3660, which assembles them into the proper order and sends out the data in its original form 3670.

According to some embodiments, data reconstruction engine 3660 may comprise a fixed point integrator 3665 which may be configured to process a decoded binary string representation of floating point number back into its original floating point form. For example, pre-encoder 3610 may be configured to generate the binary string representation of a floating point number via a fixed point representation method, wherein the binary string representation is a binary integer which is understood by encoding/decoding system (i.e., deconstruction engine 3630, library manager 3640, and reconstruction engine 3660) via the logically linked indices, to be divided by integer integrator 3665 by a fixed power of two when it represents a real number. Fixed-point refers to a method of representing floating-point numbers by storing a fixed number of digits of their fractional part. Dollar amounts, for example, are often stored with exactly two fractional digits, representing the cents (1/100 of a dollar). More generally, the term may refer to representing fractional values (e.g., floats) as integer multiples of some fixed small unit (e.g., a fractional amount of hours as an integer multiple of ten-minute intervals. Pre-encoding floating point numbers into a fixed point representation can significantly reduce the complicated and computationally demanding processes required with floating-point functions. In this way, system 3600 can provide low-distortion compaction, storage, transmission, and decompaction of floating point numbers.

For a more detailed description of data reconstruction engine 3630, data reconstruction engine 3660, and library manager 3540, please refer to FIG. 2, FIG. 3, and FIG. 4 respectively.

According to various embodiments, low-distortion compaction system 3600 may be configured to process floating-point numbers across a broad range of formats in accordance with IEEE standards including, but not necessarily limited to, half precision, single precision, and double precision.

Figure 37:
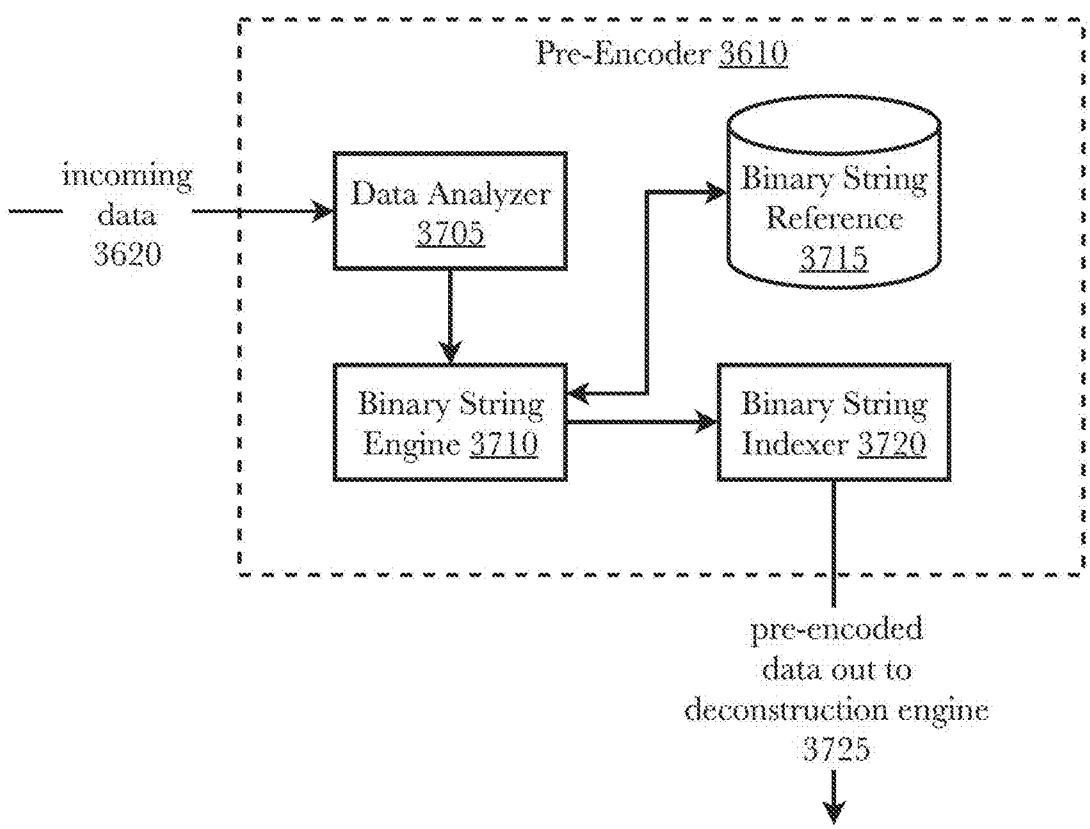
FIG. 37 is a block diagram illustrating an exemplary architecture for an aspect of a system for low-distortion compaction of floating point numbers, the pre-encoder.

FIG. 37 is a block diagram illustrating an exemplary architecture for an aspect of a system for low-distortion compaction of floating point numbers 3600, the pre-encoder 3610. According to an embodiment, pre-encoder 3610 may comprise a data analyzer 3705, a binary string engine 3710, a binary string indexer 3720, and optionally, a binary string reference 3715 cache. Incoming data 3620 in the form of sourcepackets may be received, retrieved, or otherwise obtained by pre-encoder 3610 and initially processed by data analyzer 3705. Data analyzer 3705 may be configured to scan a plurality of data as it is received in order to identify any real numbers, especially floating point numbers, which may be contained within the received data sourcepacket. Binary string engine 3710 may be configured to process identified floating-point numbers in the sourcepacket by pre-encoding any floating point numbers X with a binary string representation f(X) such that if X and Y are close in value as real numbers, then f(X) and f(Y) are close as binary string representations (e.g., the strings differ by only a few bits). Via this process, binary string f is a low-distortion embedding of real numbers into Hamming space. This is considered low distortion because the metric for real numbers (e.g., absolute value) is similar to the metric for binary strings (i.e., Hamming distance which represents the number of bits in which the two strings differ), at least for small values. Hamming distance as a metric is useful as it lends itself to error detection and error correction tasks and actions. In an embodiment, binary string engine 3710 may be configured to generate binary string representations using a fixed-point representation. Binary string indexer 3720 may be configured to replace floating-point numbers in the incoming sourcepacket 3620 with their encoded binary string representations generated by binary string engine 3710 at the same location in the sourcepacket that the floating-point numbers were originally located. This is an important step as keeping the data in the correct order reduces errors during both the encoding process as carried out by data deconstruction engine 3630 and decoding process as carried out by data reconstruction engine 3660. Additionally, binary string indexer 3720 may be further configured to index each pre-encoded binary string representation of a floating-point number in such a way that when a pre-encoded binary string representation is encountered by the encoding/decoding components of system 3600 it may be identified as representing a floating-point number. This index may be logically linked to the binary string representation. In an embodiment, the index may be represented as a single bit wherein the presence of the bit and its value (0 or 1) indicate that the binary string represents a floating-point number. In an embodiment, the index bit may be appended to the beginning of a binary string representation. In an embodiment, the index bit may be appended to the end of a binary string representation. After pre-encoder 3610 has encoded any floats contained within incoming data 3620 and indexed the binary string representations of the floats, it may send the pre-encoded sourcepacket to data deconstruction engine 3725 wherein the pre-encoded data may be compacted as described above.

According to some embodiments, pre-encoder 3610 may optionally comprise a binary string reference cache 3715 which may be a database configured to store a plurality of binary string representations and the real numbers associated with each binary string as the binary string engine 3710 generates the binary string representations. Inclusion of binary string reference 3715 cache may improve the speed and performance of binary sting engine 3710 when binary string engine 3710 encounters floating-point numbers that have already been assigned a binary string representation. In this scenario, when binary string engine 3710 first receives an identified floating point number, it may search binary string reference cache 3715 for the floating-point number and retrieve the associated binary string representation. In this way, binary string engine 3710 may process a sourcepacket and the real numbers contained therein in a more efficient manner.

Figure 38:
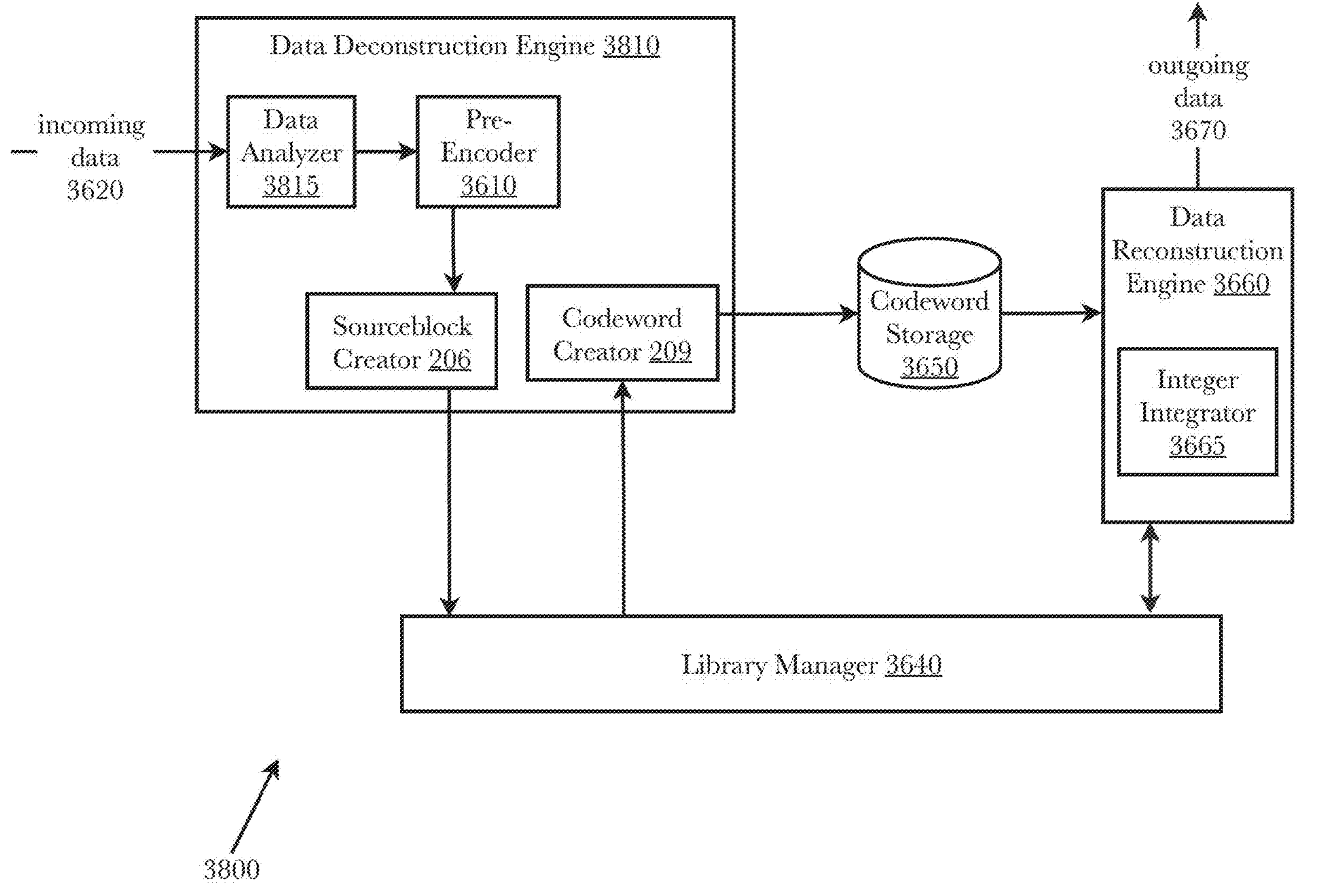
FIG. 38 is a block diagram illustrating an embodiment of a system for low-distortion compaction of floating-point numbers wherein a pre-encoder is included as a component of a data deconstruction engine.

FIG. 38 is a block diagram illustrating an embodiment of a system for low-distortion compaction of floating-point numbers 3800 wherein a pre-encoder 3610 is included as a component of a data deconstruction engine 3810. According to various embodiments, pre-encoder 3610 may be configured to operate as a component of the data deconstruction engine 3810. In this embodiment, incoming data 3620 in the form of a sourcepacket is received by the data analyzer 3815 of data deconstruction engine 3810. Data analyzer may be configured to scan incoming data 3620 for real numbers, especially floating-point numbers. Identified floating-point numbers may be sent to pre-encoder 3610 where they may be pre-encoded into binary string representations and indexed, before being sent to sourceblock creator 206. Sourceblock creator 206 sends sourceblocks to library manager 3640 which returns a reference code to codeword creator 209 which creates a codeword for the received reference code before storing the reference code and the codeword as a codeword pair in codeword storage 3650. Data reconstruction engine 3660 may receive a data retrieval request or a data transmission and send reference codes to library manager 3640 which returns the appropriate sourceblock to data reconstruction engine 3660. Sourceblocks associated with binary string representations of floating-point numbers may be identified using a logically linked index associated with the sourceblock and integer integrator 3665 may perform one or more arithmetic operations to transform the binary string representation into the original floating-point number it represented. After all data has been decoded and reconstructed it is restored to its original format as outgoing data 3670.

Detailed Description of Exemplary Aspects

Since the library consists of re-usable building sourceblocks, and the actual data is represented by reference codes to the library, the total storage space of a single set of data would be much smaller than conventional methods, wherein the data is stored in its entirety. The more data sets that are stored, the larger the library becomes, and the more data can be stored in reference code form.

As an analogy, imagine each data set as a collection of printed books that are only occasionally accessed. The amount of physical shelf space required to store many collections would be quite large, and is analogous to conventional methods of storing every single bit of data in every data set. Consider, however, storing all common elements within and across books in a single library, and storing the books as references codes to those common elements in that library. As a single book is added to the library, it will contain many repetitions of words and phrases. Instead of storing the whole words and phrases, they are added to a library, and given a reference code, and stored as reference codes. At this scale, some space savings may be achieved, but the reference codes will be on the order of the same size as the words themselves. As more books are added to the library, larger phrases, quotations, and other words patterns will become common among the books. The larger the word patterns, the smaller the reference codes will be in relation to them as not all possible word patterns will be used. As entire collections of books are added to the library, sentences, paragraphs, pages, or even whole books will become repetitive. There may be many duplicates of books within a collection and across multiple collections, many references and quotations from one book to another, and much common phraseology within books on particular subjects. If each unique page of a book is stored only once in a common library and given a reference code, then a book of 1,000 pages or more could be stored on a few printed pages as a string of codes referencing the proper full-sized pages in the common library. The physical space taken up by the books would be dramatically reduced. The more collections that are added, the greater the likelihood that phrases, paragraphs, pages, or entire books will already be in the library, and the more information in each collection of books can be stored in reference form. Accessing entire collections of books is then limited not by physical shelf space, but by the ability to reprint and recycle the books as needed for use.

The projected increase in storage capacity using the method herein described is primarily dependent on two factors: 1) the ratio of the number of bits in a block to the number of bits in the reference code, and 2) the amount of repetition in data being stored by the system.

With respect to the first factor, the number of bits used in the reference codes to the sourceblocks must be smaller than the number of bits in the sourceblocks themselves in order for any additional data storage capacity to be obtained. As a simple example, 16-bit sourceblocks would require 216, or 65536, unique reference codes to represent all possible patterns of bits. If all possible 65536 blocks patterns are utilized, then the reference code itself would also need to contain sixteen bits in order to refer to all possible 65,536 blocks patterns. In such case, there would be no storage savings. However, if only 16 of those block patterns are utilized, the reference code can be reduced to 4 bits in size, representing an effective compression of 4 times (16 bits/4 bits=4) versus conventional storage. Using a typical block size of 512 bytes, or 4,096 bits, the number of possible block patterns is 24,096, which for all practical purposes is unlimited. A typical hard drive contains one terabyte (TB) of physical storage capacity, which represents 1,953,125,000, or roughly 231, 512 byte blocks. Assuming that 1 TB of unique 512-byte sourceblocks were contained in the library, and that the reference code would thus need to be 31 bits long, the effective compression ratio for stored data would be on the order of 132 times (4,096/31≈132) that of conventional storage.

With respect to the second factor, in most cases it could be assumed that there would be sufficient repetition within a data set such that, when the data set is broken down into sourceblocks, its size within the library would be smaller than the original data. However, it is conceivable that the initial copy of a data set could require somewhat more storage space than the data stored in a conventional manner, if all or nearly all sourceblocks in that set were unique. For example, assuming that the reference codes are 1/10th the size of a full-sized copy, the first copy stored as sourceblocks in the library would need to be 1.1 megabytes (MB), (1 MB for the complete set of full-sized sourceblocks in the library and 0.1 MB for the reference codes). However, since the sourceblocks stored in the library are universal, the more duplicate copies of something you save, the greater efficiency versus conventional storage methods. Conventionally, storing 10 copies of the same data requires 10 times the storage space of a single copy. For example, ten copies of a 1 MB file would take up 10 MB of storage space. However, using the method described herein, only a single full-sized copy is stored, and subsequent copies are stored as reference codes. Each additional copy takes up only a fraction of the space of the full-sized copy. For example, again assuming that the reference codes are 1/10th the size of the full-size copy, ten copies of a 1 MB file would take up only 2 MB of space (1 MB for the full-sized copy, and 0.1 MB each for ten sets of reference codes). The larger the library, the more likely that part or all of incoming data will duplicate sourceblocks already existing in the library.

The size of the library could be reduced in a manner similar to storage of data. Where sourceblocks differ from each other only by a certain number of bits, instead of storing a new sourceblock that is very similar to one already existing in the library, the new sourceblock could be represented as a reference code to the existing sourceblock, plus information about which bits in the new block differ from the existing block. For example, in the case where 512 byte sourceblocks are being used, if the system receives a new sourceblock that differs by only one bit from a sourceblock already existing in the library, instead of storing a new 512 byte sourceblock, the new sourceblock could be stored as a reference code to the existing sourceblock, plus a reference to the bit that differs. Storing the new sourceblock as a reference code plus changes would require only a few bytes of physical storage space versus the 512 bytes that a full sourceblock would require. The algorithm could be optimized to store new sourceblocks in this reference code plus changes form unless the changes portion is large enough that it is more efficient to store a new, full sourceblock.

It will be understood by one skilled in the art that transfer and synchronization of data would be increased to the same extent as for storage. By transferring or synchronizing reference codes instead of full-sized data, the bandwidth requirements for both types of operations are dramatically reduced.

In addition, the method described herein is inherently a form of encryption. When the data is converted from its full form to reference codes, none of the original data is contained in the reference codes. Without access to the library of sourceblocks, it would be impossible to re-construct any portion of the data from the reference codes. This inherent property of the method described herein could obviate the need for traditional encryption algorithms, thereby offsetting most or all of the computational cost of conversion of data back and forth to reference codes. In theory, the method described herein should not utilize any additional computing power beyond traditional storage using encryption algorithms. Alternatively, the method described herein could be in addition to other encryption algorithms to increase data security even further.

In other embodiments, additional security features could be added, such as: creating a proprietary library of sourceblocks for proprietary networks, physical separation of the reference codes from the library of sourceblocks, storage of the library of sourceblocks on a removable device to enable easy physical separation of the library and reference codes from any network, and incorporation of proprietary sequences of how sourceblocks are read and the data reassembled.

Figure 7:
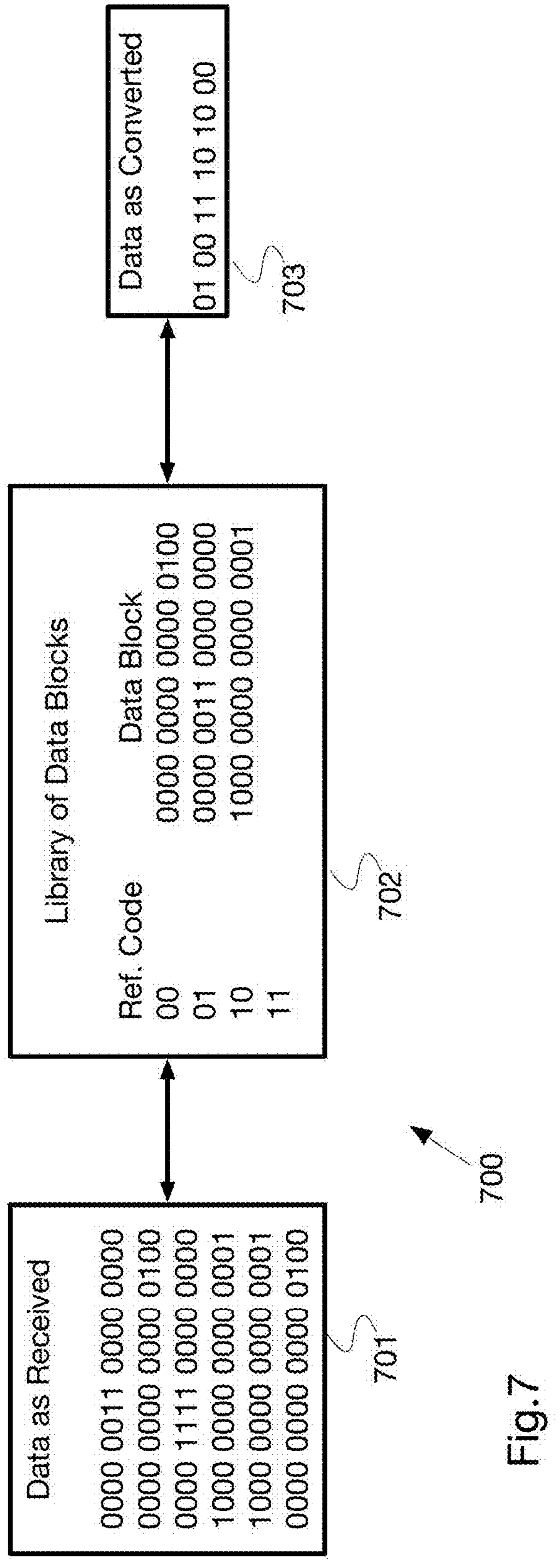
FIG. 7 is a diagram showing an example of how data might be converted into reference codes using an aspect of an embodiment.
Figure 8:
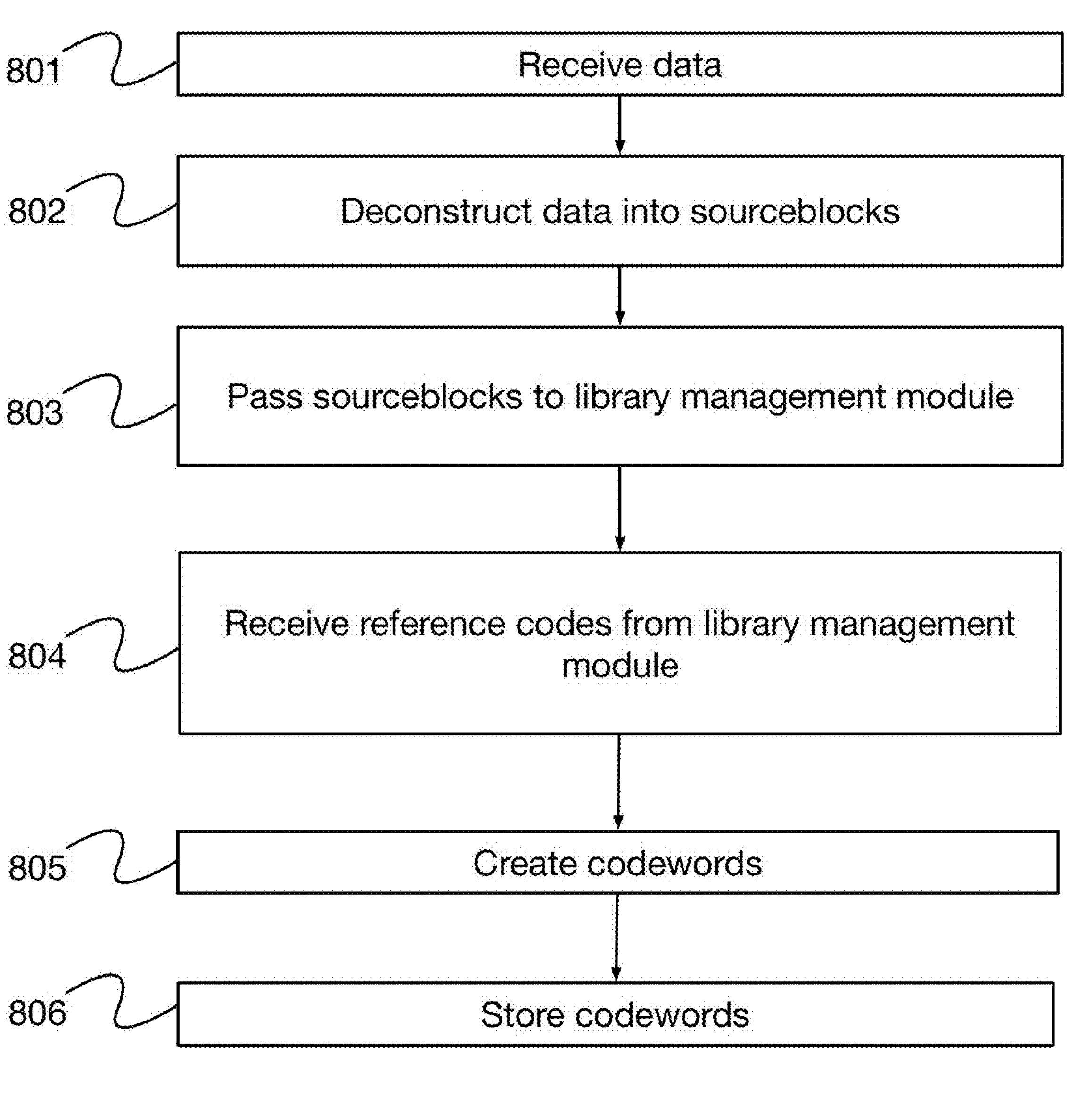
FIG. 8 is a method diagram showing the steps involved in using an embodiment to store data.
Figure 9:
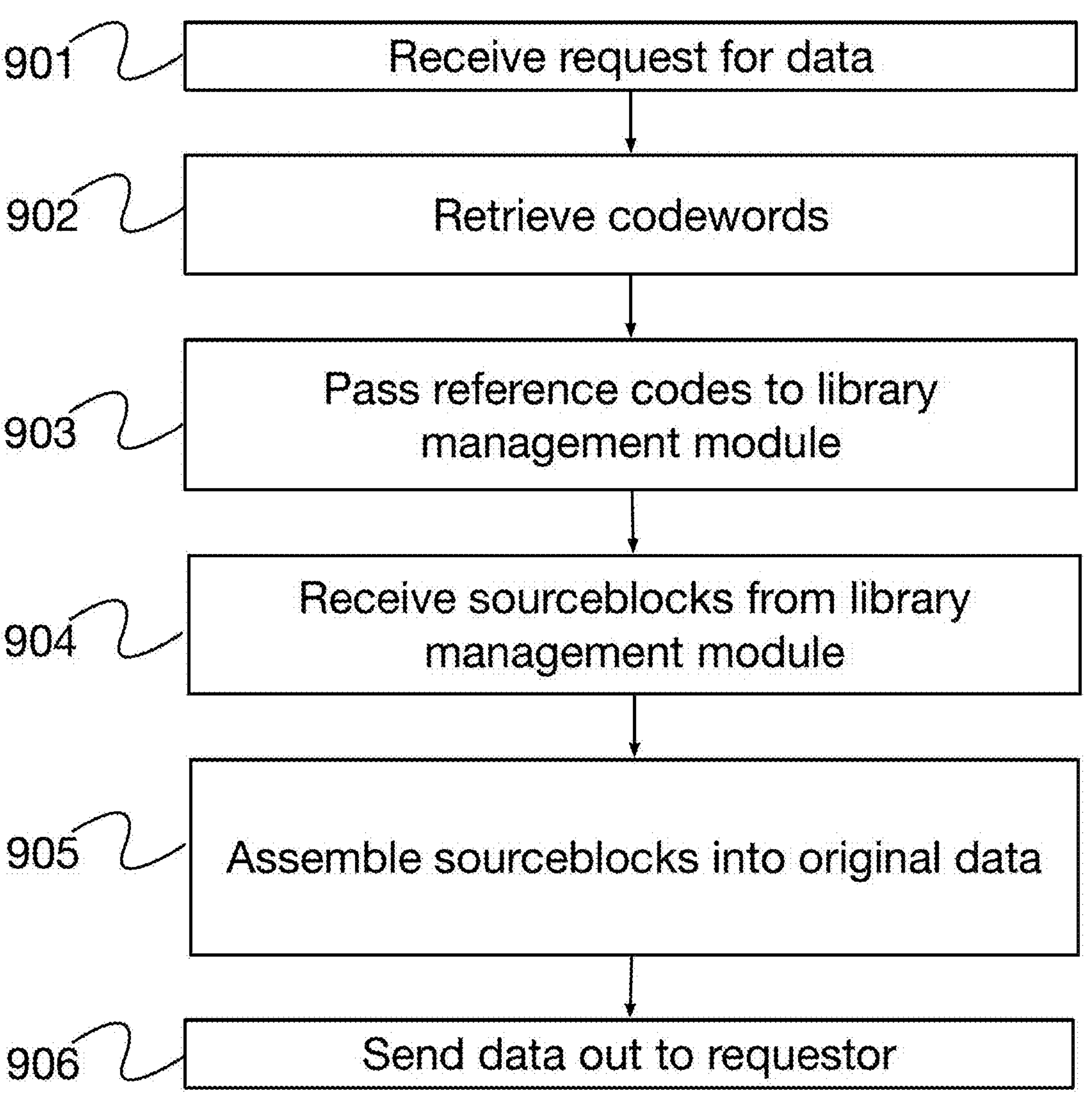
FIG. 9 is a method diagram showing the steps involved in using an embodiment to retrieve data.
Figure 9:

FIG. 7 is a diagram showing an example of how data might be converted into reference codes using an aspect of an embodiment 700. As data is received 701, it is read by the processor in sourceblocks of a size dynamically determined by the previously disclosed sourceblock size optimizer 410. In this example, each sourceblock is 16 bits in length, and the library 702 initially contains three sourceblocks with reference codes 00, 01, and 10. The entry for reference code 11 is initially empty. As each 16 bit sourceblock is received, it is compared with the library. If that sourceblock is already contained in the library, it is assigned the corresponding reference code. So, for example, as the first line of data (0000 0011 0000 0000) is received, it is assigned the reference code (01) associated with that sourceblock in the library. If that sourceblock is not already contained in the library, as is the case with the third line of data (0000 1111 0000 0000) received in the example, that sourceblock is added to the library and assigned a reference code, in this case 11. The data is thus converted 703 to a series of reference codes to sourceblocks in the library. The data is stored as a collection of codewords, each of which contains the reference code to a sourceblock and information about the location of the sourceblocks in the data set. Reconstructing the data is performed by reversing the process. Each stored reference code in a data collection is compared with the reference codes in the library, the corresponding sourceblock is read from the library, and the data is reconstructed into its original form. FIG. 8 is a method diagram showing the steps involved in using an embodiment 800 to store data. As data is received 801, it would be deconstructed into sourceblocks 802, and passed 803 to the library management module for processing. Reference codes would be received back 804 from the library management module, and could be combined with location information to create codewords 805, which would then be stored 806 as representations of the original data. FIG. 9 is a method diagram showing the steps involved in using an embodiment 900 to retrieve data. When a request for data is received 901, the associated codewords would be retrieved 902 from the library. The codewords would be passed 903 to the library management module, and the associated sourceblocks would be received back 904. Upon receipt, the sourceblocks would be assembled 905 into the original data using the location data contained in the codewords, and the reconstructed data would be sent out 906 to the requestor.

Figure 10:
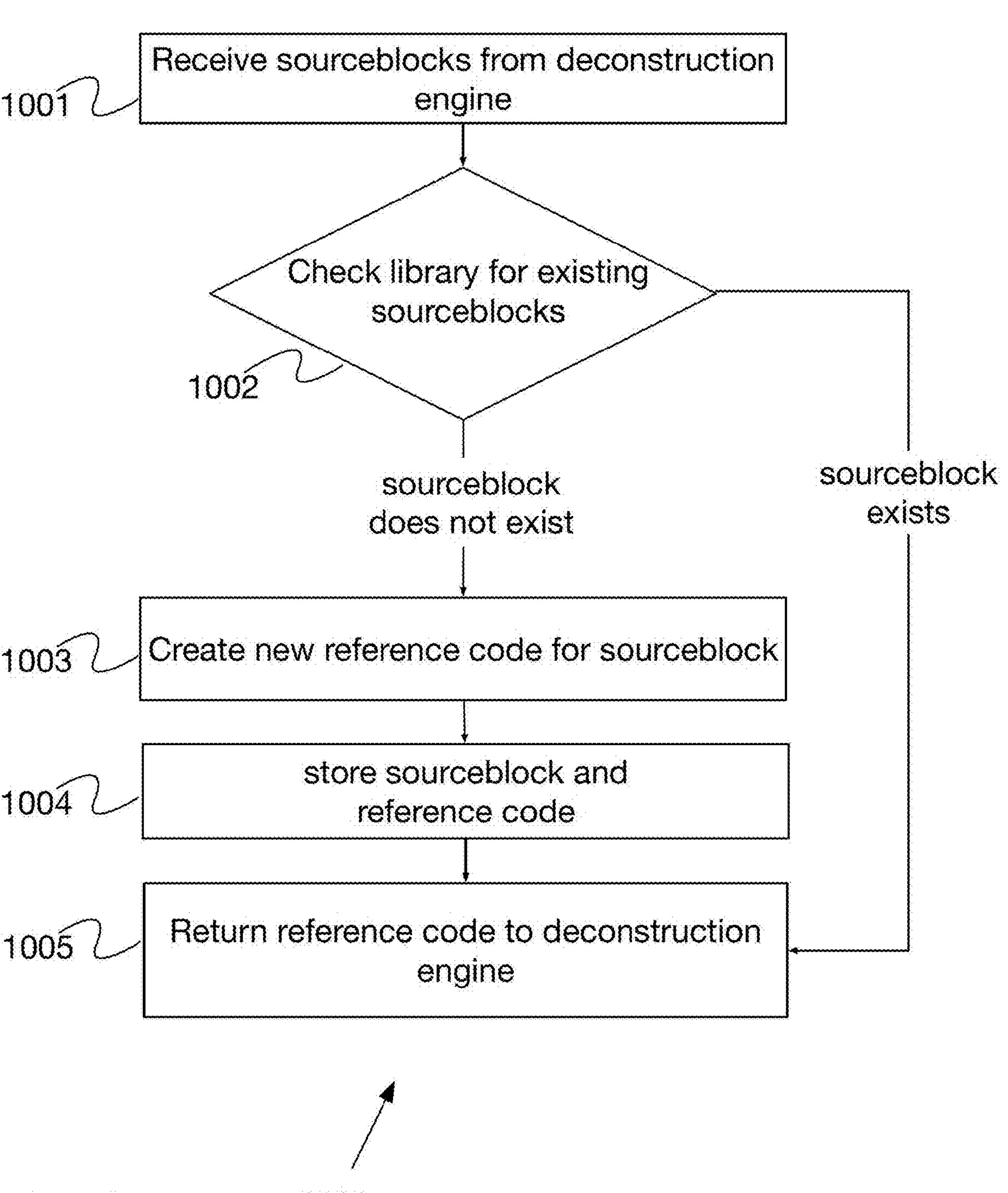
FIG. 10 is a method diagram showing the steps involved in using an embodiment to encode data.

FIG. 10 is a method diagram showing the steps involved in using an embodiment 1000 to encode data. As sourceblocks are received 1001 from the deconstruction engine, they would be compared 1002 with the sourceblocks already contained in the library. If that sourceblock already exists in the library, the associated reference code would be returned 1005 to the deconstruction engine. If the sourceblock does not already exist in the library, a new reference code would be created 1003 for the sourceblock. The new reference code and its associated sourceblock would be stored 1004 in the library, and the reference code would be returned to the deconstruction engine.

Figure 11:
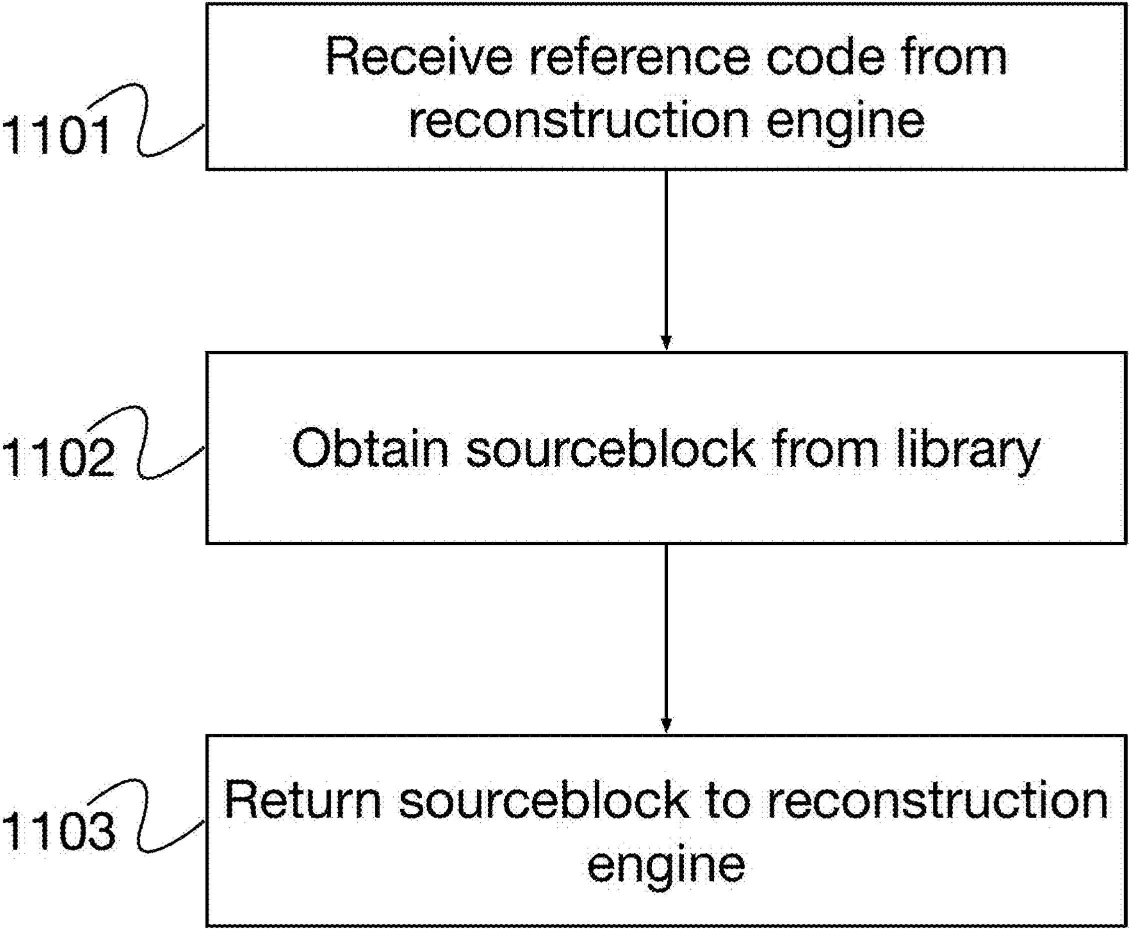
FIG. 11 is a method diagram showing the steps involved in using an embodiment to decode data.

FIG. 11 is a method diagram showing the steps involved in using an embodiment 1100 to decode data. As reference codes are received 1101 from the reconstruction engine, the associated sourceblocks are retrieved 1102 from the library, and returned 1103 to the reconstruction engine.

Figure 16:
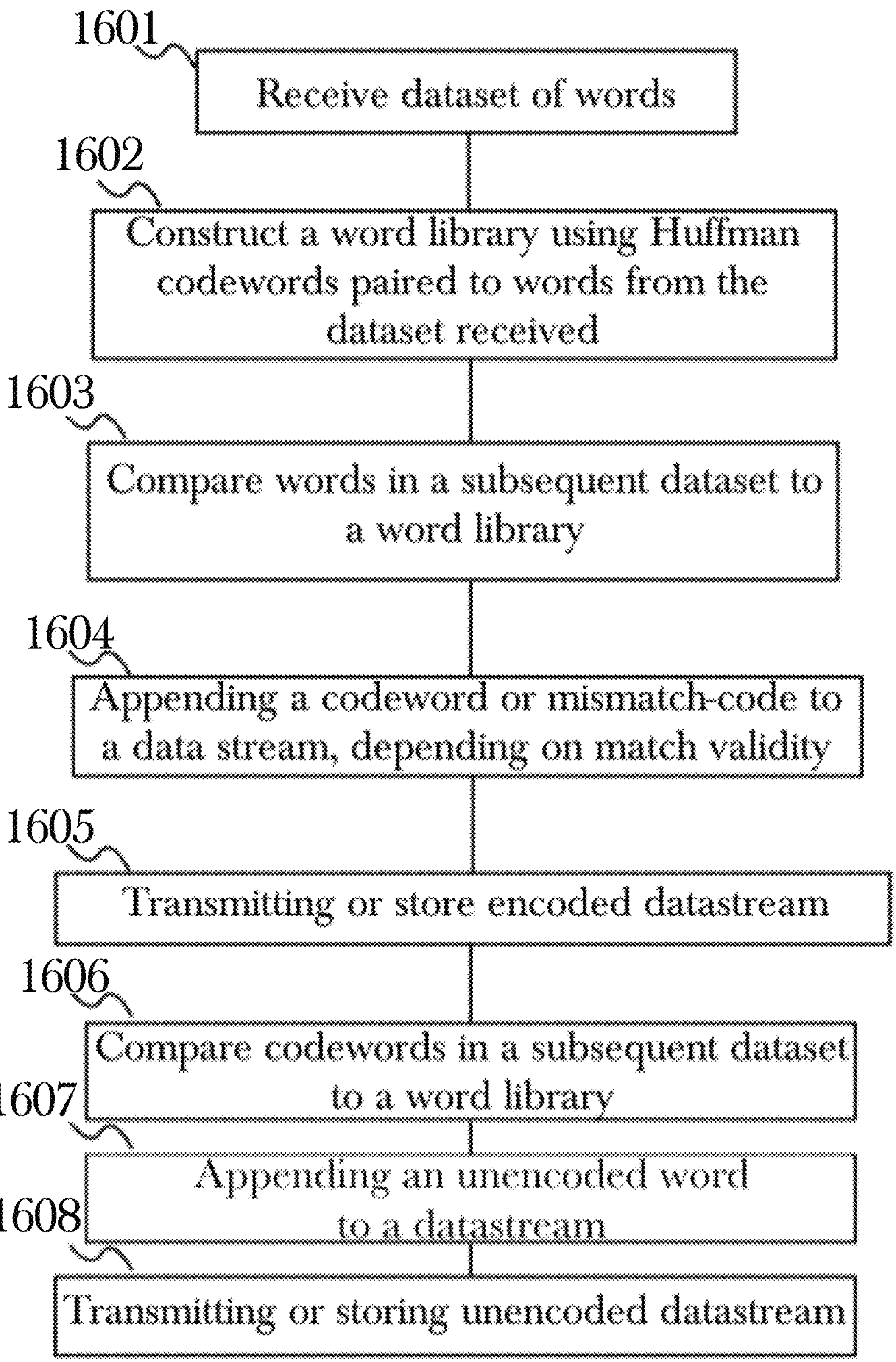
FIG. 16 is a method diagram illustrating key system functionality utilizing an encoder and decoder pair.

FIG. 16 is a method diagram illustrating key system functionality utilizing an encoder and decoder pair, according to a preferred embodiment. In a first step 1601, at least one incoming data set may be received at a customized library generator 1300 that then 1602 processes data to produce a customized word library 1201 comprising key-value pairs of data words (each comprising a string of bits) and their corresponding calculated binary Huffman codewords. A subsequent dataset may be received, and compared to the word library 1603 to determine the proper codewords to use in order to encode the dataset. Words in the dataset are checked against the word library and appropriate encodings are appended to a data stream 1604. If a word is mismatched within the word library and the dataset, meaning that it is present in the dataset but not the word library, then a mismatched code is appended, followed by the unencoded original word. If a word has a match within the word library, then the appropriate codeword in the word library is appended to the data stream. Such a data stream may then be stored or transmitted 1605 to a destination as desired. For the purposes of decoding, an already-encoded data stream may be received and compared 1606, and un-encoded words may be appended to a new data stream 1607 depending on word matches found between the encoded data stream and the word library that is present. A matching codeword that is found in a word library is replaced with the matching word and appended to a data stream, and a mismatch code found in a data stream is deleted and the following unencoded word is re-appended to a new data stream, the inverse of the process of encoding described earlier. Such a data stream may then be stored or transmitted 1608 as desired.

Figure 17:
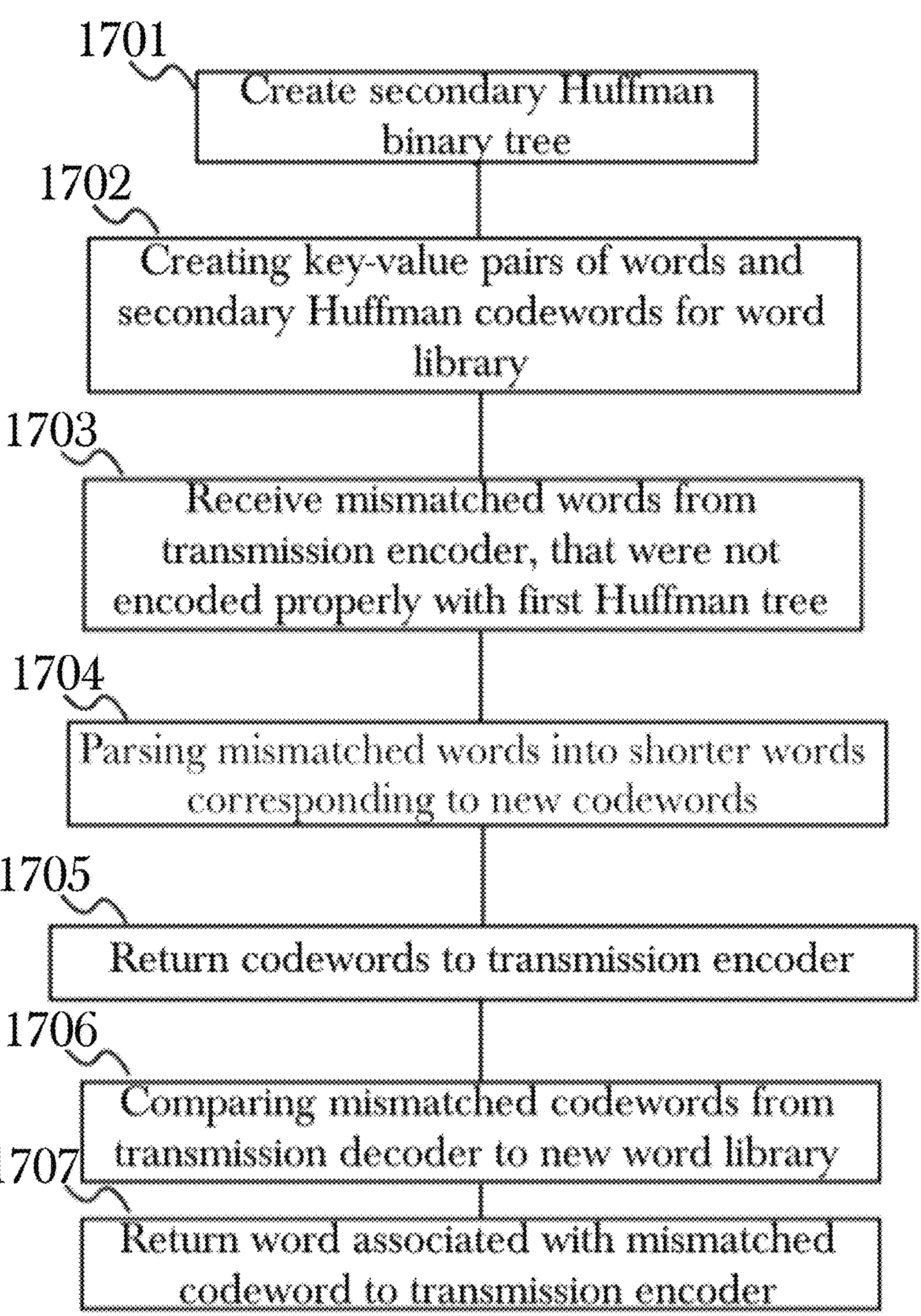
FIG. 17 is a method diagram illustrating possible use of a hybrid encoder/decoder to improve the compression ratio.

FIG. 17 is a method diagram illustrating possible use of a hybrid encoder/decoder to improve the compression ratio, according to a preferred aspect. A second Huffman binary tree may be created 1701, having a shorter maximum length of codewords than a first Huffman binary tree 1602, allowing a word library to be filled with every combination of codeword possible in this shorter Huffman binary tree 1702. A word library may be filled with these Huffman codewords and words from a dataset 1702, such that a hybrid encoder/decoder 1304, 1503 may receive any mismatched words from a dataset for which encoding has been attempted with a first Huffman binary tree 1703, 1604 and parse previously mismatched words into new partial codewords (that is, codewords that are each a substring of an original mismatched codeword) using the second Huffman binary tree 1704. In this way, an incomplete word library may be supplemented by a second word library. New codewords attained in this way may then be returned to a transmission encoder 1705, 1500. In the event that an encoded dataset is received for decoding, and there is a mismatch code indicating that additional coding is needed, a mismatch code may be removed and the unencoded word used to generate a new codeword as before 1706, so that a transmission encoder 1500 may have the word and newly generated codeword added to its word library 1707, to prevent further mismatching and errors in encoding and decoding.

It will be recognized by a person skilled in the art that the methods described herein can be applied to data in any form. For example, the method described herein could be used to store genetic data, which has four data units: C, G, A, and T. Those four data units can be represented as 2 bit sequences: 00, 01, 10, and 11, which can be processed and stored using the method described herein.

It will be recognized by a person skilled in the art that certain embodiments of the methods described herein may have uses other than data storage. For example, because the data is stored in reference code form, it cannot be reconstructed without the availability of the library of sourceblocks. This is effectively a form of encryption, which could be used for cyber security purposes. As another example, an embodiment of the method described herein could be used to store backup copies of data, provide for redundancy in the event of server failure, or provide additional security against cyberattacks by distributing multiple partial copies of the library among computers are various locations, ensuring that at least two copies of each sourceblock exist in different locations within the network.

Figure 18:
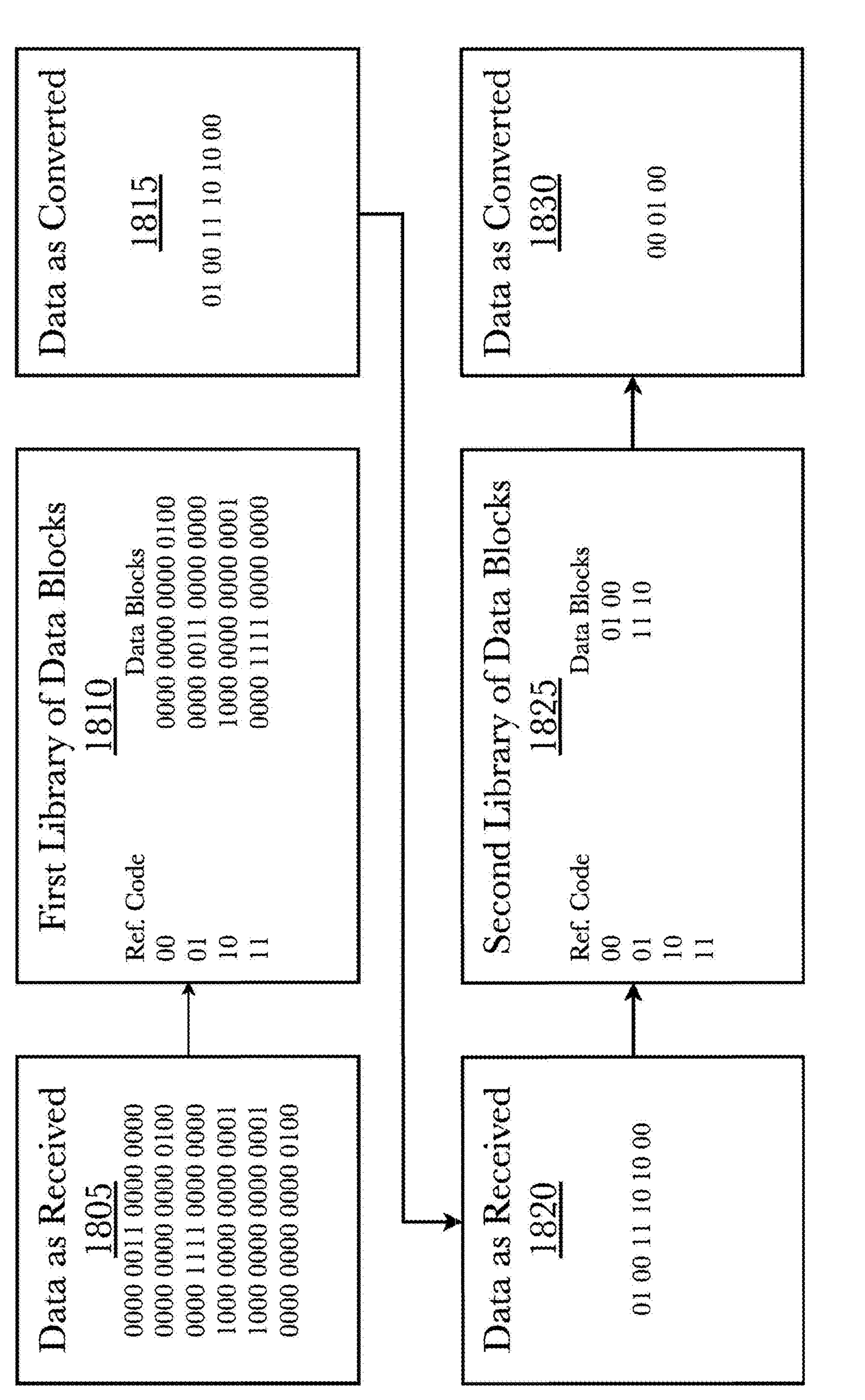
FIG. 18 is a flow diagram illustrating the use of a data encoding system used to recursively encode data to further reduce data size.

FIG. 18 is a flow diagram illustrating the use of a data encoding system used to recursively encode data to further reduce data size. Data may be input 1805 into a data deconstruction engine 102 to be deconstructed into code references, using a library of code references based on the input 1810. Such example data is shown in a converted, encoded format 1815, highly compressed, reducing the example data from 96 bits of data, to 12 bits of data, before sending this newly encoded data through the process again 1820, to be encoded by a second library 1825, reducing it even further. The newly converted data 1830 is shown as only 6 bits in this example, thus a size of 6.25% of the original data packet. With recursive encoding, then, it is possible and implemented in the system to achieve increasing compression ratios, using multi-layered encoding, through recursively encoding data. Both initial encoding libraries 1810 and subsequent libraries 1825 may be achieved through machine learning techniques to find optimal encoding patterns to reduce size, with the libraries being distributed to recipients prior to transfer of the actual encoded data, such that only the compressed data 1830 must be transferred or stored, allowing for smaller data footprints and bandwidth requirements. This process can be reversed to reconstruct the data. While this example shows only two levels of encoding, recursive encoding may be repeated any number of times. The number of levels of recursive encoding will depend on many factors, a non-exhaustive list of which includes the type of data being encoded, the size of the original data, the intended usage of the data, the number of instances of data being stored, and available storage space for codebooks and libraries. Additionally, recursive encoding can be applied not only to data to be stored or transmitted, but also to the codebooks and/or libraries, themselves. For example, many installations of different libraries could take up a substantial amount of storage space. Recursively encoding those different libraries to a single, universal library would dramatically reduce the amount of storage space required, and each different library could be reconstructed as necessary to reconstruct incoming streams of data.

Figure 20:
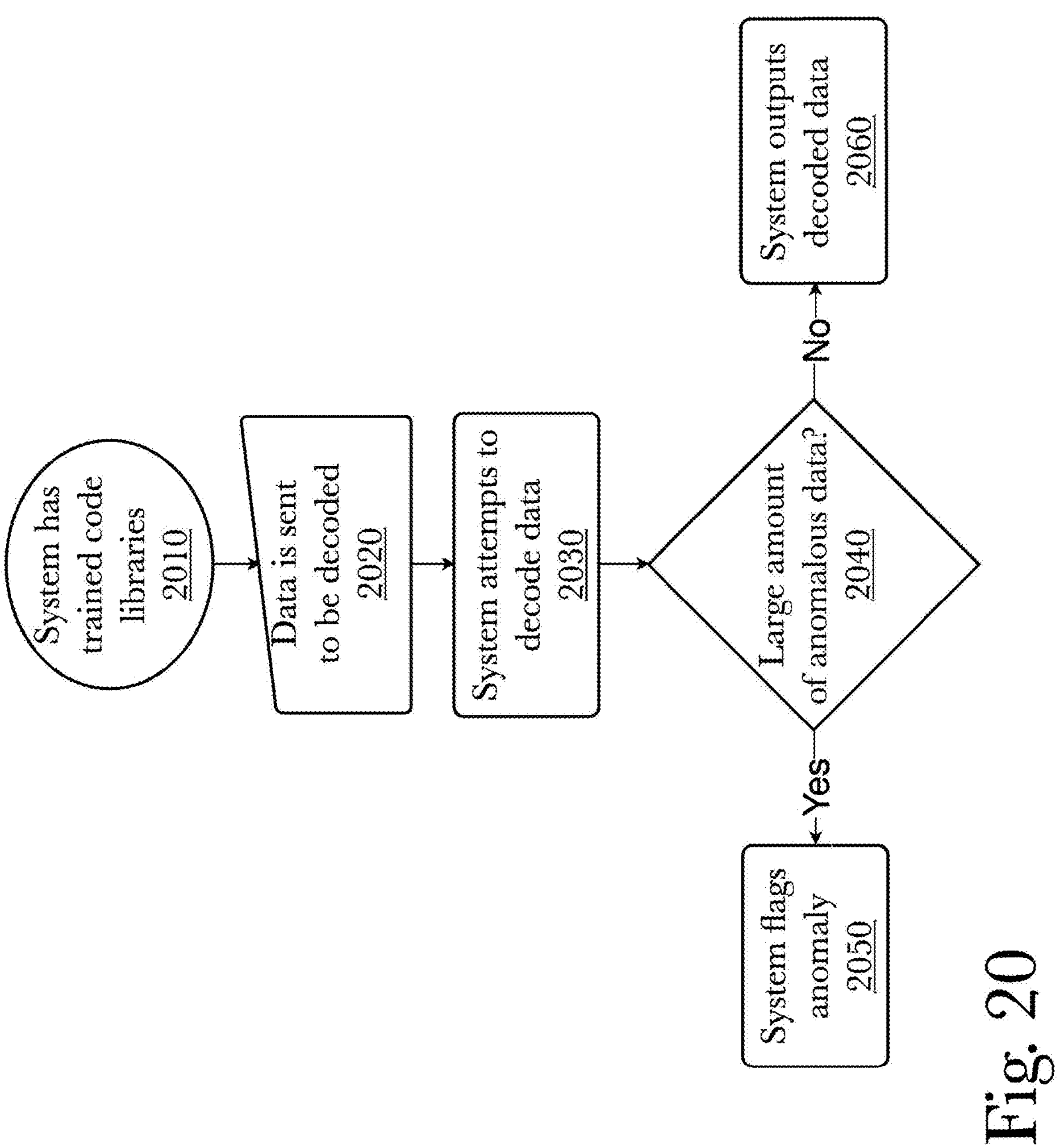
FIG. 20 is a flow diagram of an exemplary method used to detect anomalies in received encoded data and producing a warning.

FIG. 20 is a flow diagram of an exemplary method used to detect anomalies in received encoded data and producing a warning. A system may have trained encoding libraries 2010, before data is received from some source such as a network connected device or a locally connected device including USB connected devices, to be decoded 2020. Decoding in this context refers to the process of using the encoding libraries to take the received data and attempt to use encoded references to decode the data into its original source 2030, potentially more than once if recursive encoding was used, but not necessarily more than once. An anomaly detector 1910 may be configured to detect a large amount of un-encoded data 2040 in the midst of encoded data, by locating data or references that do not appear in the encoding libraries, indicating at least an anomaly, and potentially data tampering or faulty encoding libraries. A flag or warning is set by the system 2050, allowing a user to be warned at least of the presence of the anomaly and the characteristics of the anomaly. However, if a large amount of invalid references or unencoded data are not present in the encoded data that is attempting to be decoded, the data may be decoded and output as normal 2060, indicating no anomaly has been detected.

Figure 21:
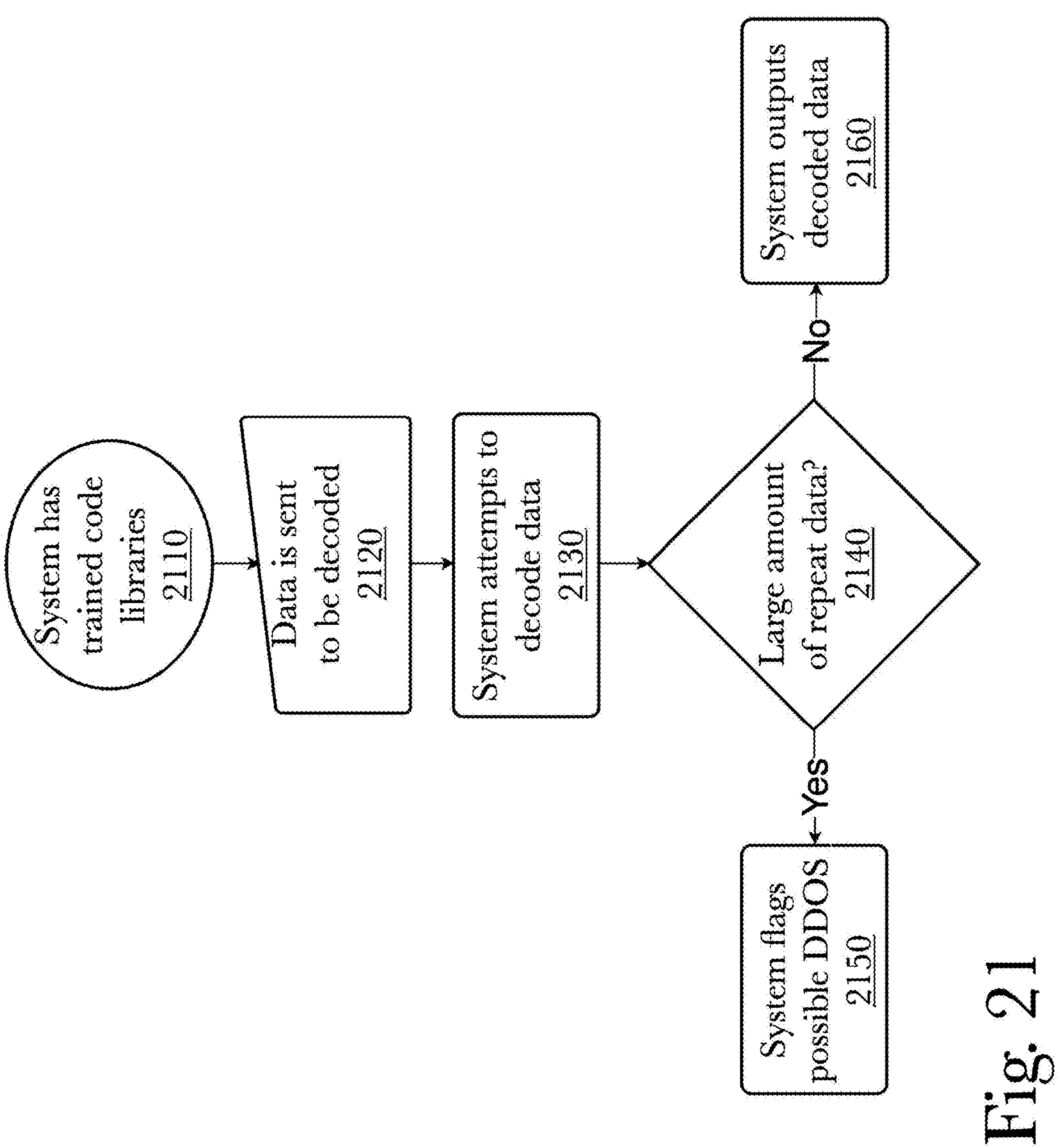
FIG. 21 is a flow diagram of a data encoding system used for Distributed Denial of Service (DDOS) attack denial.

FIG. 21 is a flow diagram of a method used for Distributed Denial of Service (DDOS) attack denial. A system may have trained encoding libraries 2110, before data is received from some source such as a network connected device or a locally connected device including USB connected devices, to be decoded 2120. Decoding in this context refers to the process of using the encoding libraries to take the received data and attempt to use encoded references to decode the data into its original source 2130, potentially more than once if recursive encoding was used, but not necessarily more than once. A DDOS detector 1920 may be configured to detect a large amount of repeating data 2140 in the encoded data, by locating data or references that repeat many times over (the number of which can be configured by a user or administrator as need be), indicating a possible DDOS attack. A flag or warning is set by the system 2150, allowing a user to be warned at least of the presence of a possible DDOS attack, including characteristics about the data and source that initiated the flag, allowing a user to then block incoming data from that source. However, if a large amount of repeat data in a short span of time is not detected, the data may be decoded and output as normal 2160, indicating no DDOS attack has been detected.

Figure 23:
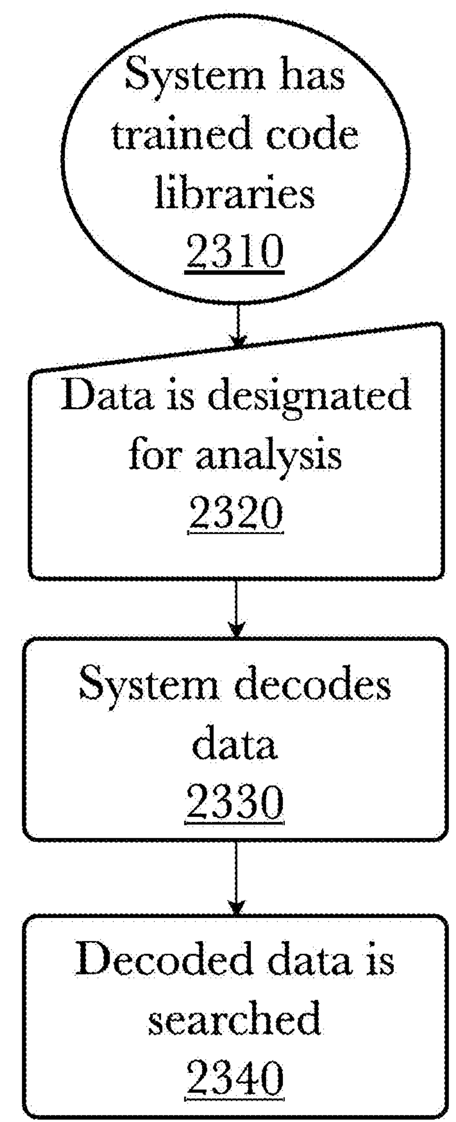
FIG. 23 is a flow diagram of an exemplary method used to enable high-speed data mining of repetitive data.

FIG. 23 is a flow diagram of an exemplary method used to enable high-speed data mining of repetitive data. A system may have trained encoding libraries 2310, before data is received from some source such as a network connected device or a locally connected device including USB connected devices, to be analyzed 2320 and decoded 2330. When determining data for analysis, users may select specific data to designate for decoding 2330, before running any data mining or analytics functions or software on the decoded data 2340. Rather than having traditional decryption and decompression operate over distributed drives, data can be regenerated immediately using the encoding libraries disclosed herein, as it is being searched. Using methods described in FIG. 9 and FIG. 11, data can be stored, retrieved, and decoded swiftly for searching, even across multiple devices, because the encoding library may be on each device. For example, if a group of servers host codewords relevant for data mining purposes, a single computer can request these codewords, and the codewords can be sent to the recipient swiftly over the bandwidth of their connection, allowing the recipient to locally decode the data for immediate evaluation and searching, rather than running slow, traditional decompression algorithms on data stored across multiple devices or transfer larger sums of data across limited bandwidth.

Figure 25:
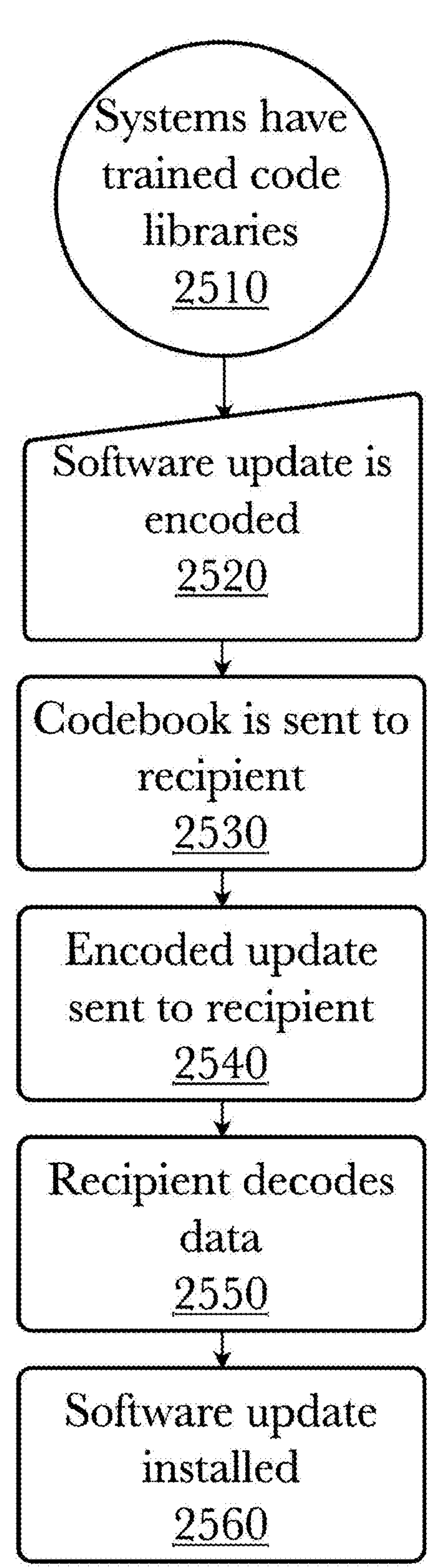
FIG. 25 is a flow diagram of an exemplary method used to encode and transfer software and firmware updates to a device for installation, for the purposes of reduced bandwidth consumption.

FIG. 25 is a flow diagram of an exemplary method used to encode and transfer software and firmware updates to a device for installation, for the purposes of reduced bandwidth consumption. A first system may have trained code libraries or "codebooks" present 2510, allowing for a software update of some manner to be encoded 2520. Such a software update may be a firmware update, operating system update, security patch, application patch or upgrade, or any other type of software update, patch, modification, or upgrade, affecting any computer system. A codebook for the patch must be distributed to a recipient 2530, which may be done beforehand and either over a network or through a local or physical connection, but must be accomplished at some point in the process before the update may be installed on the recipient device 2560. An update may then be distributed to a recipient device 2540, allowing a recipient with a codebook distributed to them 2530 to decode the update 2550 before installation 2560. In this way, an encoded and thus heavily compressed update may be sent to a recipient far quicker and with less bandwidth usage than traditional lossless compression methods for data, or when sending data in uncompressed formats. This especially may benefit large distributions of software and software updates, as with enterprises updating large numbers of devices at once.

Figure 27:
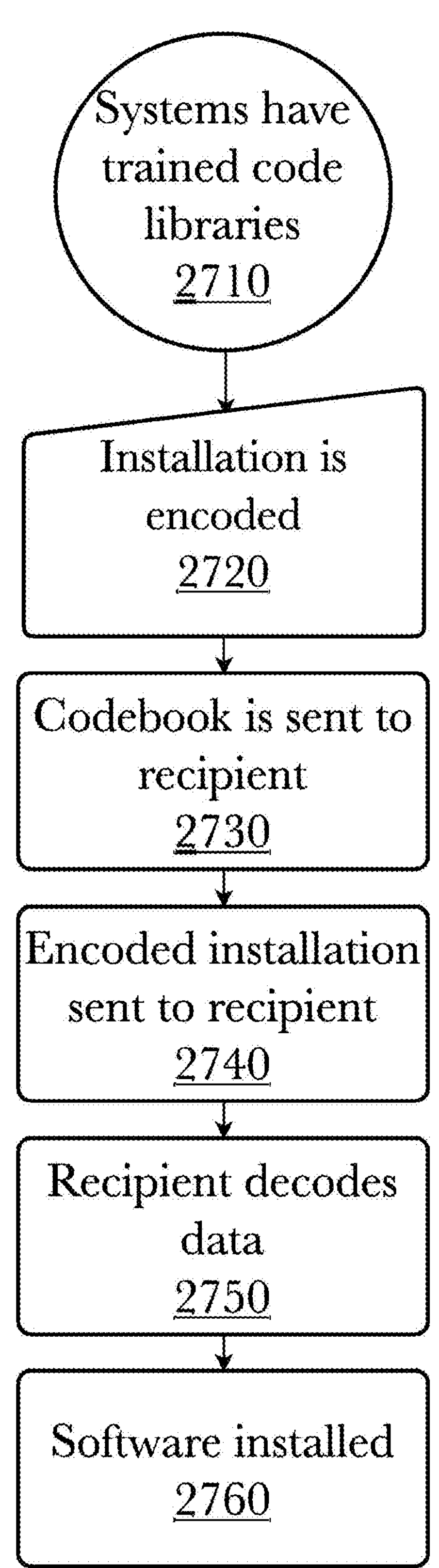
FIG. 27 is a flow diagram of an exemplary method used to encode new software and operating system installations for reduced bandwidth required for transference.

FIG. 27 is a flow diagram of an exemplary method used to encode new software and operating system installations for reduced bandwidth required for transference. A first system may have trained code libraries or "codebooks" present 2710, allowing for a software installation of some manner to be encoded 2720. Such a software installation may be a software update, operating system, security system, application, or any other type of software installation, execution, or acquisition, affecting a computer system. An encoding library or "codebook" for the installation must be distributed to a recipient 2730, which may be done beforehand and either over a network or through a local or physical connection, but must be accomplished at some point in the process before the installation can begin on the recipient device 2760. An installation may then be distributed to a recipient device 2740, allowing a recipient with a codebook distributed to them 2730 to decode the installation 2750 before executing the installation 2760. In this way, an encoded and thus heavily compressed software installation may be sent to a recipient far quicker and with less bandwidth usage than traditional lossless compression methods for data, or when sending data in uncompressed formats. This especially may benefit large distributions of software and software updates, as with enterprises updating large numbers of devices at once.

Figure 31:
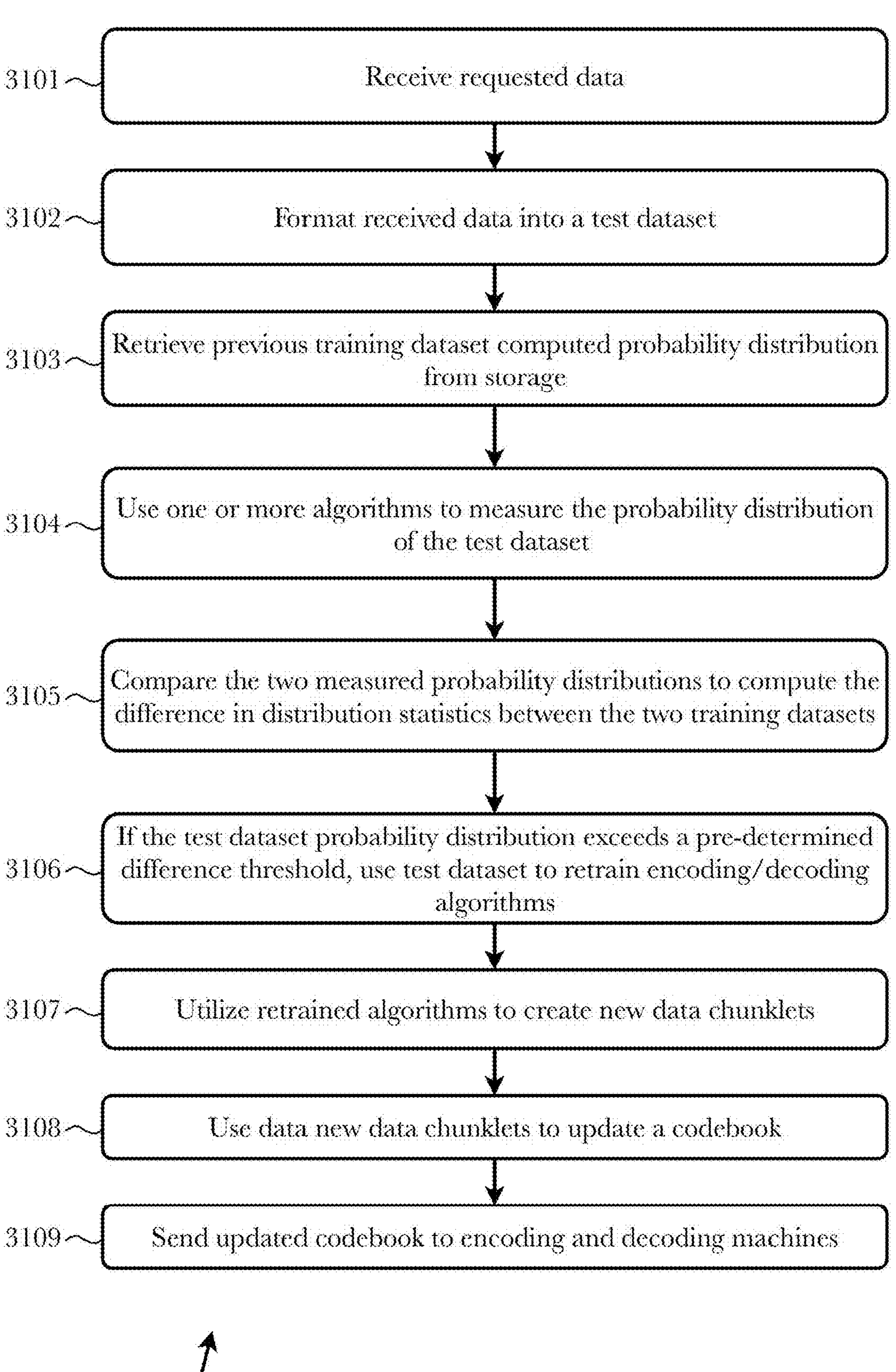
FIG. 31 is a method diagram illustrating the steps involved in using an embodiment of the codebook training system to update a codebook.

FIG. 31 is a method diagram illustrating the steps 3100 involved in using an embodiment of the codebook training system to update a codebook. The process begins when requested data is received 3101 by a codebook training module. The requested data may comprise a plurality of sourceblocks. Next, the received data may be stored in a cache and formatted into a test dataset 3102. The next step is to retrieve the previously computed probability distribution associated with the previous (most recent) training dataset from a storage device 3103. Using one or more algorithms, measure and record the probability distribution of the test dataset 3104. The step after that is to compare the measured probability distributions of the test dataset and the previous training dataset to compute the difference in distribution statistics between the two datasets 3105. If the test dataset probability distribution exceeds a pre-determined difference threshold, then the test dataset will be used to retrain the encoding/decoding algorithms 3106 to reflect the new distribution of the incoming data to the encoder/decoder system. The retrained algorithms may then be used to create new data sourceblocks 3107 that better capture the nature of the data being received. These newly created data sourceblocks may then be used to create new codewords and update a codebook 3108 with each new data sourceblock and its associated new codeword. Last, the updated codebooks may be sent to encoding and decoding machines 3109 in order to ensure the encoding/decoding system function properly.

Figure 39:
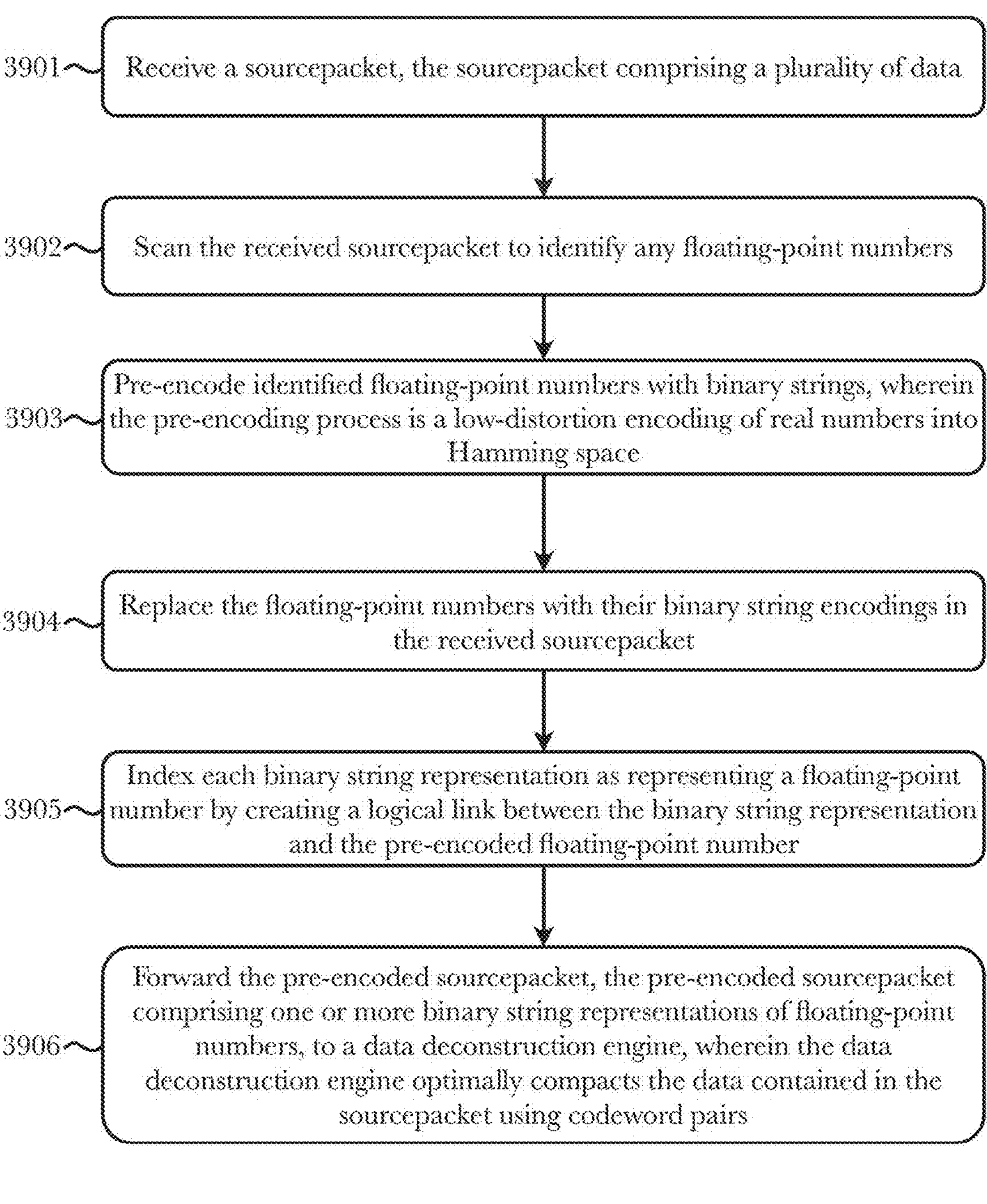
FIG. 39 is a flow diagram describing an exemplary method for low-distortion compaction of floating-point numbers.

FIG. 39 is a flow diagram describing an exemplary method 3900 for low-distortion compaction of floating-point numbers, according to an embodiment. According to an embodiment, the process begins when pre-encoder 3610 receives a sourcepacket, the sourcepacket comprising a plurality of data and wherein the plurality of data includes at least one floating-point number 3901. At a next step, 3902, the received sourcepacket is scanned to identify any floating-point numbers that may be contained within data included in the sourcepacket. In a next step, 3903 any identified floating-point numbers may be pre-encoded into binary strings, wherein the pre-encoding process is a low-distortion embedding of real numbers into Hamming space via binary string engine 3710. Then, the floating-point numbers located in the received sourcepacket are replaced, in the same location, with the pre-encoded binary string representations 3904. As a next step, binary string indexer 3720 may index each binary string representation as representing a floating-point number by creating a logical link between the binary string representation and the pre-encoded floating-point number 3905. As a last step, pre-encoder 3610 forwards the pre-encoded sourcepacket, the pre-encoded sourcepacket comprising one or more binary string representations of floating-point numbers, to a data deconstruction engine 3630, wherein the data deconstruction engine optimally compacts the pre-encoded sourcepacket using codeword pairs.

Figure 40:
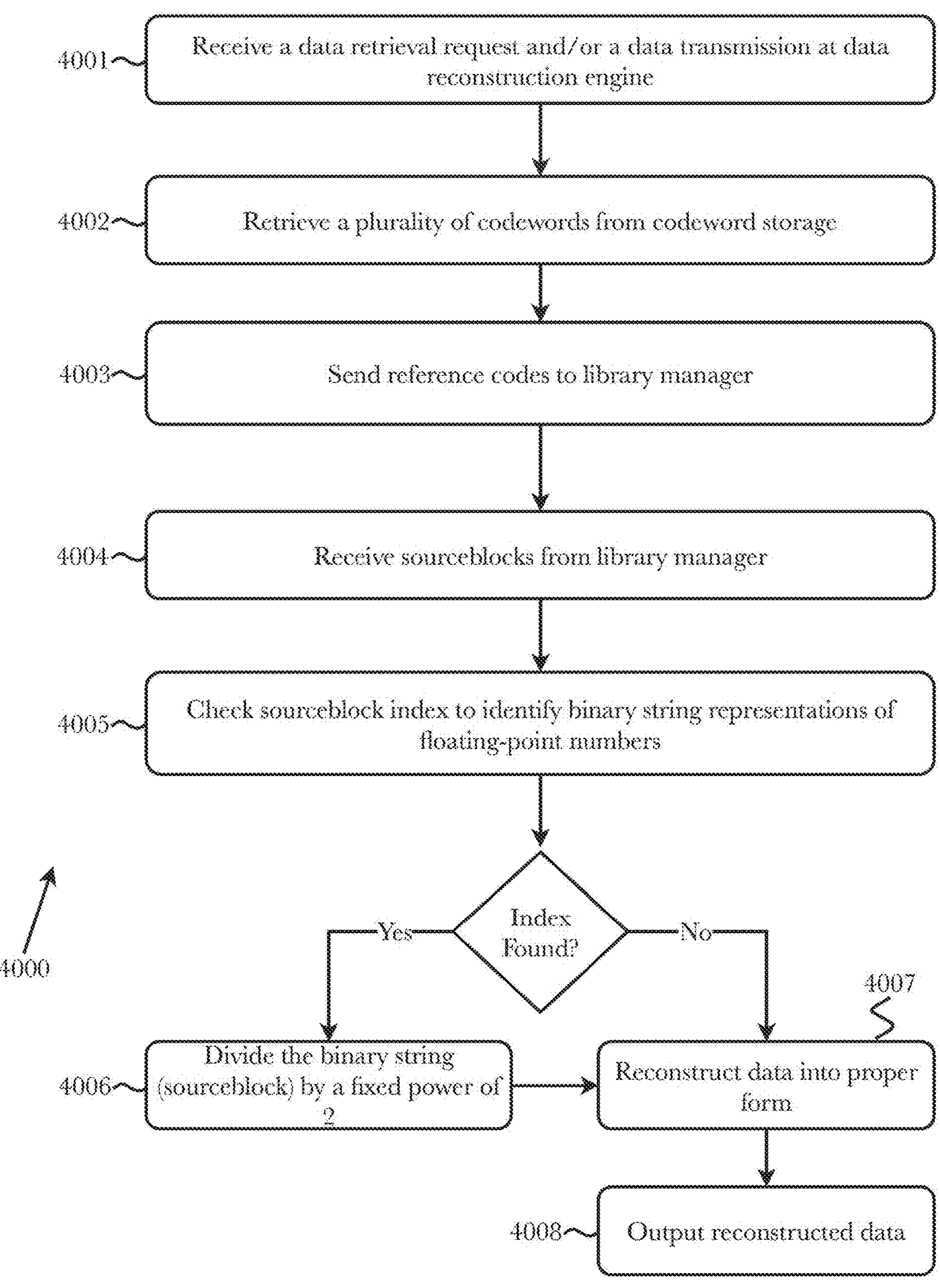
FIG. 40 is a flow diagram describing an exemplary method for decoding low-distortion compacted floating-point number data.

FIG. 40 is a flow diagram describing an exemplary method 4000 for decoding low-distortion compacted floating-point number data, according to an embodiment. According to an embodiment, the process begins when data reconstruction engine 3660 receives a data retrieval request and/or a data transmission 4001. Then, 4002 data reconstruction engine 3660 can retrieve a plurality of codewords from codeword storage 3650 and 4003 send the retrieved reference codes to library manager 3640. As a next step, 4004 data reconstruction engine 3660 receives sourceblocks from library manager 3640. Each received sourceblock may be checked for an index that indicates the sourceblock is a binary string representation of a floating-point number 4005. If the index is found, 4006 then the indexed sourceblock (i.e., a binary string representation) may be sent to integer integrator 3665 where the binary string is divided by a fixed power of two in order to transform the encoded binary string representation back into the original floating-point number. After transforming a binary string back into a floating-point number, or in the case that the received sourcepacket is not indexed (i.e., the received sourcepacket does not represent a floating-point number), the process proceeds to step 4007 where the data reconstruction engine 3660 reconstructs the data into its proper form (e.g., the format in which the data was originally received by system 3600). As a last step, 4008 the reconstructed data is output to the appropriate endpoint.

Figure 41:
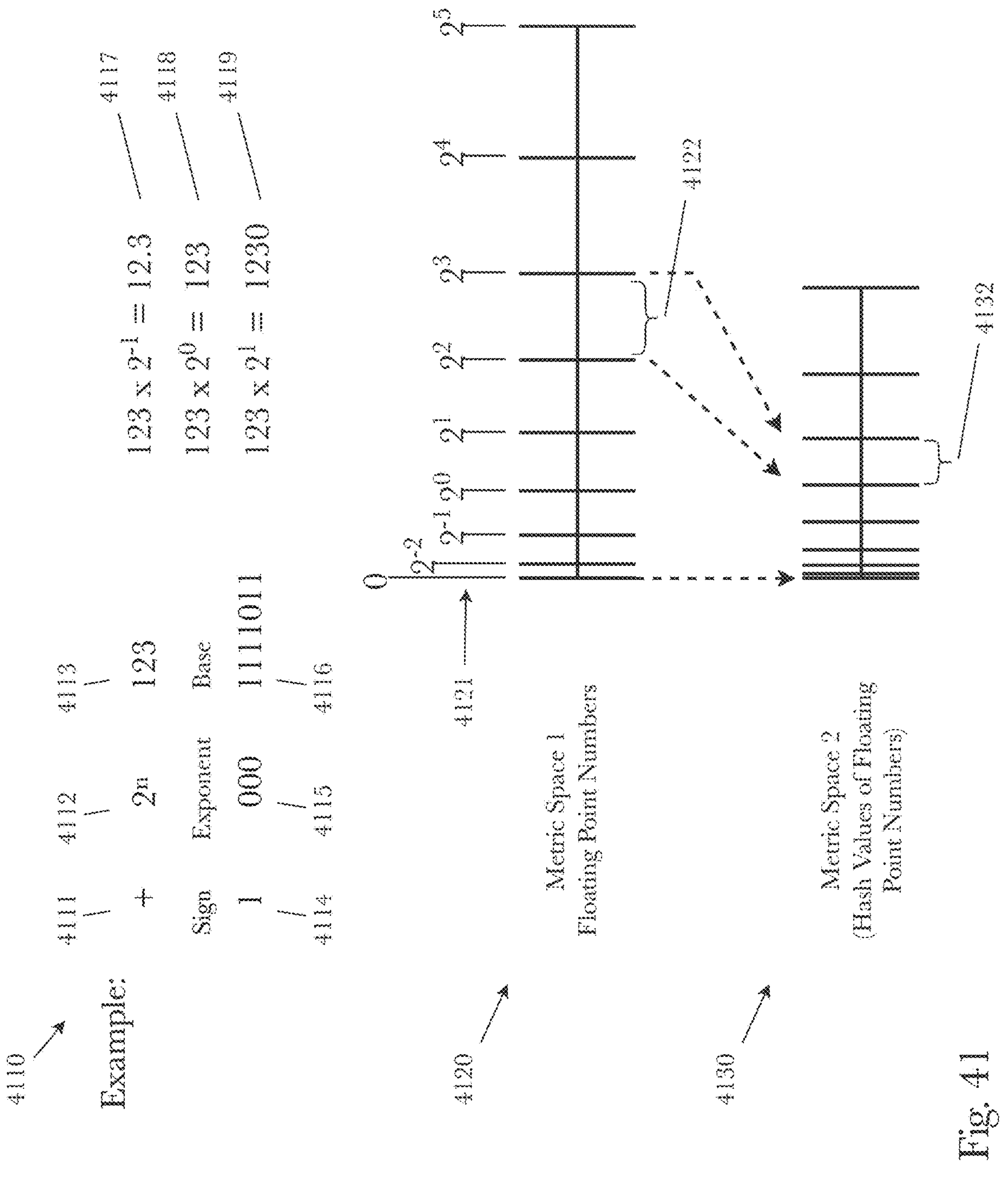
FIG. 41 is a diagram showing an example of low-distortion embedding between two metric spaces.

FIG. 41 is a diagram showing an example of low-distortion embedding between two metric spaces. A metric space is a set of points having some function of distance between each pair of points. A low-distortion embedding of a metric space means finding a second metric space having a different distance function between each pair of points, but which preserves the relative distance between each pair of points in the first metric space to within an acceptable distortion factor. A simple example of a low-distortion embedding is a first metric space consisting of a set of real numbers X (e.g., 1, 2, and 3) embedded into a second metric space consisting of set of real numbers 2X (e.g., 2, 4, and 6). While the absolute difference between two points in the second metric space is twice that of the first metric space, the relative spacing between any pair of points in the first metric set is preserved when translating to the second metric set.

Another example of low-distortion embedding is embedding of a metric space of floating point numbers onto a metric space of hash values of those floating point numbers. A floating point number are n-bit digital representations of real numbers, necessarily involving some imprecision. By the most commonly-defined standards, floating point numbers consist of a sign bit, several exponent bits, and base number bit. In the example of 4110, a floating point number is shown has having a positive sign 4111 represented by a single "1" bit 4114, an exponent of the form $2^n$ 4112 represented by the 3-bit exponent "000" 4115, and a decimal base number "123" represented by a 7-bit "1111011" 4116. Assuming the sign 4111 and base 4113 remain the same, changing the exponent 4112 will move the decimal place. For example, an exponent of −1 would make the floating point number 12.3 4117, an exponent of 0 would make the floating point number 123 4118, and an exponent of 1 would make the floating point number 1230 4119.

As shown at 4120, the distances between pairs of points in the metric space representing floating point numbers is not constant. As the exponent 4121 increases, the distance between any two consecutive points increases 4122. In order to have a low-distortion embedding of the metric space of a floating point number, any second metric space must preserve the relative distances between consecutive points. In other words, if any two points x and y in the first metric space differ by a small amount, a function must be found such that f(x) and f(y) also differ only by small amount. Another way to say this is that function f is a low-distortion encoding of the set of numbers in the first metric space into Hamming space, wherein the Hamming space is the set of all $2^n$ binary strings of length", and Hamming distance is the number of bits by which two consecutive binary string differ. One such function that meets this criterion is the MinHash (minimum hash value produced) of floating point metric spaces, as shown at 4130. Applying a MinHash algorithm to a floating point metric space 4120 creates a second metric space 4130 that preserves the relative distances 4122, 4132 between any two consecutive points.

Multi-Level Compaction with Meta-Data Tagging System Architecture

Figure 42:
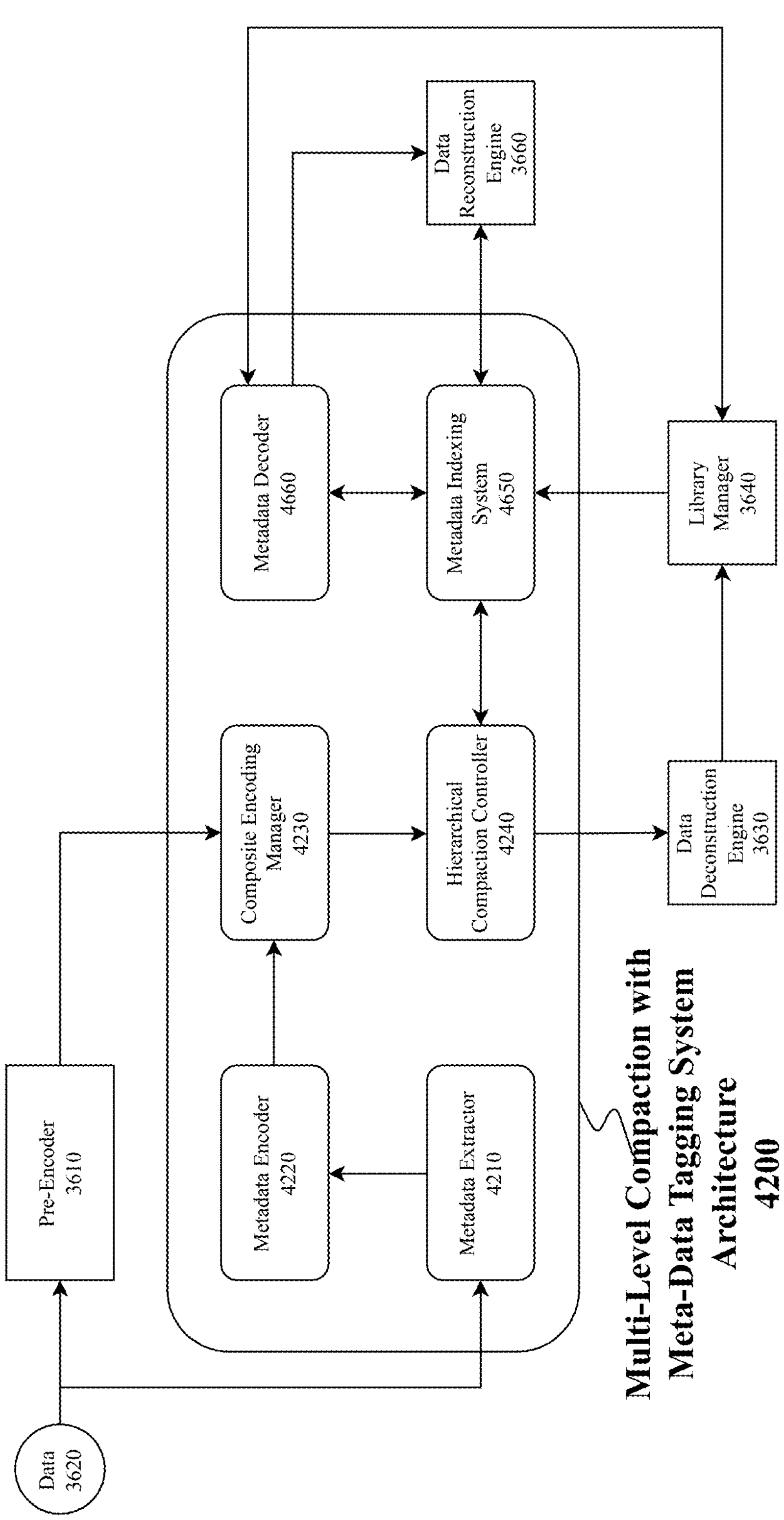
FIG. 42 is a block diagram illustrating exemplary architecture of multi-level compaction with meta-data tagging system architecture.

FIG. 42 is a block diagram illustrating exemplary architecture of multi-level compaction with meta-data tagging system architecture 4200, in an embodiment. According to this embodiment, multi-level compaction with meta-data tagging system 4200 comprises metadata extractor 4210, metadata encoder 4220, composite encoding manager 4230, hierarchical compaction controller 4240, metadata indexing system 4250, and metadata decoder 4260. These components work in conjunction with pre-encoder 3610, data deconstruction engine 3630, library manager 3640, codeword storage 3650, and data reconstruction engine 3660 described in previous embodiments. For complete disclosure of system 3600 elements, see FIG. 36-38.

When incoming data 3620 containing floating-point numbers and associated metadata is received, metadata extractor 4210 analyzes the incoming data to identify relevant metadata associated with the floating-point numbers. Metadata extractor 4210 may include, in an embodiment, pattern recognition algorithms for identifying various types of metadata elements. For example, metadata extractor 4210 may employ natural language processing techniques to identify textual metadata, timestamp recognition algorithms to identify temporal metadata, and frequency analysis to identify repeating patterns that may represent categorical data. Metadata extractor 4210 may further include context analyzers that determine the relevance of metadata based on its relationship to the floating-point values. In some embodiments, metadata extractor 4210 may utilize extraction rules engines that can be configured for different data formats, allowing the system to process metadata from structured formats such as JSON or XML as well as from semi-structured or unstructured data sources. Additionally, metadata extractor 4210 may include validation and normalization components that standardize extracted metadata for consistent processing. Metadata extractor 4210 works in parallel with pre-encoder 3610, which identifies and processes the floating-point numbers themselves as described in previous embodiments.

While pre-encoder 3610 converts floating-point numbers into binary string representations through low-distortion embedding techniques, metadata encoder 4220 receives the extracted metadata from metadata extractor 4210 and converts it into compact binary forms. Metadata encoder 4220 may implement, for example, domain-specific encoding schemes optimized for different categories of metadata. These schemes may include, in an embodiment, Huffman coding for textual metadata, run-length encoding for repeating values, and delta encoding for sequential numeric values. Metadata encoder 4220 may also employ adaptive bit allocation strategies that assign more bits to metadata fields with higher information content or greater variance, and fewer bits to fields with lower variance or predictable patterns. For instance, metadata encoder 4220 might use vocabulary compression techniques that replace common textual terms with shorter codes, particularly effective for domain-specific terminology that appears frequently in the metadata. In some embodiments, metadata encoder 4220 may implement differential encoding for temporal metadata, storing time differences rather than absolute timestamps when sequential data points have regular intervals. The encoder may also maintain metadata type registries to ensure consistent encoding and decoding operations across different data processing sessions.

Composite encoding manager 4230 receives both the pre-encoded floating-point binary strings from binary string engine 3710 and the encoded metadata from metadata encoder 4220. Composite encoding manager 4230 may employ, in an embodiment, multiple linking strategies optimized for different data patterns and usage contexts. For example, some applications might benefit from embedding small metadata directly with the data, while others might be better served by reference-based linking where frequently repeating metadata is stored once and referenced multiple times. Composite encoding manager 4230 may analyze correlation patterns between data and metadata using statistical techniques such as mutual information analysis or association rule mining to identify relationships. Based on these analyses, it may create optimal linking structures that efficiently associate specific metadata with corresponding floating-point values. In some implementations, composite encoding manager 4230 might employ graph-based data structures to represent complex relationships between metadata elements and their associated floating-point values. Additionally, composite encoding manager 4230 may implement reference resolution mechanisms for shared metadata that identify common metadata elements across multiple data points and establish efficient reference structures to avoid redundant storage.

The linked data and metadata are passed to hierarchical compaction controller 4240, which organizes the composite elements into multiple compaction levels based on semantic relationships. Hierarchical compaction controller 4240 may utilize, for example, clustering algorithms to group related data elements into semantic units. These algorithms might include, in an embodiment, hierarchical clustering methods that build nested groupings of data based on similarity measures, or graph partitioning approaches that identify communities of related data elements. Hierarchical compaction controller 4240 may implement inheritance policies that allow metadata attributes to be specified once at higher levels of the hierarchy and inherited by lower-level elements, reducing redundancy while preserving complete information. For example, dataset-wide attributes like data source or collection date might be stored at the top level, while more specific attributes are stored at lower levels. In some implementations, hierarchical compaction controller 4240 might employ dynamic storage allocation algorithms that optimize the distribution of data across different compaction levels based on access patterns, importance, or frequency of use. Additionally, hierarchical compaction controller 4240 may include semantic relationship preservation mechanisms that maintain the logical connections between data elements even as they are distributed across different compaction levels.

Metadata indexing system 4250 works in conjunction with hierarchical compaction controller 4240 to create specialized indices for efficient metadata-based retrieval. Metadata indexing system 4250 may implement, for example, multi-dimensional indexing structures such as R-trees or k-d trees that enable efficient range queries across multiple metadata attributes simultaneously. These indexing structures might be augmented, in an embodiment, with bitmap indices for categorical metadata fields or inverted indices for textual metadata to accelerate specific types of queries. Metadata indexing system 4250 may employ composite key generation algorithms that combine multiple metadata fields into unified keys for more efficient lookups when certain field combinations are frequently queried together. In some implementations, metadata indexing system 4250 might include index compression techniques that reduce the storage footprint of indices by exploiting patterns and redundancies in the indexed metadata. Additionally, metadata indexing system 4250 may implement partial match resolution strategies that can efficiently resolve queries specifying only a subset of possible metadata attributes, potentially using fuzzy matching techniques when exact matches are not available.

During the compaction process, data deconstruction engine 3630 receives the pre-encoded dataset with hierarchically organized metadata from hierarchical compaction controller 4240. Data deconstruction engine 3630 breaks down this dataset into sourceblocks that now contain both data and metadata components. Library manager 3640 assigns reference codes to these sourceblocks, incorporating metadata information into the reference code structure. For example, the reference codes might include, in an embodiment, bit fields that encode key metadata attributes directly within the reference code, enabling certain types of filtering operations to be performed without accessing the full metadata. In some implementations, library manager 3640 might employ similarity-based reference code assignment that groups sourceblocks with similar metadata profiles, potentially improving compression ratios by exploiting patterns in the metadata distribution. Additionally, reference code generation might incorporate hierarchical information, encoding the position of a sourceblock within the semantic hierarchy as part of its reference code. These sourceblocks are then processed into codewords that include hierarchical metadata relationships and stored in codeword storage 3650.

For data retrieval, data reconstruction engine 3660 interprets both content-based and metadata-based query parameters in retrieval requests. Data reconstruction engine 3660 retrieves relevant codewords from codeword storage 3650 based on these parameters and works with library manager 3640 to access the appropriate sourceblocks. Metadata decoder 4260 extracts encoded metadata from the sourceblocks and applies type-specific decoding algorithms to recover the original metadata. Metadata decoder 4260 may include, for example, specialized decoders for different metadata types that reverse the encoding operations performed by metadata encoder 4220. These might include, in an embodiment, vocabulary decompression for textual metadata, sequence reconstruction for differential-encoded temporal data, and range expansion for compacted numeric ranges. Metadata decoder 4260 may implement hierarchical relationship reconstructors that rebuild the semantic structure of the metadata based on inheritance rules and explicit relationship indicators. For instance, it might reassemble a hierarchical taxonomy from flattened codes or reconstruct nested object structures from serialized representations. In some implementations, metadata decoder 4260 might employ reference resolution mechanisms that reconnect shared metadata elements with all their associated data points. Additionally, metadata decoder 4260 may include validation and error correction components that verify the integrity of decoded metadata and can repair certain types of corruption, potentially using redundant encoding or checksums embedded in the metadata representation. Meanwhile, integer integrator 3665 transforms the binary string representations back into their original floating-point form as described in previous embodiments.

Data reconstruction engine 3660 then reassembles the complete data structure, reuniting reconstructed floating-point numbers with their associated metadata while preserving all hierarchical relationships. This multi-level compaction with metadata tagging approach enables more intelligent data organization, preservation of rich contextual information, and powerful query capabilities that leverage both the numerical values and their associated metadata.

The reconstructed data with its associated metadata supports complex analytical operations that can filter, aggregate, and analyze data based on both content and context. By preserving provenance information throughout the data lifecycle, multi-level compaction with metadata tagging system 4200 ensures that floating-point values retain their semantic meaning and relationships, enabling more meaningful data analysis and interpretation.

Multi-level compaction with metadata tagging system 4200 processes data through several transformation stages, in an embodiment. Initially, incoming data 3620 flows simultaneously to metadata extractor 4210 and pre-encoder 3610, where floating-point numbers and their associated metadata are identified and separated for parallel processing. The extracted metadata flows to metadata encoder 4220, which converts it into compact binary representations, while pre-encoder 3610 transforms floating-point numbers into binary string representations. These separate encoded elements then flow to composite encoding manager 4230, which combines them using appropriate linking strategies based on data patterns. The linked data and metadata proceed to hierarchical compaction controller 4240, which organizes them into multiple compaction levels based on semantic relationships and implements inheritance policies. This hierarchically structured data then flows to data deconstruction engine 3630, which breaks it down into sourceblocks containing both data and metadata components. The sourceblocks are processed by library manager 3640, which assigns metadata-aware reference codes, and these are converted into codewords and stored in codeword storage 3650. During retrieval, data reconstruction engine 3660 receives query parameters and consults metadata indexing system 4250 to efficiently identify codewords matching the specified metadata criteria. Data reconstruction engine 3660 then obtains these codewords from codeword storage 3650 and passes the reference codes to library manager 3640 to retrieve corresponding sourceblocks. Library manager 3640 returns the appropriate sourceblocks containing both encoded metadata and binary string representations. These sourceblocks are then processed along two parallel paths: metadata decoder 4260 extracts and reconstructs the original metadata using type-specific decoding algorithms, while integer integrator 3665 transforms binary strings back to floating-point numbers by applying the appropriate mathematical operations. Both decoded metadata and reconstructed floating-point numbers are sent to data reconstruction engine 3660, which reassembles the complete data structure with all hierarchical relationships preserved, outputting the fully reconstructed data with its contextual metadata.

Figure 43:
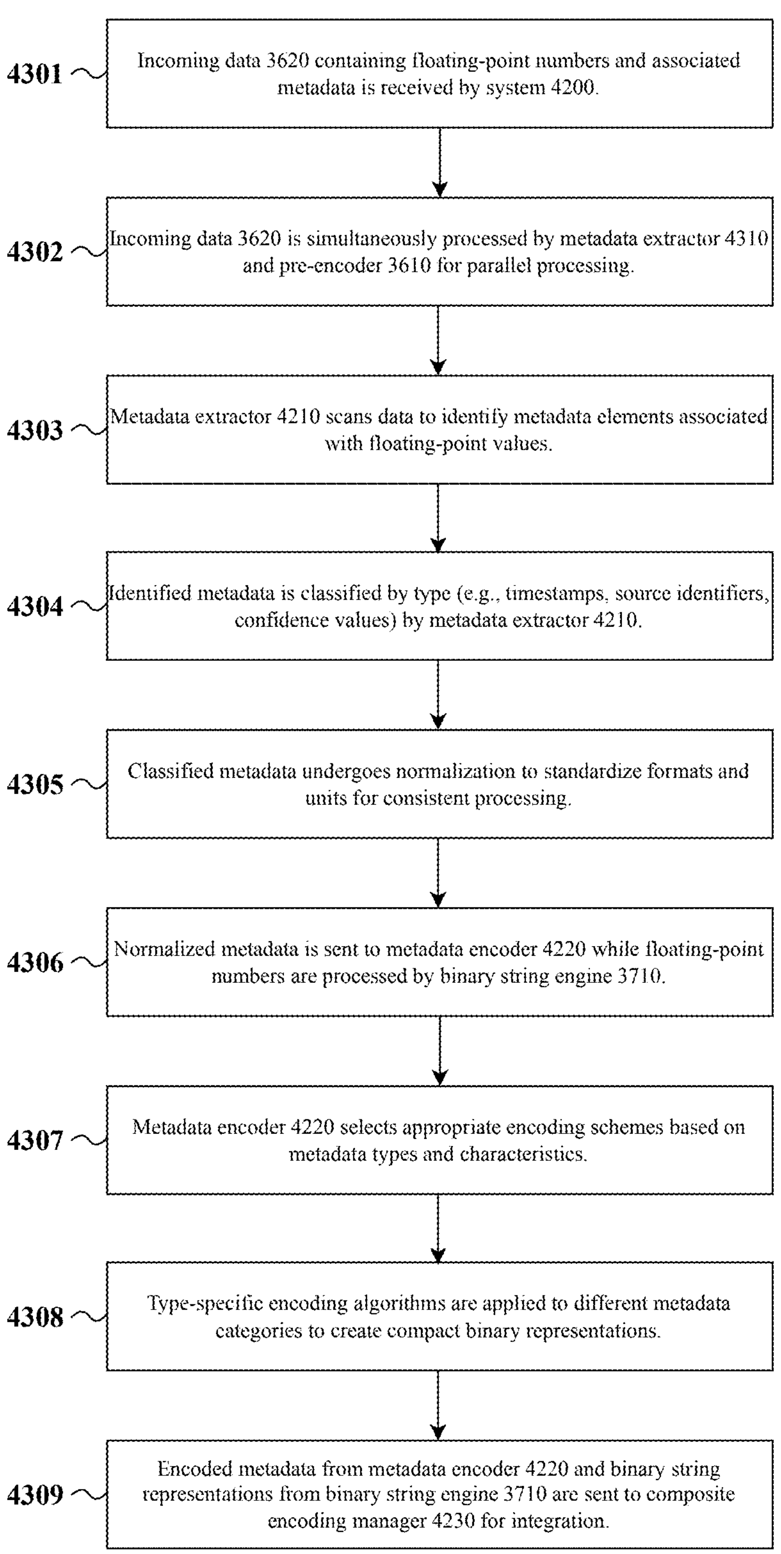
FIG. 43 is a method diagram illustrating metadata extraction and encoding in multi-level compaction with meta-data tagging system.

FIG. 43 is a method diagram illustrating metadata extraction and encoding in multi-level compaction with meta-data tagging system 4200, in an embodiment. Incoming data 3620 containing floating-point numbers and associated metadata is received by system 4200 4301. Incoming data 3620 is simultaneously processed by metadata extractor 4210 and pre-encoder 3610 for parallel processing, allowing the system to efficiently handle both numerical values and their contextual information 4302. Metadata extractor 4210 scans data to identify metadata elements associated with floating-point values, using pattern recognition algorithms and context analyzers to locate relevant metadata throughout the dataset 4303. Identified metadata is classified by type such as timestamps, source identifiers, confidence values, and semantic descriptors by metadata extractor 4210, establishing a structured representation of the contextual information 4304. Classified metadata undergoes normalization to standardize formats and units for consistent processing, resolving inconsistencies in representation and establishing uniform metadata structures that facilitate efficient encoding 4305. Normalized metadata is sent to metadata encoder 4220 while floating-point numbers are processed by binary string engine 3710, maintaining the parallel processing path that separates data from metadata until they can be optimally encoded 4306. Metadata encoder 4220 selects appropriate encoding schemes based on metadata types and characteristics, determining the most efficient compression approach for each category of metadata 4307. Type-specific encoding algorithms are applied to different metadata categories to create compact binary representations, such as vocabulary compression for textual metadata, differential encoding for temporal sequences, and adaptive bit allocation for numerical attributes 4308. Encoded metadata from metadata encoder 4220 and binary string representations from binary string engine 3710 are sent to composite encoding manager 4230 for integration, where they will be linked together based on their semantic relationships 4309.

Figure 44:
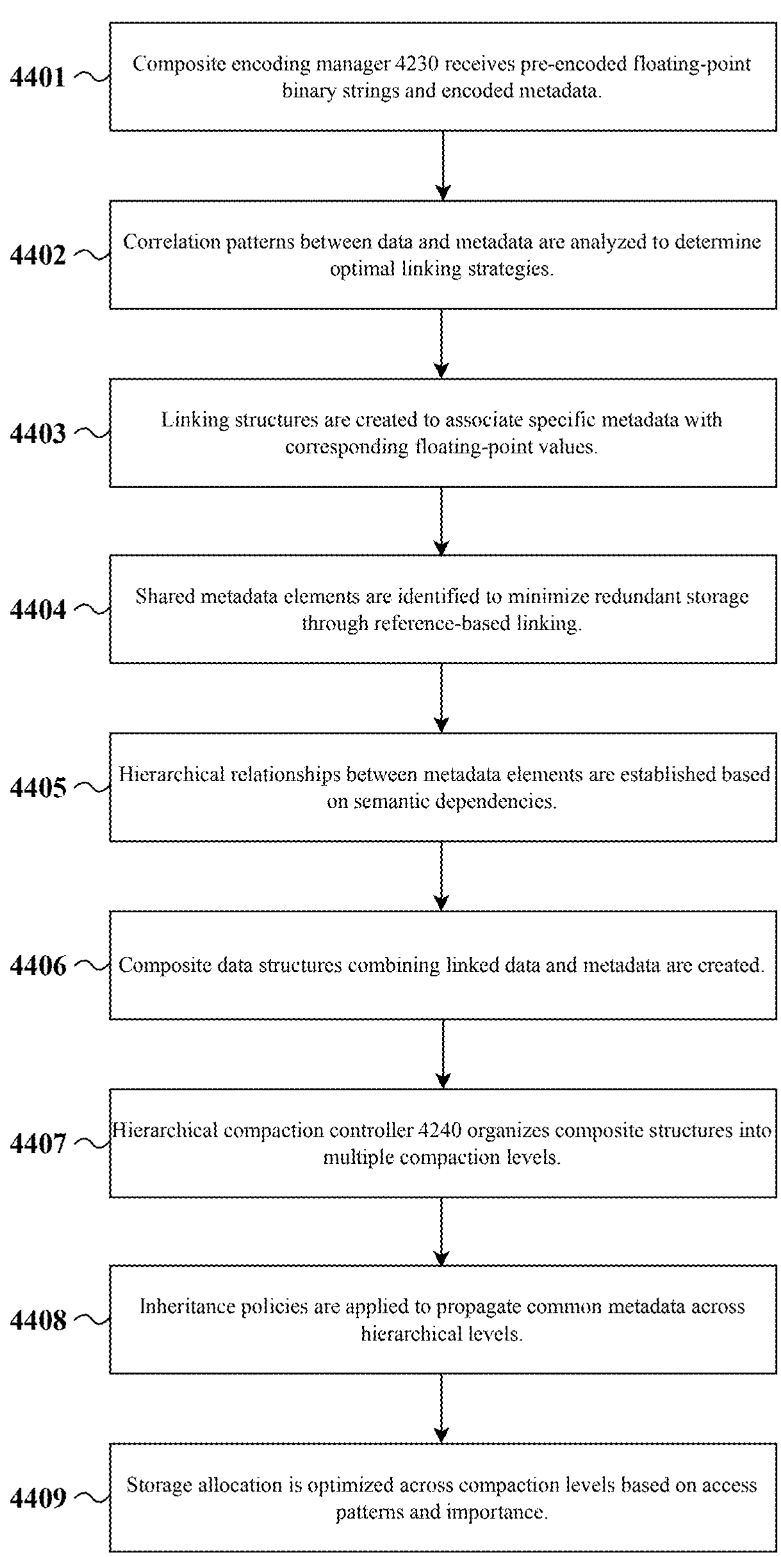
FIG. 44 is a method diagram illustrating composite encoding and hierarchical organization in multi-level compaction with meta-data tagging system.

FIG. 44 is a method diagram illustrating composite encoding and hierarchical organization in multi-level compaction with meta-data tagging system 4200, in an embodiment. Composite encoding manager 4230 receives pre-encoded floating-point binary strings from binary string engine 3710 and encoded metadata from metadata encoder 4220, establishing the foundation for integrated data processing 4401. Correlation patterns between data and metadata are analyzed to determine optimal linking strategies, using statistical techniques such as mutual information analysis and association rule mining to identify meaningful relationships 4402. Linking structures are created to associate specific metadata with corresponding floating-point values, employing various connection mechanisms ranging from direct embedding for small metadata to reference-based linking for larger or frequently repeated metadata elements 4403. Shared metadata elements are identified to minimize redundant storage through reference-based linking, allowing common attributes such as units of measurement or data sources to be stored once and referenced multiple times 4404. Hierarchical relationships between metadata elements are established based on semantic dependencies, creating a structured organization that reflects the natural grouping and nesting of contextual information 4405. Composite data structures combining linked data and metadata are created, preserving both the values and their context while maintaining efficient storage characteristics 4406. Hierarchical compaction controller 4240 organizes composite structures into multiple compaction levels, grouping related data elements based on semantic similarity and usage patterns 4407. Inheritance policies are applied to propagate common metadata across hierarchical levels, allowing higher-level attributes to be automatically applied to lower-level elements without explicit repetition 4408. Storage allocation is optimized across compaction levels based on access patterns and importance, balancing storage efficiency with retrieval performance to achieve optimal system behavior 4409.

Figure 45:
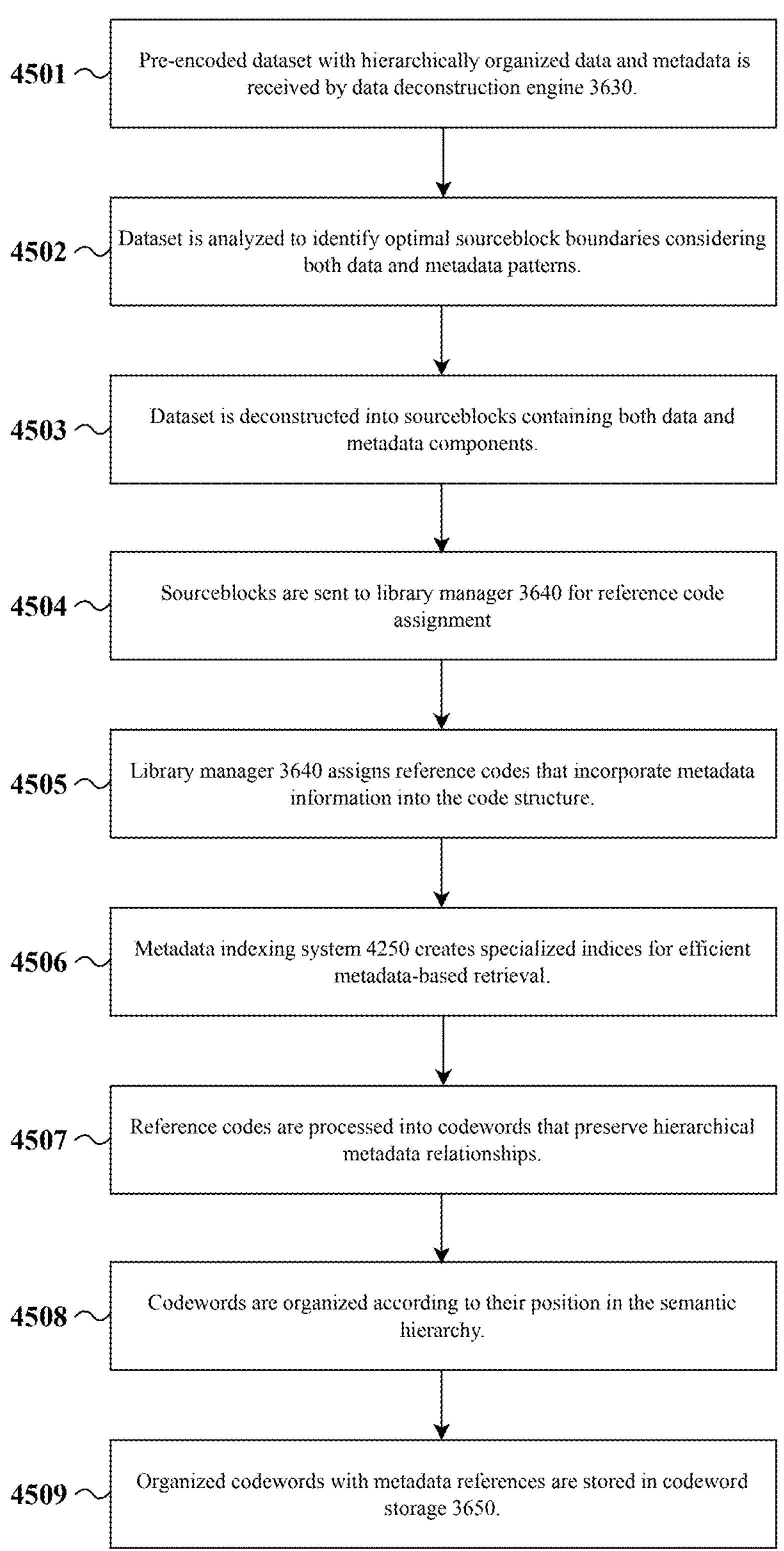
FIG. 45 is a method diagram illustrating multi-level compaction process in multi-level compaction with meta-data tagging system.

FIG. 45 is a method diagram illustrating multi-level compaction process in multi-level compaction with meta-data tagging system 4200, in an embodiment. Pre-encoded dataset with hierarchically organized data and metadata is received by data deconstruction engine 3630, beginning the transformation from composite structures to compacted codewords 4501. Dataset is analyzed to identify optimal sourceblock boundaries considering both data and metadata patterns, ensuring that related information remains together when possible while maintaining efficient block sizing 4502. Dataset is deconstructed into sourceblocks containing both data and metadata components, with each sourceblock preserving the association between floating-point values and their contextual information 4503. Sourceblocks are sent to library manager 3640 for reference code assignment, transitioning from the raw data representation to the reference-based system that enables efficient storage 4504. Library manager 3640 assigns reference codes that incorporate metadata information into the code structure, potentially including bit fields that encode key metadata attributes directly within the reference code to enable metadata-aware operations without accessing the full content 4505. Metadata indexing system 4250 creates specialized indices for efficient metadata-based retrieval, implementing multi-dimensional indexing structures that support complex queries across both data values and metadata attributes 4506. Reference codes are processed into codewords that preserve hierarchical metadata relationships, maintaining the semantic connections established during the earlier encoding phases 4507. Codewords are organized according to their position in the semantic hierarchy, ensuring that the hierarchical structure can be efficiently traversed during subsequent retrieval operations 4508. Organized codewords with metadata references are stored in codeword storage 3650, completing the compaction process while maintaining all necessary information for future reconstruction 4509.

Figure 46:
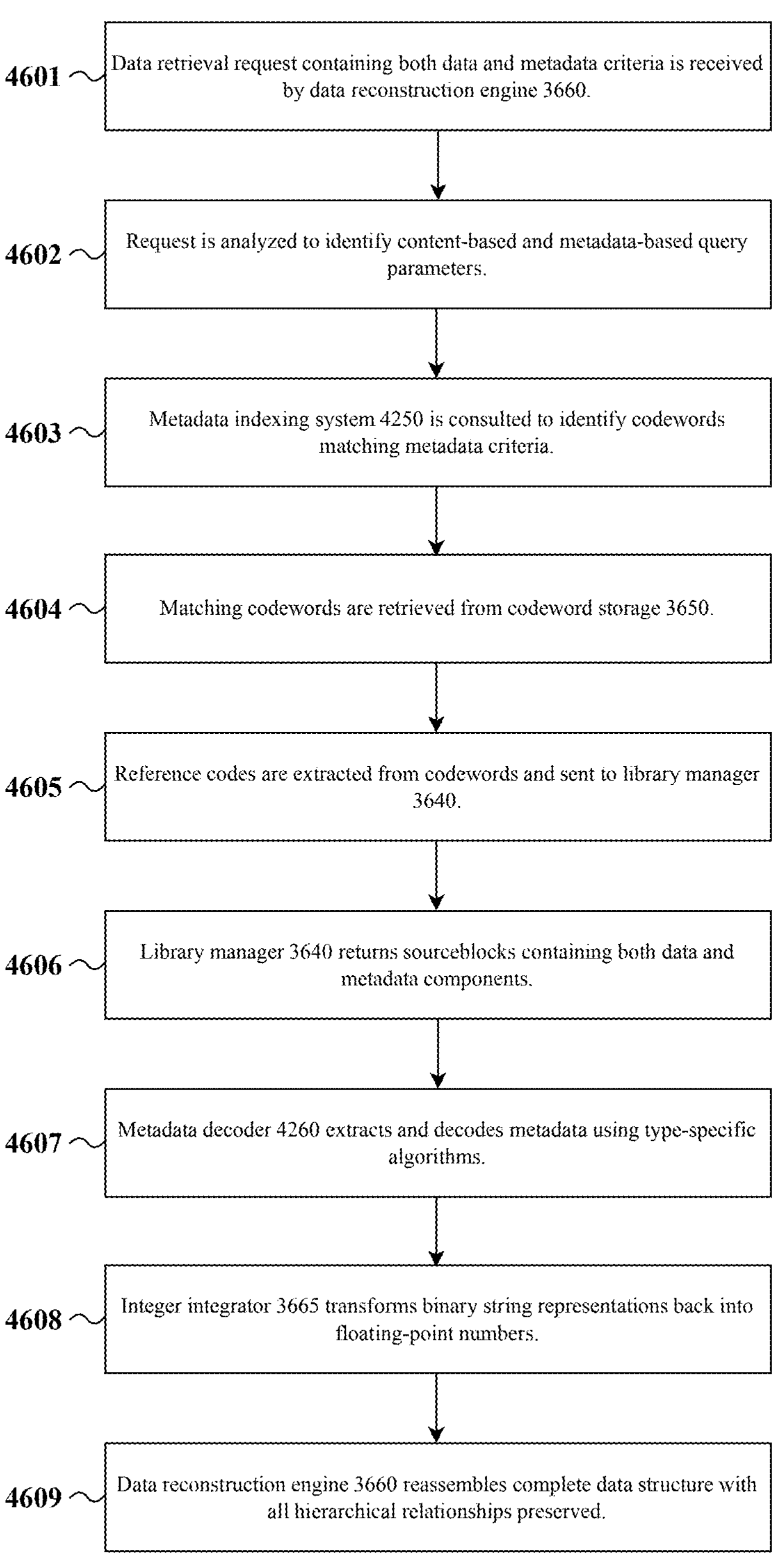
FIG. 46 is a method diagram illustrating metadata-enhanced data retrieval in multi-level compaction with meta-data tagging system.

FIG. 46 is a method diagram illustrating metadata-enhanced data retrieval in multi-level compaction with metadata tagging system 4200, in an embodiment. Data retrieval request containing both data and metadata criteria is received by data reconstruction engine 3660, initiating the process of selective data reconstruction based on specified parameters 4601. Request is analyzed to identify content-based and metadata-based query parameters, separating constraints on the data values themselves from constraints on their associated contextual information 4602. Metadata indexing system 4250 is consulted to identify codewords matching metadata criteria, utilizing the specialized indices created during the compaction process to efficiently locate relevant data without examining all stored content 4603. Matching codewords are retrieved from codeword storage 3650, representing the compressed form of data that satisfies the query constraints 4604. Reference codes are extracted from codewords and sent to library manager 3640, transitioning from the compact reference representation to the actual data content 4605. Library manager 3640 returns sourceblocks containing both data and metadata components, providing the raw material needed for reconstruction of the original information 4606. Metadata decoder 4260 extracts and decodes metadata using type-specific algorithms that reverse the encoding operations performed during compaction, recovering the original format and meaning of contextual information 4607. Integer integrator 3665 transforms binary string representations back into floating-point numbers, restoring the precise numerical values from their compact representation 4608. Data reconstruction engine 3660 reassembles complete data structure with all hierarchical relationships preserved, producing a fully reconstructed dataset that maintains both the values and their semantic context as specified in the original data 4609.

Figure 47:
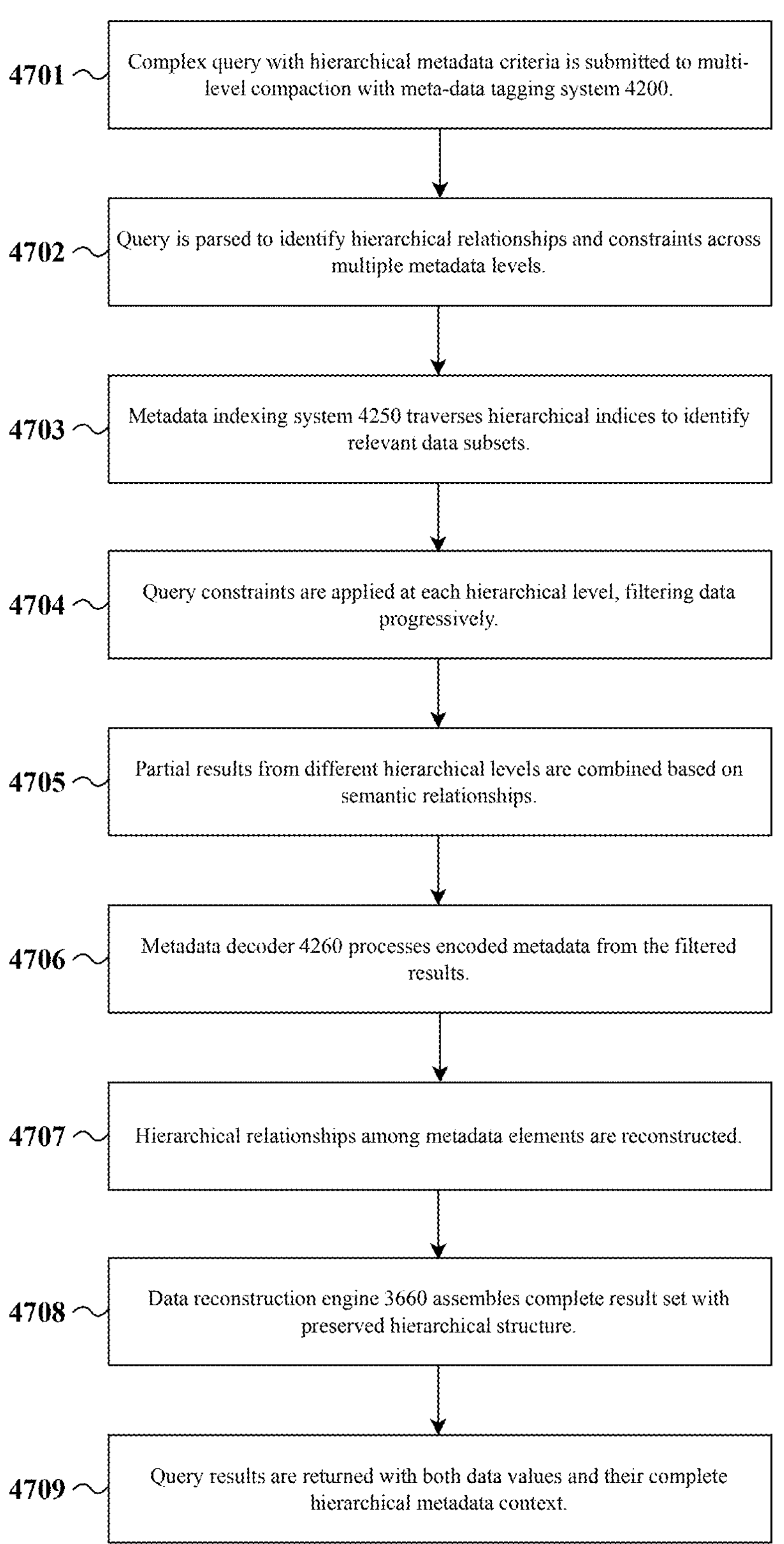
FIG. 47 is a method diagram illustrating hierarchical metadata query operations in multi-level compaction with meta-data tagging system.

FIG. 47 is a method diagram illustrating hierarchical metadata query operations in multi-level compaction with meta-data tagging system 4200, in an embodiment. Complex query with hierarchical metadata criteria is submitted to multi-level compaction with meta-data tagging system 4200, specifying constraints across multiple levels of the metadata hierarchy such as filtering by data source, time range, and confidence level simultaneously 4701. Query is parsed to identify hierarchical relationships and constraints across multiple metadata levels, establishing a structured representation of the search criteria that mirrors the hierarchical organization of the stored metadata 4702. Metadata indexing system 4250 traverses hierarchical indices to identify relevant data subsets, leveraging the multi-dimensional indexing structures to efficiently navigate the metadata space without examining irrelevant portions of the data 4703. Query constraints are applied at each hierarchical level, filtering data progressively from broader categories to more specific criteria, allowing efficient pruning of the search space as early as possible in the query process 4704. Partial results from different hierarchical levels are combined based on semantic relationships, merging information that satisfies different aspects of the query while maintaining the logical connections between elements 4705. Metadata decoder 4260 processes encoded metadata from the filtered results, applying type-specific decoding algorithms to recover the original metadata in its full fidelity 4706. Hierarchical relationships among metadata elements are reconstructed, re-establishing the nested structure and inheritance patterns that provide complete context for the data values 4707. Data reconstruction engine 3660 assembles complete result set with preserved hierarchical structure, organizing the retrieved information according to its semantic relationships and maintaining all contextual associations 4708. Query results are returned with both data values and their complete hierarchical metadata context, providing a comprehensive response that includes not just the requested data but also its full provenance and contextual information arranged in a structured hierarchy 4709.

In a non-limiting use case example of multi-level compaction with meta-data tagging system 4200, consider a meteorological research institution managing vast repositories of climate data collected from thousands of weather stations worldwide. Each station generates hourly floating-point measurements including temperature, humidity, barometric pressure, wind speed, and precipitation. These measurements are accompanied by rich metadata such as geographic coordinates, elevation, equipment calibration dates, maintenance records, and data quality indicators.

When incoming data 3620 arrives from these stations, metadata extractor 4210 identifies and extracts the associated contextual information. For the temperature readings, this might include timestamps in various formats (UTC and local time), station identifiers, sensor type and accuracy specifications, calibration coefficients, and quality flags indicating potential measurement errors. Metadata encoder 4220 then converts this information into compact binary forms using specialized encoding schemes. For example, station identifiers might be encoded using a lookup table, timestamps using differential encoding relative to a reference date, and quality flags using bit-field representation.

Meanwhile, pre-encoder 3610 processes the actual temperature measurements, converting floating-point values like 23.45° C. into binary string representations through low-distortion embedding. Composite encoding manager 4230 then links these binary strings with their encoded metadata, establishing relationships that preserve the association between measurements and their context.

Hierarchical compaction controller 4240 organizes the linked data into multiple levels based on semantic relationships. At the highest level might be global attributes like the data collection network and measurement standards. The next level might contain regional information such as climate zones and regional calibration practices. Further levels might include station-specific details and finally individual measurement metadata. This hierarchical organization allows metadata inheritance where appropriate—for instance, all measurements from a particular station inherit the station's geographic coordinates and elevation without redundant storage.

When climate researchers need to analyze temperature trends in coastal regions with specific equipment types, they submit a query with these metadata constraints. Data reconstruction engine 3660 interprets these parameters and works with metadata indexing system 4250 to efficiently retrieve only the relevant measurements. Without requiring full decompression of the entire dataset, the system can identify measurements matching the specified criteria based on the indexed metadata.

During retrieval, metadata decoder 4260 reconstructs the original metadata context while integer integrator 3665 restores the precise temperature values from their binary string representations. Researchers receive not just the temperature values but also their complete hierarchical context—from global collection standards down to measurement-specific quality indicators—enabling them to perform sophisticated analyses with confidence in data provenance.

This approach delivers substantial benefits for the institution. Storage requirements are reduced by eliminating redundant metadata while still preserving comprehensive contextual information. Retrieval operations are accelerated through metadata-based filtering that avoids processing irrelevant data. Most importantly, the semantic relationships between measurements and their context are preserved, allowing researchers to perform analyses that account for factors like equipment changes, calibration drift, and data quality variations-crucial considerations for climate research that requires high precision and well-understood uncertainty characteristics.

One skilled in the art would recognize that multi-level compaction with meta-data tagging system 4200 may be applied to numerous domains beyond the meteorological example described above. The system architecture and methods presented herein are adaptable to any field where floating-point numbers with associated contextual information require efficient storage, retrieval, and analysis. Such applications may include, without limitation, financial analytics, genomic research, industrial sensor networks, autonomous vehicle telemetry, medical imaging, and scientific simulations. All examples, embodiments, and use cases mentioned are intended to be illustrative and non-limiting in nature. The specific components, data types, encoding schemes, and hierarchical structures may be adapted or modified to suit particular domain requirements without departing from the scope of the invention. Furthermore, the system may be implemented across various hardware configurations, from embedded systems with limited resources to distributed cloud infrastructures processing massive datasets. While the description focuses on floating-point numbers, aspects of the invention may be applied to other data types where preservation of contextual relationships and efficient retrieval based on metadata attributes would provide similar benefits.

Hardware Architecture

Figure 48:
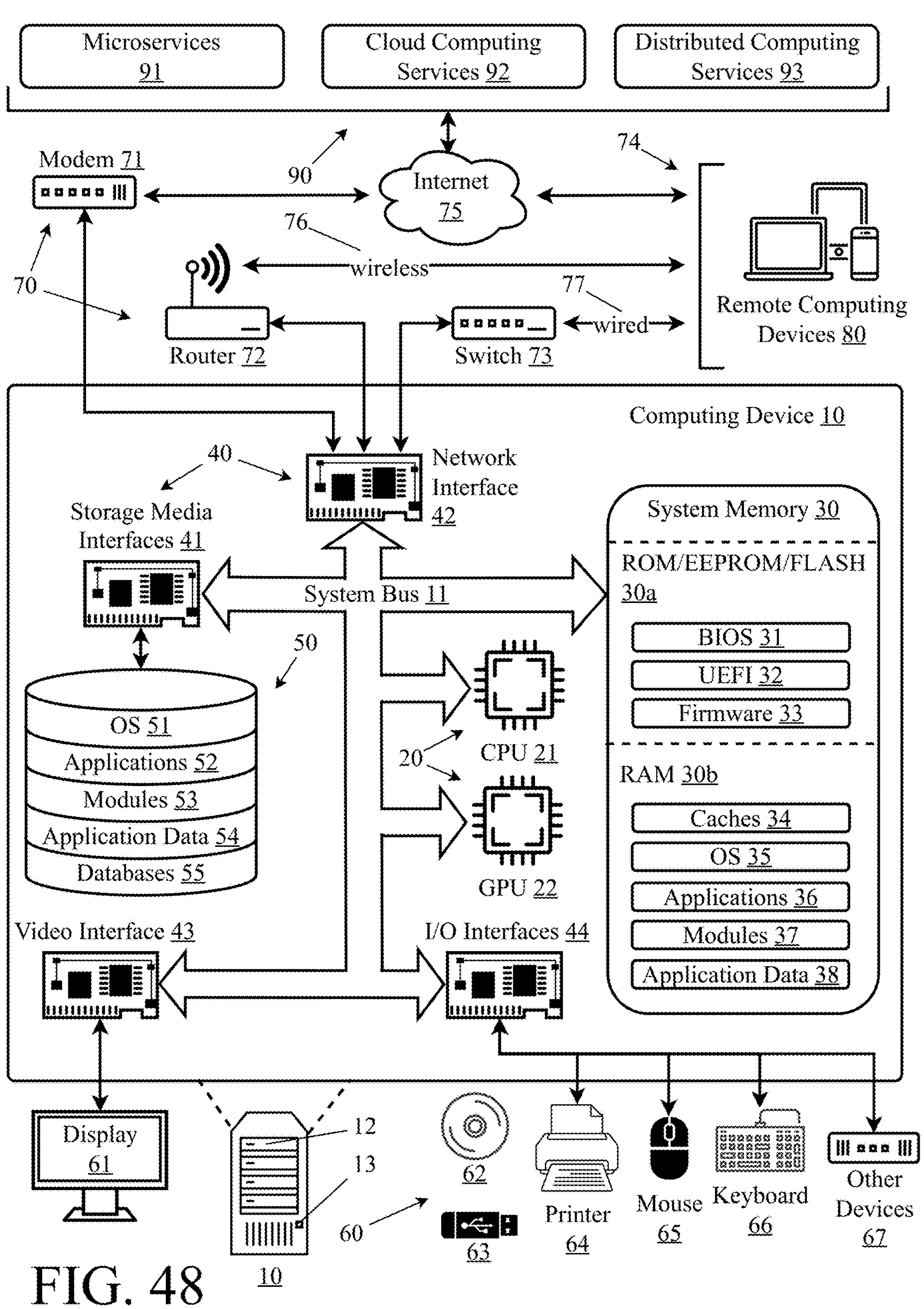
FIG. 48 illustrates an exemplary computing environment on which an embodiment described herein may be implemented.

FIG. 48 illustrates an exemplary computing environment on which an embodiment described herein may be implemented, in full or in part. This exemplary computing environment describes computer-related components and processes supporting enabling disclosure of computer-implemented embodiments. Inclusion in this exemplary computing environment of well-known processes and computer components, if any, is not a suggestion or admission that any embodiment is no more than an aggregation of such processes or components. Rather, implementation of an embodiment using processes and components described in this exemplary computing environment will involve programming or configuration of such processes and components resulting in a machine specially programmed or configured for such implementation. The exemplary computing environment described herein is only one example of such an environment and other configurations of the components and processes are possible, including other relationships between and among components, and/or absence of some processes or components described. Further, the exemplary computing environment described herein is not intended to suggest any limitation as to the scope of use or functionality of any embodiment implemented, in whole or in part, on components or processes described herein.

The exemplary computing environment described herein comprises a computing device 10 (further comprising a system bus 11, one or more processors 20, a system memory 30, one or more interfaces 40, one or more non-volatile data storage devices 50), external peripherals and accessories 60, external communication devices 70, remote computing devices 80, and cloud-based services 90.

System bus 11 couples the various system components, coordinating operation of and data transmission between those various system components. System bus 11 represents one or more of any type or combination of types of wired or wireless bus structures including, but not limited to, memory busses or memory controllers, point-to-point connections, switching fabrics, peripheral busses, accelerated graphics ports, and local busses using any of a variety of bus architectures. By way of example, such architectures include, but are not limited to, Industry Standard Architecture (ISA) busses, Micro Channel Architecture (MCA) busses, Enhanced ISA (EISA) busses, Video Electronics Standards Association (VESA) local busses, a Peripheral Component Interconnects (PCI) busses also known as a Mezzanine busses, or any selection of, or combination of, such busses. Depending on the specific physical implementation, one or more of the processors 20, system memory 30 and other components of the computing device 10 can be physically co-located or integrated into a single physical component, such as on a single chip. In such a case, some or all of system bus 11 can be electrical pathways within a single chip structure.

Computing device may further comprise externally-accessible data input and storage devices 12 such as compact disc read-only memory (CD-ROM) drives, digital versatile discs (DVD), or other optical disc storage for reading and/or writing optical discs 62; magnetic cassettes, magnetic tape, magnetic disk storage, or other magnetic storage devices; or any other medium which can be used to store the desired content and which can be accessed by the computing device 10. Computing device may further comprise externally-accessible data ports or connections 12 such as serial ports, parallel ports, universal serial bus (USB) ports, and infrared ports and/or transmitter/receivers. Computing device may further comprise hardware for wireless communication with external devices such as IEEE 1394 ("Firewire") interfaces, IEEE 802.11 wireless interfaces, BLUETOOTH® wireless interfaces, and so forth. Such ports and interfaces may be used to connect any number of external peripherals and accessories 60 such as visual displays, monitors, and touch-sensitive screens 61, USB solid state memory data storage drives (commonly known as "flash drives" or "thumb drives") 63, printers 64, pointers and manipulators such as mice 65, keyboards 66, and other devices 67 such as joysticks and gaming pads, touchpads, additional displays and monitors, and external hard drives (whether solid state or disc-based), microphones, speakers, cameras, and optical scanners.

Processors 20 are logic circuitry capable of receiving programming instructions and processing (or executing) those instructions to perform computer operations such as retrieving data, storing data, and performing mathematical calculations. Processors 20 are not limited by the materials from which they are formed or the processing mechanisms employed therein, but are typically comprised of semiconductor materials into which many transistors are formed together into logic gates on a chip (i.e., an integrated circuit or IC). The term processor includes any device capable of receiving and processing instructions including, but not limited to, processors operating on the basis of quantum computing, optical computing, mechanical computing (e.g., using nanotechnology entities to transfer data), and so forth. Depending on configuration, computing device 10 may comprise more than one processor. For example, computing device 10 may comprise one or more central processing units (CPUs) 21, each of which itself has multiple processors or multiple processing cores, each capable of independently or semi-independently processing programming instructions based on technologies like complex instruction set computer (CISC) or reduced instruction set computer (RISC). Further, computing device 10 may comprise one or more specialized processors such as a graphics processing unit (GPU) 22 configured to accelerate processing of computer graphics and images via a large array of specialized processing cores arranged in parallel. Further computing device 10 may be comprised of one or more specialized processes such as Intelligent Processing Units, field-programmable gate arrays or application-specific integrated circuits for specific tasks or types of tasks. The term processor may further include: neural processing units (NPUs) or neural computing units optimized for machine learning and artificial intelligence workloads using specialized architectures and data paths; tensor processing units (TPUs) designed to efficiently perform matrix multiplication and convolution operations used heavily in neural networks and deep learning applications; application-specific integrated circuits (ASICs) implementing custom logic for domain-specific tasks; application-specific instruction set processors (ASIPs) with instruction sets tailored for particular applications; field-programmable gate arrays (FPGAs) providing reconfigurable logic fabric that can be customized for specific processing tasks; processors operating on emerging computing paradigms such as quantum computing, optical computing, mechanical computing (e.g., using nanotechnology entities to transfer data), and so forth. Depending on configuration, computing device 10 may comprise one or more of any of the above types of processors in order to efficiently handle a variety of general purpose and specialized computing tasks. The specific processor configuration may be selected based on performance, power, cost, or other design constraints relevant to the intended application of computing device 10.

System memory 30 is processor-accessible data storage in the form of volatile and/or nonvolatile memory. System memory 30 may be either or both of two types: non-volatile memory and volatile memory. Non-volatile memory **30*a* is not erased when power to the memory is removed, and includes memory types such as read only memory (ROM), electronically-erasable programmable memory (EEPROM), and rewritable solid state memory (commonly known as "flash memory"). Non-volatile memory 30*a* is typically used for long-term storage of a basic input/output system (BIOS) 31, containing the basic instructions, typically loaded during computer startup, for transfer of information between components within computing device, or a unified extensible firmware interface (UEFI), which is a modern replacement for BIOS that supports larger hard drives, faster boot times, more security features, and provides native support for graphics and mouse cursors. Non-volatile memory 30*a* may also be used to store firmware comprising a complete operating system 35 and applications 36 for operating computer-controlled devices. The firmware approach is often used for purpose-specific computer-controlled devices such as appliances and Internet-of-Things (IoT) devices where processing power and data storage space is limited. Volatile memory 30*b* is erased when power to the memory is removed and is typically used for short-term storage of data for processing. Volatile memory 30*b* includes memory types such as random-access memory (RAM), and is normally the primary operating memory into which the operating system 35, applications 36, program modules 37, and application data 38 are loaded for execution by processors 20. Volatile memory 30*b* is generally faster than non-volatile memory 30*a* due to its electrical characteristics and is directly accessible to processors 20 for processing of instructions and data storage and retrieval. Volatile memory 30*b*** may comprise one or more smaller cache memories which operate at a higher clock speed and are typically placed on the same IC as the processors to improve performance.

There are several types of computer memory, each with its own characteristics and use cases. System memory 30 may be configured in one or more of the several types described herein, including high bandwidth memory (HBM) and advanced packaging technologies like chip-on-wafer-on-substrate (CoWoS). Static random access memory (SRAM) provides fast, low-latency memory used for cache memory in processors, but is more expensive and consumes more power compared to dynamic random access memory (DRAM). SRAM retains data as long as power is supplied. DRAM is the main memory in most computer systems and is slower than SRAM but cheaper and more dense. DRAM requires periodic refresh to retain data. NAND flash is a type of non-volatile memory used for storage in solid state drives (SSDs) and mobile devices and provides high density and lower cost per bit compared to DRAM with the trade-off of slower write speeds and limited write endurance. HBM is an emerging memory technology that provides high bandwidth and low power consumption which stacks multiple DRAM dies vertically, connected by through-silicon vias (TSVs). HBM offers much higher bandwidth (up to 1 TB/s) compared to traditional DRAM and may be used in high-performance graphics cards, AI accelerators, and edge computing devices. Advanced packaging and CoWoS are technologies that enable the integration of multiple chips or dies into a single package. CoWoS is a 2.5D packaging technology that interconnects multiple dies side-by-side on a silicon interposer and allows for higher bandwidth, lower latency, and reduced power consumption compared to traditional PCB-based packaging. This technology enables the integration of heterogeneous dies (e.g., CPU, GPU, HBM) in a single package and may be used in high-performance computing, AI accelerators, and edge computing devices.

Interfaces 40 may include, but are not limited to, storage media interfaces 41, network interfaces 42, display interfaces 43, and input/output interfaces 44. Storage media interface 41 provides the necessary hardware interface for loading data from non-volatile data storage devices 50 into system memory 30 and storage data from system memory 30 to non-volatile data storage device 50. Network interface 42 provides the necessary hardware interface for computing device 10 to communicate with remote computing devices 80 and cloud-based services 90 via one or more external communication devices 70. Display interface 43 allows for connection of displays 61, monitors, touchscreens, and other visual input/output devices. Display interface 43 may include a graphics card for processing graphics-intensive calculations and for handling demanding display requirements. Typically, a graphics card includes a graphics processing unit (GPU) and video RAM (VRAM) to accelerate display of graphics. In some high-performance computing systems, multiple GPUs may be connected using NVLink bridges, which provide high-bandwidth, low-latency interconnects between GPUs. NVLink bridges enable faster data transfer between GPUs, allowing for more efficient parallel processing and improved performance in applications such as machine learning, scientific simulations, and graphics rendering. One or more input/output (I/O) interfaces 44 provide the necessary support for communications between computing device 10 and any external peripherals and accessories 60. For wireless communications, the necessary radio-frequency hardware and firmware may be connected to I/O interface 44 or may be integrated into I/O interface 44. Network interface 42 may support various communication standards and protocols, such as Ethernet and Small Form-Factor Pluggable (SFP). Ethernet is a widely used wired networking technology that enables local area network (LAN) communication. Ethernet interfaces typically use RJ45 connectors and support data rates ranging from 10 Mbps to 100 Gbps, with common speeds being 100 Mbps, 1 Gbps, 10 Gbps, 25 Gbps, 40 Gbps, and 100 Gbps. Ethernet is known for its reliability, low latency, and cost-effectiveness, making it a popular choice for home, office, and data center networks. SFP is a compact, hot-pluggable transceiver used for both telecommunication and data communications applications. SFP interfaces provide a modular and flexible solution for connecting network devices, such as switches and routers, to fiber optic or copper networking cables. SFP transceivers support various data rates, ranging from 100 Mbps to 100 Gbps, and can be easily replaced or upgraded without the need to replace the entire network interface card. This modularity allows for network scalability and adaptability to different network requirements and fiber types, such as single-mode or multi-mode fiber.

Non-volatile data storage devices 50 are typically used for long-term storage of data. Data on non-volatile data storage devices 50 is not erased when power to the non-volatile data storage devices 50 is removed. Non-volatile data storage devices 50 may be implemented using any technology for non-volatile storage of content including, but not limited to, CD-ROM drives, digital versatile discs (DVD), or other optical disc storage; magnetic cassettes, magnetic tape, magnetic disc storage, or other magnetic storage devices; solid state memory technologies such as EEPROM or flash memory; or other memory technology or any other medium which can be used to store data without requiring power to retain the data after it is written. Non-volatile data storage devices 50 may be non-removable from computing device 10 as in the case of internal hard drives, removable from computing device 10 as in the case of external USB hard drives, or a combination thereof, but computing device will typically comprise one or more internal, non-removable hard drives using either magnetic disc or solid state memory technology. Non-volatile data storage devices 50 may be implemented using various technologies, including hard disk drives (HDDs) and solid-state drives (SSDs). HDDs use spinning magnetic platters and read/write heads to store and retrieve data, while SSDs use NAND flash memory. SSDs offer faster read/write speeds, lower latency, and better durability due to the lack of moving parts, while HDDs typically provide higher storage capacities and lower cost per gigabyte. NAND flash memory comes in different types, such as Single-Level Cell (SLC), Multi-Level Cell (MLC), Triple-Level Cell (TLC), and Quad-Level Cell (QLC), each with trade-offs between performance, endurance, and cost. Storage devices connect to the computing device 10 through various interfaces, such as SATA, NVMe, and PCIe. SATA is the traditional interface for HDDs and SATA SSDs, while NVMe (Non-Volatile Memory Express) is a newer, high-performance protocol designed for SSDs connected via PCIe. PCIe SSDs offer the highest performance due to the direct connection to the PCIe bus, bypassing the limitations of the SATA interface. Other storage form factors include M.2 SSDs, which are compact storage devices that connect directly to the motherboard using the M.2 slot, supporting both SATA and NVMe interfaces. Additionally, technologies like Intel Optane memory combine 3D XPoint technology with NAND flash to provide high-performance storage and caching solutions. Non-volatile data storage devices 50 may be non-removable from computing device 10, as in the case of internal hard drives, removable from computing device 10, as in the case of external USB hard drives, or a combination thereof. However, computing devices will typically comprise one or more internal, non-removable hard drives using either magnetic disc or solid-state memory technology. Non-volatile data storage devices 50 may store any type of data including, but not limited to, an operating system 51 for providing low-level and mid-level functionality of computing device 10, applications 52 for providing high-level functionality of computing device 10, program modules 53 such as containerized programs or applications, or other modular content or modular programming, application data 54, and databases 55 such as relational databases, non-relational databases, object oriented databases, NoSQL databases, vector databases, knowledge graph databases, key-value databases, document oriented data stores, and graph databases.

Applications (also known as computer software or software applications) are sets of programming instructions designed to perform specific tasks or provide specific functionality on a computer or other computing devices. Applications are typically written in high-level programming languages such as C, C++, Scala, Erlang, GoLang, Java, Scala, Rust, and Python, which are then either interpreted at runtime or compiled into low-level, binary, processor-executable instructions operable on processors 20. Applications may be containerized so that they can be run on any computer hardware running any known operating system. Containerization of computer software is a method of packaging and deploying applications along with their operating system dependencies into self-contained, isolated units known as containers. Containers provide a lightweight and consistent runtime environment that allows applications to run reliably across different computing environments, such as development, testing, and production systems facilitated by specifications such as containerd.

The memories and non-volatile data storage devices described herein do not include communication media. Communication media are means of transmission of information such as modulated electromagnetic waves or modulated data signals configured to transmit, not store, information. By way of example, and not limitation, communication media includes wired communications such as sound signals transmitted to a speaker via a speaker wire, and wireless communications such as acoustic waves, radio frequency (RF) transmissions, infrared emissions, and other wireless media.

External communication devices 70 are devices that facilitate communications between computing device and either remote computing devices 80, or cloud-based services 90, or both. External communication devices 70 include, but are not limited to, data modems 71 which facilitate data transmission between computing device and the Internet 75 via a common carrier such as a telephone company or internet service provider (ISP), routers 72 which facilitate data transmission between computing device and other devices, and switches 73 which provide direct data communications between devices on a network or optical transmitters (e.g., lasers). Here, modem 71 is shown connecting computing device 10 to both remote computing devices 80 and cloud-based services 90 via the Internet 75. While modem 71, router 72, and switch 73 are shown here as being connected to network interface 42, many different network configurations using external communication devices 70 are possible. Using external communication devices 70, networks may be configured as local area networks (LANs) for a single location, building, or campus, wide area networks (WANs) comprising data networks that extend over a larger geographical area, and virtual private networks (VPNs) which can be of any size but connect computers via encrypted communications over public networks such as the Internet 75. As just one exemplary network configuration, network interface 42 may be connected to switch 73 which is connected to router 72 which is connected to modem 71 which provides access for computing device 10 to the Internet 75. Further, any combination of wired 77 or wireless 76 communications between and among computing device 10, external communication devices 70, remote computing devices 80, and cloud-based services 90 may be used. Remote computing devices 80, for example, may communicate with computing device through a variety of communication channels 74 such as through switch 73 via a wired 77 connection, through router 72 via a wireless connection 76, or through modem 71 via the Internet 75. Furthermore, while not shown here, other hardware that is specifically designed for servers or networking functions may be employed. For example, secure socket layer (SSL) acceleration cards can be used to offload SSL encryption computations, and transmission control protocol/internet protocol (TCP/IP) offload hardware and/or packet classifiers on network interfaces 42 may be installed and used at server devices or intermediate networking equipment (e.g., for deep packet inspection).

In a networked environment, certain components of computing device 10 may be fully or partially implemented on remote computing devices 80 or cloud-based services 90. Data stored in non-volatile data storage device 50 may be received from, shared with, duplicated on, or offloaded to a non-volatile data storage device on one or more remote computing devices 80 or in a cloud computing service 92. Processing by processors 20 may be received from, shared with, duplicated on, or offloaded to processors of one or more remote computing devices 80 or in a distributed computing service 93. By way of example, data may reside on a cloud computing service 92, but may be usable or otherwise accessible for use by computing device 10. Also, certain processing subtasks may be sent to a microservice 91 for processing with the result being transmitted to computing device 10 for incorporation into a larger processing task. Also, while components and processes of the exemplary computing environment are illustrated herein as discrete units (e.g., OS 51 being stored on non-volatile data storage device 51 and loaded into system memory 35 for use) such processes and components may reside or be processed at various times in different components of computing device 10, remote computing devices 80, and/or cloud-based services 90. Also, certain processing subtasks may be sent to a microservice 91 for processing with the result being transmitted to computing device 10 for incorporation into a larger processing task. Infrastructure as Code (IaaC) tools like Terraform can be used to manage and provision computing resources across multiple cloud providers or hyperscalers. This allows for workload balancing based on factors such as cost, performance, and availability. For example, Terraform can be used to automatically provision and scale resources on AWS spot instances during periods of high demand, such as for surge rendering tasks, to take advantage of lower costs while maintaining the required performance levels. In the context of rendering, tools like Blender can be used for object rendering of specific elements, such as a car, bike, or house. These elements can be approximated and roughed in using techniques like bounding box approximation or low-poly modeling to reduce the computational resources required for initial rendering passes. The rendered elements can then be integrated into the larger scene or environment as needed, with the option to replace the approximated elements with higher-fidelity models as the rendering process progresses.

In an implementation, the disclosed systems and methods may utilize, at least in part, containerization techniques to execute one or more processes and/or steps disclosed herein. Containerization is a lightweight and efficient virtualization technique that allows you to package and run applications and their dependencies in isolated environments called containers. One of the most popular containerization platforms is containerd, which is widely used in software development and deployment. Containerization, particularly with open-source technologies like containerd and container orchestration systems like Kubernetes, is a common approach for deploying and managing applications. Containers are created from images, which are lightweight, standalone, and executable packages that include application code, libraries, dependencies, and runtime. Images are often built from a containerfile or similar, which contains instructions for assembling the image. Containerfiles are configuration files that specify how to build a container image. Systems like Kubernetes natively support containerd as a container runtime. They include commands for installing dependencies, copying files, setting environment variables, and defining runtime configurations. Container images can be stored in repositories, which can be public or private. Organizations often set up private registries for security and version control using tools such as Harbor, JFrog Artifactory and Bintray, GitLab Container Registry, or other container registries. Containers can communicate with each other and the external world through networking. Container provides a default network namespace, but can be used with custom network plugins. Containers within the same network can communicate using container names or IP addresses.

Remote computing devices 80 are any computing devices not part of computing device 10. Remote computing devices 80 include, but are not limited to, personal computers, server computers, thin clients, thick clients, personal digital assistants (PDAs), mobile telephones, watches, tablet computers, laptop computers, multiprocessor systems, microprocessor based systems, set-top boxes, programmable consumer electronics, video game machines, game consoles, portable or handheld gaming units, network terminals, desktop personal computers (PCs), minicomputers, mainframe computers, network nodes, virtual reality or augmented reality devices and wearables, and distributed or multi-processing computing environments. While remote computing devices 80 are shown for clarity as being separate from cloud-based services 90, cloud-based services 90 are implemented on collections of networked remote computing devices 80.

Cloud-based services 90 are Internet-accessible services implemented on collections of networked remote computing devices 80. Cloud-based services are typically accessed via application programming interfaces (APIs) which are software interfaces which provide access to computing services within the cloud-based service via API calls, which are pre-defined protocols for requesting a computing service and receiving the results of that computing service. While cloud-based services may comprise any type of computer processing or storage, three common categories of cloud-based services 90 are serverless logic apps, microservices 91, cloud computing services 92, and distributed computing services 93.

Microservices 91 are collections of small, loosely coupled, and independently deployable computing services. Each microservice represents a specific computing functionality and runs as a separate process or container. Microservices promote the decomposition of complex applications into smaller, manageable services that can be developed, deployed, and scaled independently. These services communicate with each other through well-defined application programming interfaces (APIs), typically using lightweight protocols like HTTP, protobuffers, gRPC or message queues such as Kafka. Microservices 91 can be combined to perform more complex or distributed processing tasks. In an embodiment, Kubernetes clusters with containerized resources are used for operational packaging of system.

Cloud computing services 92 are delivery of computing resources and services over the Internet 75 from a remote location. Cloud computing services 92 provide additional computer hardware and storage on as-needed or subscription basis. Cloud computing services 92 can provide large amounts of scalable data storage, access to sophisticated software and powerful server-based processing, or entire computing infrastructures and platforms. For example, cloud computing services can provide virtualized computing resources such as virtual machines, storage, and networks, platforms for developing, running, and managing applications without the complexity of infrastructure management, and complete software applications over public or private networks or the Internet on a subscription or alternative licensing basis, or consumption or ad-hoc marketplace basis, or combination thereof.

Federated distributed computing services 93 provide large-scale processing using multiple interconnected computers or nodes to solve computational problems or perform tasks collectively. In federated distributed computing, the processing and storage capabilities of multiple machines are leveraged to work together as a unified system, even when different tiers or tessellations may have limited or even no visibility into the resources and processing layer up or downstream. Federated distributed computing services are designed to address problems that cannot be efficiently solved by a single computer or that require large-scale computational power and require dynamism and workload distribution for economic, security or privacy reasons not well supported by canonical distributed computing resources; e.g. most commonly cloud-based computing applications, resources or analytics. Federated DCG coordinated variants of these services enable superior decentralization and further enhance parallel processing, fault tolerance, and scalability by distributing tasks across multiple tiers or tessellations while enabling computing process dependency calculation with varying degrees of visibility, assurance and privacy or security based on constituent computing system, network, workload and user or provider needs and preferences as well as practical legal and regulatory concerns to include but not limited to data localization, national data transfer restrictions, privacy and consumer protections, wiretap/telecommunications monitoring requirements, encryption and data routing and intermediate processing restrictions.

Although described above as a physical device, computing device 10 can be a virtual computing device, in which case the functionality of the physical components herein described, such as processors 20, system memory 30, network interfaces 40, and other like components can be provided by computer-executable instructions. Such computer-executable instructions can execute on a single physical computing device, or can be distributed across multiple physical computing devices, including being distributed across multiple physical computing devices in a dynamic manner such that the specific, physical computing devices hosting such computer-executable instructions can dynamically change over time depending upon need and availability. In the situation where computing device 10 is a virtualized device, the underlying physical computing devices hosting such a virtualized computing device can, themselves, comprise physical components analogous to those described above, and operating in a like manner. Furthermore, virtual computing devices can be utilized in multiple layers with one virtual computing device executing within the construct of another virtual computing device. Thus, computing device 10 may be either a physical computing device or a virtualized computing device within which computer-executable instructions can be executed in a manner consistent with their execution by a physical computing device. Similarly, terms referring to physical components of the computing device, as utilized herein, mean either those physical components or virtualizations thereof performing the same or equivalent functions.

The skilled person will be aware of a range of possible modifications of the various aspects described above. Accordingly, the present invention is defined by the claims and their equivalents the claims and their equivalents.

What is claimed is:

1. A computer system comprising a hardware memory, wherein the computer system is configured to execute software instructions stored on nontransitory machine-readable storage media that:

receive a dataset for encoding, the dataset comprising one or more floating-point numbers and associated metadata;

scan the dataset to identify the one or more floating-point numbers and extract metadata associated with each floating-point number;

for each identified floating-point number in the dataset:

pre-encode the floating-point number into a binary string representation;

encode the extracted metadata associated with the floating-point number into a compact binary representation;

link the pre-encoded binary string representation with its associated encoded metadata;

replace the floating-point number with its linked binary string and metadata representation in the dataset to create a pre-encoded data set; and create an index and logically link the binary string representation with the index, wherein the index indicates the binary string represents a floating-point number with associated metadata in the pre-encoded dataset;

organize the pre-encoded dataset into multiple compaction levels based on semantic relationships between the metadata.

2. The computer system of claim 1, wherein the system is further configured to:

create specialized indices for retrieval based on the associated metadata; and maintain relationship maps between the associated metadata and the one or more floating-point values.

3. The computer system of claim 1, wherein the system is further configured to:

receive the pre-encoded dataset;

deconstruct the pre-encoded dataset into a plurality of sourceblocks; and compact each of the plurality of sourceblocks by assigning a codeword to a reference code associated with each of the plurality of sourceblocks, wherein the reference code incorporates information from the associated metadata.

4. The computer system of claim 1, wherein the system is further configured to:

implement policies for metadata inheritance across the multiple compaction levels; and optimize storage allocation across the multiple compaction levels.

5. The computer system of claim 1, further comprising a codeword database configured to store a plurality of codewords that include relationships between elements of the associated metadata.

6. The computer system of claim 1, wherein the system is further configured to:

receive a plurality of sourceblocks;

check whether each of the plurality of sourceblocks has been logically linked to an index, wherein the presence of the index indicates the sourceblock is a binary string representation of a floating-point number;

extract the encoded associated metadata from the sourceblocks;

apply type-specific decoding algorithms to recover the original associated metadata;

reconstruct relationships between elements of the associated metadata; and divide the sourceblocks that have been logically linked to the index by a fixed power of two in order to transform the sourceblock into its floating-point number form.

7. A method for compaction of floating-point numbers and associated metadata within a dataset, comprising the steps of:

receiving a dataset for encoding, the dataset comprising one or more floating-point numbers and associated metadata;

scanning the dataset to identify the one or more floating-point numbers and extract metadata associated with each floating-point number;

for each identified floating-point number in the dataset:

pre-encoding the floating-point number into a binary string representation;

encoding the extracted metadata associated with the floating-point number into a compact binary representation;

linking the pre-encoded binary string representation with its associated encoded metadata;

replacing the floating-point number with its linked binary string and metadata representation in the dataset to create a pre-encoded data set; and creating an index and logically linking the binary string representation with the index, wherein the index indicates the binary string represents a floating-point number with associated metadata in the pre-encoded dataset;

organizing the pre-encoded dataset into multiple compaction levels based on semantic relationships between the metadata.

8. The method of claim 7, further comprising:

creating specialized indices for retrieval based on the associated metadata; and maintaining relationship maps between the associated metadata and the one or more floating-point values.

9. The method of claim 7, further comprising:

receiving the pre-encoded dataset;

deconstructing the pre-encoded dataset into a plurality of sourceblocks; and compacting each of the plurality of sourceblocks by assigning a codeword to a reference code associated with each of the plurality of sourceblocks, wherein the reference code incorporates information from the associated metadata.

10. The method of claim 7, further comprising:

implementing policies for metadata inheritance across the multiple compaction levels; and optimizing storage allocation across the multiple compaction levels.

11. The method of claim 7, wherein the binary string representations are low-distortion embeddings of real numbers into Hamming space.

12. The method of claim 7, wherein the binary string representation is a fixed-point representation.

13. The method of claim 7, further comprising storing a plurality of codewords that include relationships between elements of the associated metadata in a codeword database.

14. The method of claim 7, further comprising:

receiving a plurality of sourceblocks;

checking whether each of the plurality of sourceblocks has been logically linked to an index, wherein the presence of the index indicates the sourceblock is a binary string representation of a floating-point number, extracting the encoded associated metadata from the sourceblocks;

applying type-specific decoding algorithms to recover the original associated metadata;

reconstructing relationships between elements of the associated metadata; and dividing the sourceblocks that have been logically linked to the index by a fixed power of two in order to transform the sourceblock into its floating-point number form.

* * * * *